United States Patent
Wu

(10) Patent No.: US 12,418,100 B2
(45) Date of Patent: Sep. 16, 2025

(54) ANTENNA ASSEMBLY AND ELECTRONIC DEVICE

(71) Applicant: GUANGDONG OPPO MOBILE TELECOMMUNICATIONS CORP., LTD., Guangdong (CN)

(72) Inventor: Xiaopu Wu, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 127 days.

(21) Appl. No.: 18/503,330

(22) Filed: Nov. 7, 2023

(65) Prior Publication Data

US 2024/0072418 A1    Feb. 29, 2024

Related U.S. Application Data

(63) Continuation of application No. PCT/CN2022/086365, filed on Apr. 12, 2022.

(30) Foreign Application Priority Data

May 26, 2021    (CN) .......................... 202110582433.2

(51) Int. Cl.
*H01Q 1/24*    (2006.01)
*H01Q 5/335*    (2015.01)
(Continued)

(52) U.S. Cl.
CPC ............. *H01Q 1/243* (2013.01); *H01Q 5/335* (2015.01); *H03H 7/38* (2013.01); *H04B 1/0064* (2013.01)

(58) Field of Classification Search
CPC .......... H01Q 1/243; H01Q 5/335; H01Q 5/35; H03H 7/38; H04B 1/0064
See application file for complete search history.

(56) References Cited

U.S. PATENT DOCUMENTS 11,973,261 B2 * 4/2024 Sung ........................ H01Q 9/42
2008/0001837 A1   1/2008 Liu
(Continued)

FOREIGN PATENT DOCUMENTS

CN    106299598    1/2017
CN    111883917    11/2020
(Continued)

OTHER PUBLICATIONS

WIPO, International Search Report and Written Opinion for International Application No. PCT/CN2022/086365, Jul. 18, 2022.
(Continued)

*Primary Examiner* — Thien M Le
(74) *Attorney, Agent, or Firm* — Hodgson Russ LLP

(57) ABSTRACT

Provided are an antenna assembly and an electronic device. The antenna assembly includes a first radiator, a second radiator, a first matching module, a first feeding module, a second matching module, and a second feeding module. The first radiator has a first ground end, a first coupling end, and a first feeding point. The second radiator has a second coupling end, a second ground end, and a second feed point. A first coupling gap is defined between the second coupling end and the first coupling end. The first matching module is electrically connected between the first feeding point and the first feeding module. The second matching module is electrically connected between the second feeding point and the second feeding module. The first radiator and the second radiator support multiple resonant modes, where at least one resonant mode is a ⅛ to ¼ wavelength mode.

20 Claims, 25 Drawing Sheets

(51) Int. Cl.
H03H 7/38 (2006.01)
H04B 1/00 (2006.01)

(56) References Cited

U.S. PATENT DOCUMENTS

| | | | | |
|---|---|---|---|---|
| 2011/0273834 | A1* | 11/2011 | Moriai | H05K 1/02 |
| | | | | 361/679.32 |
| 2013/0038491 | A1* | 2/2013 | Li | H01Q 1/243 |
| | | | | 343/700 MS |
| 2014/0062814 | A1* | 3/2014 | Gyenes | H01Q 21/30 |
| | | | | 343/745 |
| 2015/0188581 | A1* | 7/2015 | Wong | H01Q 9/42 |
| | | | | 455/188.1 |
| 2019/0131694 | A1* | 5/2019 | Lee | H04M 1/026 |
| 2021/0257728 | A1* | 8/2021 | Sakong | H01Q 3/00 |
| 2022/0123469 | A1* | 4/2022 | Hsu | H01Q 9/42 |
| 2023/0344128 | A1 | 10/2023 | Wu | |
| 2023/0352852 | A1 | 11/2023 | Wu | |
| 2023/0420846 | A1 | 12/2023 | Wu | |
| 2024/0128646 | A1* | 4/2024 | Hu | H01Q 9/42 |
| 2024/0380095 | A1* | 11/2024 | Wang | H01Q 1/245 |

FOREIGN PATENT DOCUMENTS

| | | |
|---|---|---|
| CN | 112086753 | 12/2020 |
| CN | 112448162 | 3/2021 |
| CN | 112689033 | 4/2021 |
| CN | 112751203 | 5/2021 |
| CN | 112751204 | 5/2021 |
| CN | 112751212 | 5/2021 |
| CN | 112751213 | 5/2021 |
| CN | 112838370 | 5/2021 |

OTHER PUBLICATIONS

EPO, Extended European Search Report for EP Application No. 22810235.6, Sep. 5, 2024.

CNIPA, First Office Action for CN Application No. 202110582433.2, Aug. 13, 2024.

* cited by examiner

ANTENNA ASSEMBLY AND ELECTRONIC DEVICE

CROSS-REFERENCE TO RELATED APPLICATIONS

This application is a continuation of International Application No. PCT/CN2022/086365, filed Apr. 12, 2022, which claims priority to Chinese Patent Application No. 202110582433.2, filed May 26, 2021, the entire disclosures of which are hereby incorporated by reference.

TECHNICAL FIELD

This disclosure relates to the field of communication technology, and in particular, to an antenna assembly and an electronic device.

BACKGROUND

With the development of communication technologies, electronic devices with communication functions are becoming more and more popular, and the requirements for Internet speed are getting higher and higher. Therefore, how to improve the data transmission rate of the electronic device and improve the communication quality of the electronic device becomes a technical problem to be solved.

SUMMARY

In a first aspect, an antenna assembly is provided in the present disclosure. The antenna assembly includes a first radiator, a second radiator, a first matching module, a first feeding module, a second matching module, and a second feeding module. The first radiator has a first ground end, a first coupling end, and a first feeding point between the first ground end and the first coupling end. The second radiator has a second coupling end, a second ground end, and a second feeding point between the second coupling end and the second ground end. A first coupling gap is defined between the second coupling end and the first coupling end. The first matching module is electrically connected between the first feeding point and the first feeding module, and the first ground end is electrically connected to a first reference ground. The second matching module is electrically connected between the second feeding point and the second feeding module, and the second ground end is electrically connected to a second reference ground. The first radiator and the second radiator support, under excitation of the first feeding module and the second feeding module, multiple resonant modes, where at least one resonant mode is a $1/8$ to $1/4$ wavelength mode caused by excitation current of the first feeding module resonating on the second radiator.

In a second aspect, an electronic device is provided in the present disclosure. The electronic device includes a housing and at least one above antenna assembly, and radiators of the at least one antenna assembly are integrated into the housing, or are disposed on a surface of the housing, or are disposed in space enclosed by the housing.

Other features and aspects of the disclosed features will become apparent from the following detailed description, taken in conjunction with the accompanying drawings, which illustrate, by way of example, the features in accordance with implementations of the disclosure. The summary is not intended to limit the scope of any implementations described herein.

BRIEF DESCRIPTION OF THE DRAWINGS

In order to describe technical solutions in embodiments of the disclosure more clearly, the following will give a brief introduction to the accompanying drawings required for describing embodiments. Apparently, the accompanying drawings hereinafter described are merely some embodiments of the disclosure. Based on these drawings, those of ordinary skill in the art can also obtain other drawings without creative effort.

DETAILED DESCRIPTION

Figure 1:
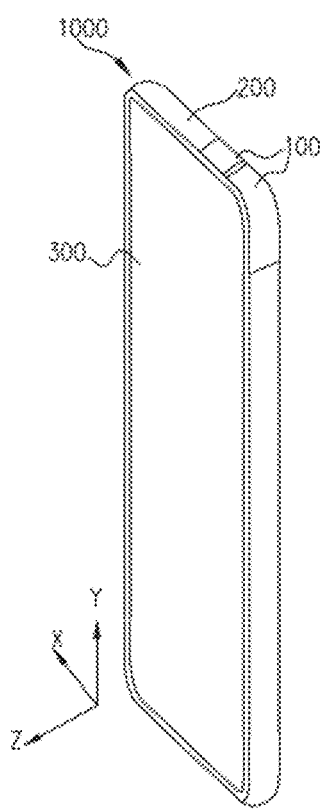
FIG. 1 is a schematic structural diagram of an electronic device provided in embodiments of the present disclosure.

In a first aspect, an antenna assembly is provided in the present disclosure. The antenna assembly includes a first radiator, a second radiator, a first matching module, a first feeding module, a second matching module, and a second feeding module. The first radiator has a first ground end, a first coupling end, and a first feeding point between the first ground end and the first coupling end. The second radiator has a second coupling end, a second ground end, and a second feeding point between the second coupling end and the second ground end. A first coupling gap is defined between the second coupling end and the first coupling end. The first matching module is electrically connected between the first feeding point and the first feeding module, and the first ground end is electrically connected to a first reference ground. The second matching module is electrically connected between the second feeding point and the second feeding module, and the second ground end is electrically connected to a second reference ground. The first radiator and the second radiator support, under excitation of the first feeding module and the second feeding module, multiple resonant modes, where at least one resonant mode is a ⅛ to ¼ wavelength mode caused by excitation current of the first feeding module resonating on the second radiator.

In an implementation, the antenna assembly is configured to support a first resonant mode, a second resonant mode, and a fourth resonant mode. The first resonant mode is a ⅛ to ¼ wavelength mode caused by the excitation current of the first feeding module resonating on the first radiator. The second resonant mode is a ⅛ to ¼ wavelength caused by excitation current of the first feeding module resonating on the second radiator. The fourth resonant mode is a ⅛ to ¼ wavelength caused by the excitation current of the first feeding module resonating from the first feeding point to the first coupling end.

In an implementation, a resonant frequency of the first resonant mode, a resonant frequency of the second resonant mode, and a resonant frequency of the fourth resonant mode increase sequentially. The first resonant mode supports at least one of a global positioning system (GPS) frequency band, a long-term evolution 4th generation (LTE-4G) middle-high band (MHB) frequency band, or a new radio 5th generation (NR-5G) MHB frequency band. The second resonant mode supports at least one of a wireless fidelity 2.4 GHz (Wi-Fi 2.4G) frequency band, the LTE-4G MHB frequency band, or the NR-5G MHB frequency band. The fourth resonant mode supports at least one of an LTE-4G ultra-high band (UHB) frequency band or an NR-5G UHB frequency band.

In an implementation, the first matching module includes at least one first branch connected in parallel to the ground and/or at least one second branch connected in series between the first feeding point and the first feeding module, and each of the at least one first branch and the at least one second branch includes at least one of a capacitor or an inductor. The first matching module is configured to tune at least one of a resonant frequency of the first resonant mode, a resonant frequency of the second resonant mode, or a resonant frequency of the fourth resonant mode.

In an implementation, the at least one first branch includes a first sub-branch, a second sub-branch, and a third sub-branch, and the at least one second branch includes a fourth sub-branch and a fifth sub-branch. One end of the first sub-branch is electrically connected to the first feeding point, the other end of the first sub-branch is electrically connected to a third reference ground, and the first sub-branch includes a capacitor, or a capacitor and an inductor. One end of the second sub-branch is electrically connected to the first feeding point, the other end of the second sub-branch is electrically connected to the third reference ground, and the second sub-branch includes an inductor, or an inductor and a capacitor. The other end of the third sub-branch is electrically connected to the third reference ground, and the third sub-branch includes a capacitor, or a capacitor and an inductor. One end of the fourth sub-branch is electrically connected to the first feeding point, the other end of the fourth sub-branch is electrically connected to one end of the third sub-branch, and the fourth sub-branch includes a capacitor, or a capacitor and an inductor. One end of the fifth sub-branch is electrically connected to said the other end of the fourth sub-branch, the other end of the fifth sub-branch is electrically connected to the first feeding module, and the fifth sub-branch includes an inductor.

In an implementation, the first matching module further includes at least one adjustable branch electrically connected to the third reference ground, the at least one adjustable branch each includes at least one of a switching circuit or an adjustable capacitor, and the at least one adjustable branch is configured to tune the resonant frequency of the first resonant mode and the resonant frequency of the second resonant mode.

In an implementation, a length between the first feeding point and the first ground end is ⅓ times to 1 time a length of the first radiator.

In an implementation, the antenna assembly is configured to support a fifth resonant mode and a third resonant mode, the fifth resonant mode is a ⅛ to ¼ wavelength mode caused by excitation current of the second feeding module resonating from the second feeding point to the second coupling end, and the third resonant mode is a ¾ wavelength mode caused by the excitation current of the second feeding module resonating on the first radiator.

In an implementation, a resonant frequency of the fifth resonant mode is less than a resonant frequency of the third resonant mode, the fifth resonant mode supports at least one of a Wi-Fi 5 GHz (Wi-Fi 5G) frequency band or a Wi-Fi 6 GHz extended (Wi-Fi 6E) frequency band, and the third resonant mode supports at least one of a Wi-Fi 5G frequency band or a Wi-Fi 6E frequency band.

In an implementation, the second matching module includes at least one third branch connected in parallel to the ground and/or at least one fourth branch connected in series between the first feeding point and the first feeding module, and each of the at least one third branch and the at least one fourth branch includes at least one of a capacitor or an inductor. The second matching module is configured to allow a frequency band supported by the fifth resonant mode and a frequency band supported by the third resonant mode to pass, to block a frequency band less than both the frequency band supported by the fifth resonant mode and the frequency band supported by the third resonant mode, and to tune a resonant frequency of the fifth resonant mode and/or a resonant frequency of the third resonant mode.

In an implementation, the at least one third branch includes a sixth sub-branch and a seventh sub-branch, and the at least one fourth branch includes an eighth sub-branch. One end of the sixth sub-branch is electrically connected to the second feeding point, the other end of the sixth sub-branch is electrically connected to one end of the seventh sub-branch, and the sixth sub-branch includes an inductor and a capacitor connected in parallel. The other end of the seventh sub-branch is electrically connected to the second feeding module, and the seventh sub-branch includes a capacitor, or an inductor, or an inductor and a capacitor connected in parallel. One end of the eighth sub-branch is electrically connected to the second feeding module, the other end of the eighth sub-branch is electrically connected to a fourth reference ground, and the eighth sub-branch includes at least one of a capacitor or an inductor.

In an implementation, the antenna assembly further includes a third radiator, a third feeding module, and a third matching module. The third radiator has a third ground end, a first free end, and a third feeding point between the third ground end and the first free end. The third ground end and the first ground end are spaced apart from each other or are connected via a conductor. The third ground end is electrically connected to a fifth reference ground, the third feeding module is electrically connected to the third feeding point, and the third matching module is electrically connected between the third feeding point and the third feeding module.

In an implementation, the antenna assembly further includes a fourth matching module, where one end of the fourth matching module is electrically connected to the first ground end, and the other end of the fourth matching module is electrically connected to the first reference ground; and/or the antenna assembly further includes a fifth matching module, where one end of the fifth matching module is electrically connected to the third ground end, and the other end of the fifth matching module is electrically connected to the fifth reference ground.

In an implementation, the antenna assembly further includes a fourth radiator, a fourth feeding module, and a sixth matching module. The fourth radiator has a fourth ground end, a second free end, and a fourth feeding point between the fourth ground end and the second free end. A second coupling gap is defined between the fourth ground end and the first free end, and the fourth ground end is electrically connected to a sixth reference ground. The fourth feeding module is electrically connected to the fourth feeding point, and the sixth matching module is electrically connected between the fourth feeding point and the fourth feeding module.

In an implementation, the antenna assembly is further configured to support a sixth resonant mode, a seventh resonant mode, and an eighth resonant mode. The sixth resonant mode is a ⅛ to ¼ wavelength mode caused by excitation current of the third feeding module resonating on the third radiator. The seventh resonant mode is a ⅛ to ¼ wavelength mode caused by the excitation current of the third feeding module resonating from the third feeding point to the first free end. The eighth resonant mode is a ⅛ to ¼ wavelength mode caused by the excitation current of the third feeding module resonating from the third feeding point to the first free end and is a ⅛ to ¼ wavelength mode caused by the excitation current of the third feeding module resonates from the second free end to the fourth ground end.

The antenna assembly is further configured to support a ninth resonant mode, a tenth resonant mode, an eleventh resonant mode, and a twelfth resonant mode. The ninth resonant mode is a ⅛ to ¼ wavelength mode caused by excitation current of the fourth feeding module resonating from the third feeding point to the first free end and is a ⅛ to ¼ wavelength mode caused by the excitation current of the fourth feeding module resonating from the first free end to the fourth ground end. The tenth resonant mode is a ⅛ to ¼ wavelength mode caused by the excitation current of the fourth feeding module resonating from the first free end to the fourth ground end. The eleventh resonant mode is a ⅛ to ¼ wavelength mode caused by the excitation current of the fourth feeding module resonating from the fourth feeding point to the second free end. The twelfth resonant mode is a ¾ wavelength mode caused by the excitation current of the fourth feeding module resonating from the third ground end to the first free end.

In an implementation, the third radiator supports, under excitation of the third feeding module, a GPS frequency band, a Wi-Fi 2.4G frequency band, an LTE-4G MHB frequency band, an NR-5G MHB frequency band, an LTE-4G UHB frequency band, and an NR-5G UHB frequency band. The fourth radiator supports, under excitation of the fourth feeding module, an N77 (3.3 GHz~4.2 GHz) frequency band, an N78 (3.3 GHZ~3.8 GHz) frequency band, a Wi-Fi 5G frequency band, and a Wi-Fi 6E frequency band.

In an implementation, the first radiator is connected to the third radiator to form a sharing radiator. The antenna assembly further includes a direct-current (DC) blocking component, a filtering component, and a detecting component. The DC blocking component is electrically connected between the first feeding point and the first matching module, between the first ground end and the first reference ground, between the third ground end and the fifth reference ground, and between the third feeding point and the third matching module; one end of the filtering component is electrically connected to one end of the DC blocking component close to the sharing radiator or is electrically connected to the sharing radiator; the DC blocking component is configured to block direct current generated by the first matching module, the first reference ground, the fifth reference ground, and the third matching module; and the filtering component is configured to block a radio frequency (RF) signal received/transmitted by the sharing radiator and to block a sensing signal generated by the sharing radiator in response to approach of a subject to-be-detected. And/or the DC blocking component is electrically connected between the second ground end and the second reference ground, and between the second matching module and the second feeding point; one end of the filtering component is electrically connected to one end of the DC blocking component close to the second radiator or is electrically connected to the second radiator; the DC blocking component is configured to block direct current generated by the second reference ground and the second matching module; and the filtering component is configured to block an RF signal received/transmitted by the second radiator and to block a sensing signal generated by the second radiator in response to the approach of the subject to-be-detected. And/or the DC blocking component is electrically connected between the fourth ground end and the sixth reference ground, and between the sixth matching module and the fourth feeding point; one end of the filtering component is electrically connected to one end of the DC blocking component close to the third radiator or is electrically connected to the third radiator; the DC blocking component is configured to block direct current generated by the sixth reference ground and the sixth matching module; and the filtering component is configured to block an RF signal received/transmitted by the third radiator and to block a sensing signal generated by the third radiator in response to the approach of the subject to-be-detected. The detecting component is electrically connected to the other end of the filtering component, and the detecting component is configured to detect magnitude of the sensing signal.

In an implementation, a segment between the first ground end and the third ground end is a connecting segment. The antenna assembly further includes at least one seventh matching module, one end of the at least one seventh matching module is electrically connected to the connecting segment, and the other end of the seventh matching module is connected to the ground.

In a second aspect, an electronic device is provided in the present disclosure. The electronic device includes a housing and at least one antenna assembly of the first aspect or any one of the first aspect, and radiators of the at least one antenna assembly are integrated into the housing, or are disposed on a surface of the housing, or are disposed in space enclosed by the housing.

In an implementation, the housing has a top frame and a bottom frame disposed opposite to the top frame and a first side frame and a second side frame connected between the top frame and the bottom frame. The antenna assembly is disposed on at least one of the top frame, the first side frame, the second side frame, or the bottom frame.

In an implementation, a first radiator of the antenna assembly and a second radiator of the antenna assembly are disposed on the first side frame, one part of a third radiator of the antenna assembly is disposed on the first side frame, and the other part of the third radiator of the antenna assembly is disposed on the top frame. A fourth radiator of the antenna assembly is disposed on the top frame. A first coupling gap between the first radiator and the second radiator is defined on the first side frame, and a second coupling gap is defined on the top frame.

The electronic device further includes at least one key portion, the at least one key portion is disposed between a second ground end and a second feeding point, and/or the at least one key portion is disposed between a first ground end and a third ground end of the third radiator.

The following will clearly and completely illustrate technical solutions of embodiments of the disclosure with reference to the accompanying drawings of embodiments of the disclosure. Apparently, embodiments described herein are merely some embodiments, rather than all embodiments, of the disclosure. In addition, reference herein to "implementation" or "embodiment" means that a particular feature, structure, or characteristic described in connection with the implementation or embodiment may be included in at least one embodiment of the present disclosure. An appearance of this term in various places in the specification does not necessarily refer to the same embodiment, nor is a separate or alternative embodiment mutually exclusive of other embodiments. It is understood explicitly and implicitly by those skilled in the art that embodiments described herein can be combined with other embodiments.

Reference is made to FIG. 1, which is a schematic structural diagram of an electronic device provided in embodiments of the present disclosure. The electronic device 1000 includes an antenna assembly 100. The antenna assembly 100 is configured to receive and transmit electromagnetic wave signals to implement a communication function of the electronic device 1000. A position of the antenna assembly 100 in the electronic device 1000 is not specifically limited in the present disclosure. The electronic device 1000 further includes a display screen 300 and a housing 200, and the display screen 300 covers and is connected to the housing 200. The antenna assembly 100 may be disposed inside the housing 200 of the electronic device 1000, or partially integrated with the housing 200, or partially disposed outside the housing 200. As illustrated in FIG. 1, a radiator of the antenna assembly 100 is integrated with the housing 200. Certainly, the antenna assembly 100 may also be disposed on a retractable assembly of the electronic device 1000. In other words, at least part of the antenna assembly 100 can also extend out of the electronic device 1000 along with the retractable assembly of the electronic device 1000, and retract into the electronic device 1000 along with the retractable assembly. Alternatively, an overall length of the antenna assembly 100 may extend with extension of the retractable assembly of the electronic device 1000.

The electronic device 1000 includes, but is not limited to, a device capable of receiving/transmitting the electromagnetic wave signal, such as a telephone, a television, a tablet computer, a mobile phone, a camera, a personal computer (PC), a notebook computer, an in-vehicle equipment, an earphone, a watch, a wearable device, a base station, an in-vehicle radar, and a customer premise equipment (CPE). In the present disclosure, for illustrative purpose, the electronic device 1000 is the mobile phone, and for other devices, reference may be made to detailed descriptions in this disclosure.

For ease of description, with reference to a view angle of the electronic device 1000 in FIG. 1, a width direction of the electronic device 1000 is defined as an X-axis direction, a length direction of the electronic device 1000 is defined as a Y-axis direction, and a thickness direction of the electronic device 1000 is defined as a Z-axis direction. The X-axis, the Y-axis and the Z-axis are perpendicular to each other, and a direction indicated by an arrow is a positive direction.

Figure 2:
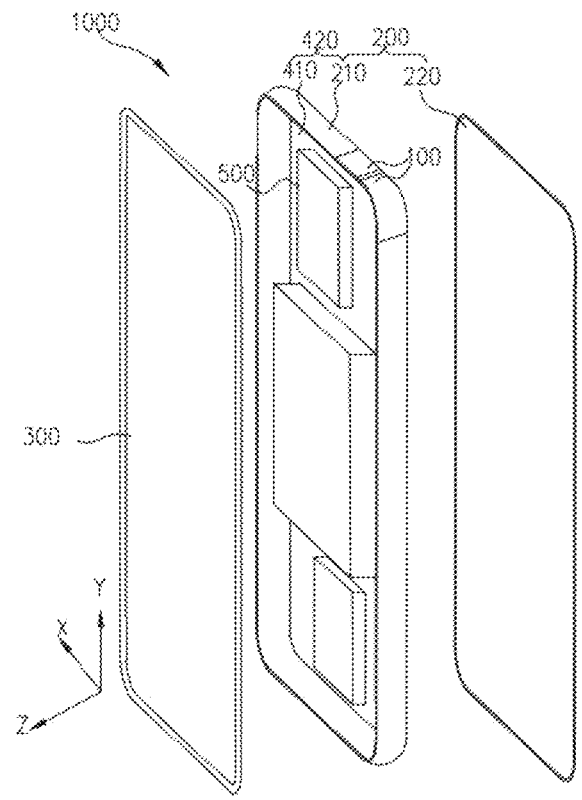
FIG. 2 is a schematic structural exploded view of the electronic device illustrated in FIG. 1.

Reference is made to FIG. 2, where the housing 200 includes a frame 210 and a back cover 220. A middle plate 410 is formed within the frame 210 by injection molding, and the middle plate 410 defines multiple installation grooves for installing various electronic devices. The middle plate 410 and the frame 210 cooperatively serve as a middle frame 420 of the electronic device 1000, and accommodating space is defined at both sides of the middle frame 420 after the display screen 300, the middle frame 420, and the back cover 220 are closed. One side (for example, a back side) of the frame 210 is connected to a periphery of the back cover 220, and the other side (for example, the front side) of the frame 210 is connected to a periphery of the display screen 300. The electronic device 1000 further includes devices capable of implementing basic functions of the mobile phone, such as a battery, a camera, a microphone, a receiver, a loudspeaker, a face-recognition module, a fingerprint-recognition module, or the like, all of which are disposed inside the accommodating space, and are not further described in this embodiment.

The antenna assembly 100 provided in the present disclosure will be specifically described below with reference to accompanying drawings. Certainly, the antenna assembly 100 provided in the present disclosure includes, but is not limited to, the following embodiments.

Figure 3:
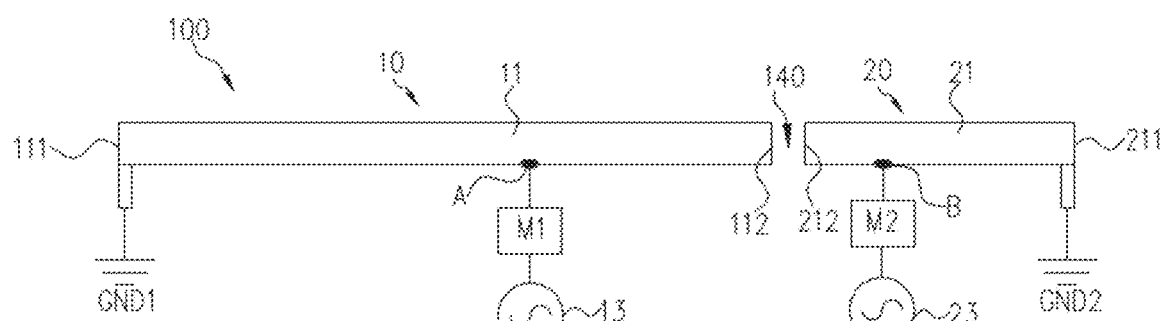
FIG. 3 is a schematic structural diagram of a first type of antenna assembly of the electronic device illustrated in FIG. 2.

As illustrated in FIG. 3, the antenna assembly 100 includes at least a first radiator 11, a second radiator 21, a first matching module M1, a first feeding module 13, a second matching module M2, and a second feeding module 23. To facilitate functional division of different parts of the antenna assembly 100 for subsequent descriptions, the first radiator 11, the second radiator 21, the first matching module M1, and the first feeding module 13 are defined as a first antenna unit 10, and the first radiator 11, the second radiator 21, the second matching module M2, and the second feeding module 23 are defined as a second antenna unit 20.

As illustrated in FIG. 3, the first radiator 11 has a first ground end 111, a first coupling end 112, and a first feeding point A between the first ground end 111 and the first coupling end 112. In this embodiment, the first ground end 111 and the first coupling end 112 are opposite ends of the first radiator 11, and the first radiator 11 is in a linear strip shape. In other embodiments, the first radiator 11 is bent, and the first ground end 111 and the first coupling end 112 may not be opposite to each other along a straight-line direction, but the first ground end 111 and the first coupling end 112 are two ends of the first radiator 11.

As illustrated in FIG. 3, the second radiator 21 has a second coupling end 211, a second ground end 212, and a second feeding point B between the second coupling end 211 and the second ground end 212. A first coupling gap 140 is defined between the second coupling end 211 and the first coupling end 112, and the first radiator 11 and the second radiator 21 can be capacitively coupled via the first coupling gap 140. In this embodiment, the second coupling end 211 and the second free end 122 are two ends of the second radiator 21. Optionally, the first radiator 11 and the second radiator 21 may be arranged along a straight line or roughly along a straight line (namely, having a small tolerance in the design process). Certainly, in other embodiments, the first radiator 11 and the second radiator 21 may also be staggered in an extending direction to define avoidance space.

As illustrated in FIG. 3, the first coupling end 112 is opposite to and is spaced apart from the second coupling end 211. The first coupling gap 140 is a gap between the first radiator 11 and the second radiator 21. For example, a width of the first coupling gap 140 may range from 0.5 mm to 2 mm, but is not limited to this size. The first radiator 11 and the second radiator 21 may be regarded as two parts formed by a radiator interrupted by the first coupling gap 140.

The first radiator 11 and the second radiator 21 are capacitively coupled via the first coupling gap 140, The "capacitively coupled" refers to that an electric field is generated between the first radiator 11 and the second radiator 21, a signal of the first radiator 11 can be transmitted to the second radiator 21 via the electric field, and a signal of the second radiator 21 can be transmitted to the first radiator 11 via the electric field, so that the first radiator 11 and the second radiator 21 can be electrically conducted even when the first radiator 11 and the second radiator 21 are not directly contacted or are not directly connected.

It can be understood that, shapes and structures of the first radiator 11 and the second radiator 21 are not specifically limited in the present disclosure, and shapes of the first radiator 11 and the second radiator 21 include, but are not limited to, a strip shape, a sheet shape, a rod shape, a coating, a film, or the like. When the first radiator 11 and the second radiator 21 are in the strip shape, the present disclosure does not limit extending track of the first radiator 11 and the second radiator 21, and therefore the first radiator 11 and the second radiator 21 may both extend in a track such as a straight line, a curve, multiple bends, or the like. The extending track of the first radiator 11 and the second radiator 21 may be a line with a uniform width, or a strip shape with varying widths such as a gradual width, a widened area, or the like.

As illustrated in FIG. 3, the first matching module M1 is electrically connected between the first feeding point A and the first feeding module 13. The first feeding module 13 is an RF receiving/transmitting chip configured to transmit RF signals or a feeding part electrically connected to the RF receiving/transmitting chip configured to transmit RF signals. The first matching module M1 may include at least one of a switching device, a capacitive device, an inductive device, a resistance device, or the like.

As illustrated in FIG. 3, the first ground end 111 is electrically connected to a first reference ground GND1 by, including but not limited to, direct welding or indirect electrical connection via coaxial line, microstrip wire, conductive dome, conductive adhesive, or the like. The present disclosure does not limit a specific position of the first feeding point A on the first radiator 11.

As illustrated in FIG. 3, the second antenna unit 20 includes the first radiator 11, the second radiator 21, the second matching module M2, and the second feeding module 23.

As illustrated in FIG. 3, the second matching module M2 is electrically connected between the second feeding point B and the second feeding module 23. The second feeding module 23 is an RF receiving/transmitting chip configured to transmit RF signals or a feeding part electrically connected to the RF receiving/transmitting chip configured to transmit RF signals. The second matching module M2 includes at least one of a switch device, a capacitive device, an inductive device, a resistance device, or the like.

As illustrated in FIG. 3, the second ground end 212 is electrically connected to a second reference ground GND2 by, including but not limited to, direct welding or indirect electrical connection via coaxial line, microstrip wire, conductive dome, conductive adhesive, or the like. The present disclosure does not limit a specific position of the second feeding point B on the second radiator 21.

The first reference ground GND1 and the second reference ground GND2 include, but are not limited to, the following embodiments. Optionally, the antenna assembly 100 itself has a reference ground. Specific forms of the reference ground include, but are not limited to, a metal conductive plate, a metal conductive layer formed inside a flexible printed circuit board (FPCB) or formed in a rigid printed circuit board (PCB), or the like. The first reference ground GND1 and the second reference ground GND2 may be an integrally formed reference ground in the antenna assembly 100, or two independent reference grounds connected with each other in the antenna assembly 100. When the antenna assembly 100 is disposed inside the electronic device 1000, a reference ground of the antenna assembly 100 is electrically connected to a reference ground of the electronic device 1000. Alternatively, the antenna assembly 100 itself does not have a reference ground, and the first ground end 111 of the antenna assembly 100 and the second ground end 212 of the antenna assembly 100 are directly electrically connected to or are indirectly electrically connected via a conductor to the reference ground of the electronic device 1000 or to a reference ground of electronic components inside the electronic device 1000. In the present disclosure, the antenna assembly 100 is disposed on the electronic device 1000, and a metal alloy on the middle plate 410 serves as a reference ground GND. In other words, the first reference ground GND1 and the second reference ground GND2 each are a part of the middle plate 410, or are electrically connected to the middle plate 410, and subsequent third reference ground GND3, a fourth reference ground GND4, a fifth reference ground GND5, a sixth reference ground GND6, and a seventh reference ground GND7 are all part of the reference ground GND.

In this embodiment, the first radiator 11 and the second radiator 21 support, under excitation of the first feeding module 13 and the second feeding module 23, multiple resonant modes. Specifically, the first radiator 11 and the second radiator 21 support, under excitation of the first feeding module 13, multiple resonant modes (for example, a first resonant mode a, a second resonant mode b, and a fourth resonant mode c in FIG. 4). Specifically, the first radiator 11 and the second radiator 21 support, under excitation of the second feeding module 23, multiple resonant modes (for example, a fifth resonant mode d and a third resonant mode e in FIG. 4).

Because the first radiator 11 is capacitively coupled to the second radiator 21, current generated by the first feeding module 13 can resonate on the first radiator 11 and/or the second radiator 21, and current generated by the second feeding module 23 can also resonate on the first radiator 11 and/or the second radiator 21. The first radiator 11 and the second radiator 21 can serve not only as radiators of the first antenna unit 10 but also as radiators of the second antenna unit 20. Compared with that current generated by the first feeding module 13 separately resonating on the first radiator 11 and current generated by the second feeding module 23 separately resonating on the second radiator 21, the first antenna unit 10 and the second antenna unit 20 in the antenna assembly 100 provided in embodiments of the present disclosure can implement co-aperture radiation, so as to generate more resonant modes. From other perspectives, the antenna assembly 100 provided in embodiments of the present disclosure fully utilizes radiators while supporting required frequency bands (or supporting the required number of resonant modes), so as to further reduce an overlapping length of the first radiator 11 and the second radiator 21.

At least one resonant mode is a ⅛ to ¼ wavelength mode caused by the excitation current of the first feeding module 13 resonating on the second radiator 21. The wavelength refers to a wavelength of an electromagnetic wave in the medium where the electromagnetic wave is located. Specifically, current provided by the first feeding module 13 resonates on the first radiator 11 to generate a resonant mode. In addition, because the first radiator 11 is capacitively coupled to the second radiator 21, current provided by the first feeding module 13 is further transmitted to the second radiator 21 through the first coupling gap 140, so as to generate a resonant mode on the second radiator 21, thereby increasing the number of resonant modes supported by the first antenna unit 10. Further, a length of the second radiator 21 is designed to be about ⅛ times to ¼ times a wavelength of current provided by the first feeding module 13 in the medium to facilitate generating the resonant mode, so as to make current resonate in a ⅛ to ¼ wavelength mode on the second radiator 21. The ⅛ to ¼ wavelength mode is a resonant mode with relatively high efficiency, and therefore, the number of resonant modes supported by the first antenna unit 10 can be increased and the receiving/transmitting efficiency for supported frequency bands can be improved. In this way, the first antenna unit 10 can generate resonant modes on both the first radiator 11 and the second radiator 21. Compared with that current of the first antenna unit 10 only resonates on the first radiator 11, the number of resonant modes supported by the first antenna unit 10 is increased and signal conversion efficiency becomes higher, so that the number of resonant modes supported by the antenna assembly 100 is increased.

The number of resonant modes supported by the antenna assembly 100 is increased, and a frequency-band width supported by the antenna assembly 100 and the number of frequency bands supported by the antenna assembly 100 are increased. Specifically, in a first aspect, when frequency bands supported by multiple resonant modes of the antenna assembly 100 are all continuous, the frequency-band width supported by the antenna assembly 100 is relatively wide, and a relatively wide bandwidth can be formed, where the relatively wide bandwidth is 1G, 1.5G, 2G, or the like, so that an relatively wide bandwidth coverage can be realized, a download bandwidth can be improved, a throughput download speed can be improved, and a user's Internet experience can be enhanced. In a second aspect, when frequency bands supported by multiple resonant modes of the antenna assembly 100 are discontinuous, the number of frequency bands supported by the antenna assembly 100 is increased, and a multi-band coverage is achieved, for example, the antenna assembly 100 can simultaneously support a 4G/5G MHB (for example, 1000 MHz to 3000 MHz) and a 4G/5G UHB (for example, 3000 MHz to 10000 MHz), simultaneously support MHBs in two different frequency bands, simultaneously support the 4G/5G MHB and a Wi-Fi frequency band (for example, Wi-Fi 5G, 5.925 GHz to 7.125 GHZ, or the like), or the like. Frequency bands supported by multiple resonant modes being continuous means that two adjacent frequency bands supported by multiple resonant modes are at least partially overlapped. Frequency bands supported by multiple resonant modes being discontinuous means that no overlap exists between two adjacent bands supported by multiple resonant modes.

When the antenna assembly 100 is configured to cover two signals with different communication protocols (for example, a mobile communication 4G/5G signal and a Wi-Fi signal), the first antenna unit 10 can support relatively more resonant modes, cover a relatively wide frequency-band width, and support a relatively large number of frequency bands, so that the first antenna unit 10 supports one communication protocol signal (for example, the mobile communication 4G/5G signal) that requires support of more resonant modes, and the second antenna unit 20 supports the other communication protocol signal (for example, the Wi-Fi signal). In this way, one antenna unit does not need to support two signals with different communication protocols, and thus devices such as a combiner do not need to be arranged, so as to avoid increased losses on an RF link.

In the antenna assembly 100 and the electronic device 1000 provided in the present disclosure, the first radiator 11 and the second radiator 21 are designed to be capacitively coupled to each other, and the first radiator 11 and the second radiator 21 each serve as a co-aperture radiator of the first antenna unit 10 and the second antenna unit 20. The length of the second radiator 21 is also designed to correspond to a ⅛ to ¼ wavelength of the resonant frequency of the excitation current provided by the first feeding module 13, so that current from the first feeding module 13 resonates on the first radiator 11 and resonates on a ⅛ to ¼ wavelength mode on the second radiator 21 through the first coupling gap 140. In this way, the number of resonant modes supported by the first antenna unit 10 and receiving/transmitting efficiency for supported frequency bands can be increased, so as to increase the number or bandwidth of frequency bands supported by the first antenna unit 10 and to improve data transmission rate and communication quality. In addition, the second antenna unit 20 can support signals with the same protocol standard, so as to avoid RF link losses generated by receiving/transmitting signals with different protocol standards through one radiator, to make the structure of the antenna unit 100 more simple and compact, and to reduce RF link losses.

Figure 4:
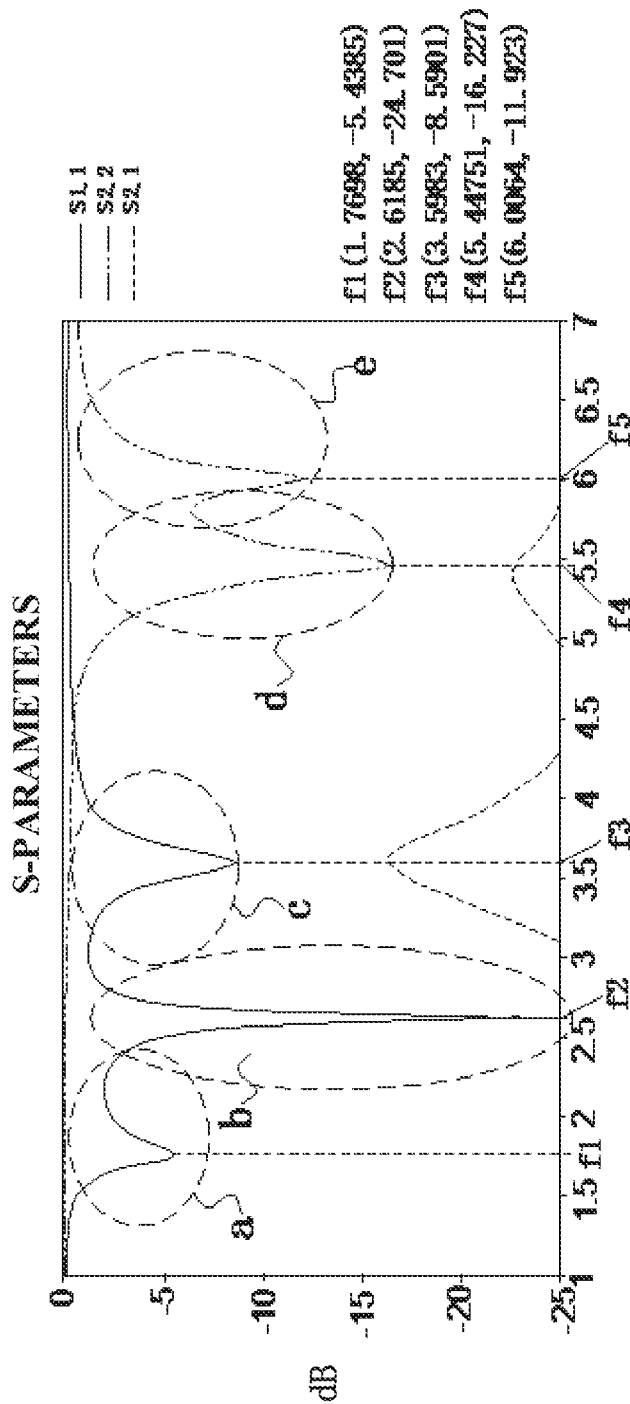
FIG. 4 is a schematic graph illustrating S-parameters of the antenna assembly illustrated in FIG. 3.

As illustrated in FIG. 4, the first antenna unit 10 at least supports a first resonant mode a, a second resonant mode b, and a fourth resonant mode c.

Optionally, the first radiator 11 at least supports, under excitation of the first feeding module 13, the first resonant mode a and the fourth resonant mode c. The second radiator 21 at least supports, under excitation of the first feeding module 13, the second resonant mode b.

The resonant mode is indicated by the antenna assembly 100 having higher efficiency of transmitting/receiving electromagnetic waves at and near a resonant frequency, the resonant frequency is a resonant frequency of the resonant mode, and the resonant frequency and vicinity of the resonant frequency form a frequency band supported or covered by the resonant mode. Optionally, in a return loss (RL) curve, an absolute value of a return loss value being greater than or equal to 5 decibels (dB) (which is merely an example and cannot be construed as a limitation on a return loss value for high efficiency in the present disclosure) is taken as a reference value with higher efficiency of transmitting/receiving electromagnetic waves. A set of frequencies whose absolute values of the return loss values in one resonant mode are greater than or equal to 5 dB is taken as a frequency band supported by the resonant mode.

Figure 5:
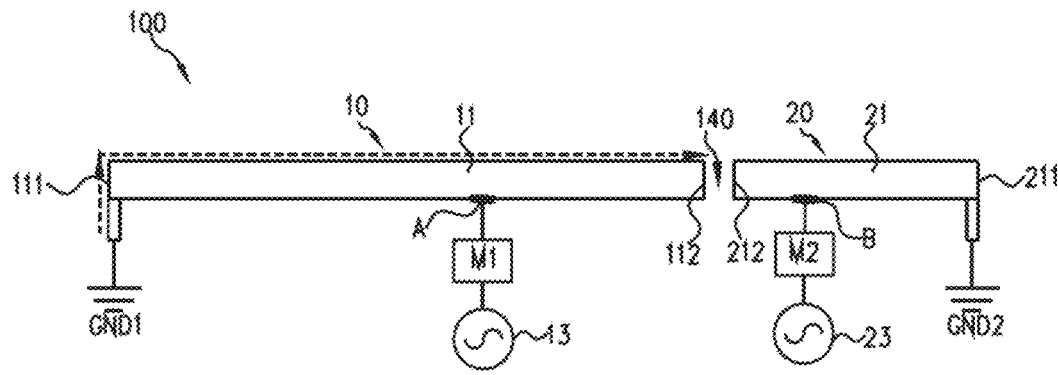
FIG. 5 is a schematic diagram illustrating the distribution of a first-resonant-current density of the antenna assembly illustrated in FIG. 3.

As illustrated in FIG. 5, first-resonant-current density of the first resonant mode a is mainly distributed between the first ground end 111 and the first coupling end 112, and first resonant current flows from the first ground end 111 to the first coupling end 112, or flows from the first coupling end 112 to the first ground end 111. It can be understood that, current density of the first resonant mode a is mainly distributed as described above, and a small amount of current density of the first resonant mode a is distributed on the second radiator 21.

Specifically, references are made to FIG. 4 and FIG. 5, the first resonant mode a is a ⅛ to ¼ wavelength mode caused by the excitation current (namely, the first resonant current) of the first feeding module 13 resonating on the first radiator 11. Specifically, a length of the first radiator 11 is designed to be about ⅛ times to ¼ times a wavelength of the excitation current, in the medium, flowing from the first feeding module 13 to the first radiator 11, so that the first resonant mode a is excited on the first radiator 11, and higher radiation efficiency can be achieved in a frequency band supported by the first resonant mode a.

Generally, the length of the first radiator 11 is designed to be about ¼ times the wavelength of the excitation current, in the medium, flowing from the first feeding module 13 to the first radiator 11, so that the higher radiation efficiency is easily excited at a first resonant frequency point f1 (namely, a resonant frequency of the first resonant mode a). Further, a capacitive matching circuit connected to the ground is disposed on a path of the first resonant current so as to feed the first resonant current to the first radiator 11 through capacitive coupling. A capacitive loading may enable the resonant frequency of the first resonant mode a to be shifted towards lower frequencies, so that the higher-efficiency resonance is not just generated when the length of the first radiator 11 is about a ¼ wavelength, but also generated when the length of the first radiator 11 is in a range of a ⅛ to ¼ wavelength. Therefore, while a resonance is generated at the first resonant frequency point f1, the length of the first radiator 11 can also be shortened, for example, shortened to ⅛ times a wavelength corresponding to the first resonant frequency point f1, so as to further reduce the length of the first radiator 11 and to reduce an overlapping length of the antenna assembly 100.

Figure 6:
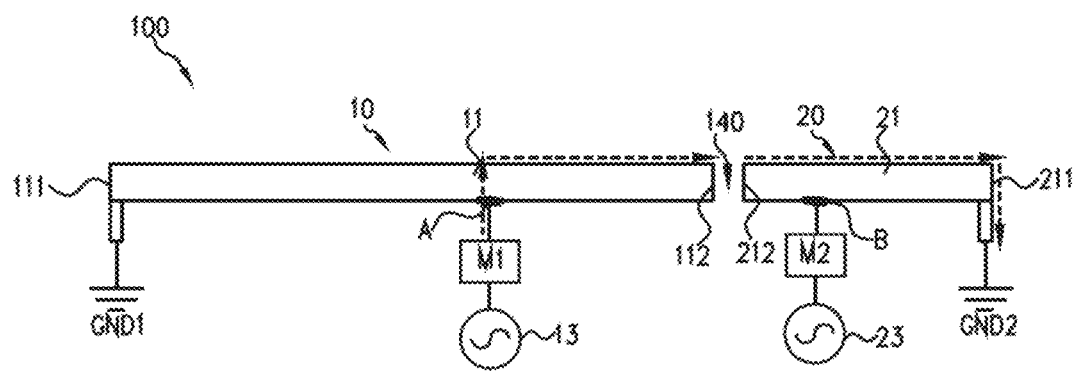
FIG. 6 is a schematic diagram illustrating the distribution of a second-resonant-current density of the antenna assembly illustrated in FIG. 3.

Optionally, as illustrated in FIG. 6, second-resonant-current density of the second resonant mode b is mainly distributed between the first feeding point A and the second ground end 212. Second resonant current flows from the first feeding point A to the first coupling end 112, through the first coupling gap 140 to the second coupling end 211, and from the second coupling end 211 to the second ground end 212; or the second resonant current flows from the second ground end 212 to the second coupling end 211, through the first coupling gap 140 to the first coupling end 112, and from the first coupling end 112 to the first feeding point A. It can be understood that, current density of the second resonant mode b is mainly distributed as described above, and a small amount of current density of the second resonant mode b is distributed on the second radiator 21.

References are made to FIG. 4 and FIG. 6, the second resonant mode b is a ⅛ to ¼ wavelength mode caused by the excitation current (namely, the second resonant current) of the first feeding module 13 resonating on the second radiator 21. Specifically, a length of the second radiator 21 is designed to be about ⅛ times to ¼ times a wavelength of the excitation current, in the medium, flowing from the first feeding module 13 to the second radiator 21, so as to excite the second resonant mode b on the second radiator 21.

Generally, the length of the second radiator 21 is designed to be about ¼ times the wavelength of the excitation current, in the medium, flowing from the first feeding module 13, so that the higher radiation efficiency is easily excited at a second resonant frequency point f2 (namely, a resonant frequency of the second resonant mode b). Further, a capacitive matching circuit connected to the ground is disposed on a path of the second resonant current, so as to feed the second resonant current to the second radiator 21 through capacitive coupling. The capacitive loading may enable the resonant frequency of the second resonant mode b to be shifted towards lower frequencies, so that the higher-efficiency resonance is not just generated when the length of the second radiator 21 is about ¼ wavelength, but also generated when the length of the second radiator 21 is in the range of the ⅛ to ¼ wavelength. Therefore, while the resonance is generated at the second resonant frequency point f2, the length of the second radiator 21 can also be shortened, for example, shortened to ⅛ times a wavelength corresponding to the second resonant frequency point f2, so as to further reduce the length of the second radiator 21 and to reduce the overlapping length of the antenna assembly 100.

Figure 7:
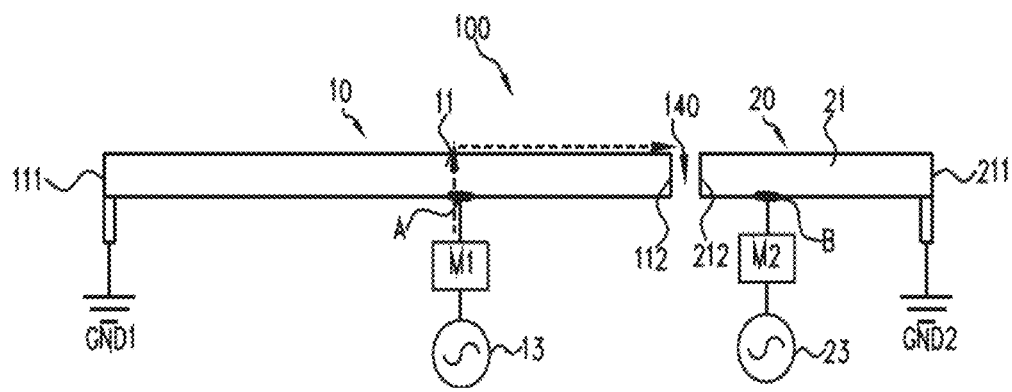
FIG. 7 is a schematic diagram illustrating the distribution of a third-resonant-current density of the antenna assembly illustrated in FIG. 3.

Optionally, as illustrated in FIG. 7, third-resonant-current density of the fourth resonant mode c is mainly distributed between the first feeding point A and the first coupling point 112, and third resonant current flows from the first feeding point A to the first coupling point 112, or flows from the first coupling point 112 to the first feeding point A. It can be understood that, current density of the fourth resonant mode c is mainly distributed as described above, and a small amount of current density of the fourth resonant mode c is distributed on the second radiator 21 and distributed between the first ground end 111 and the first feeding point A.

References are made to FIG. 4 and FIG. 7, the fourth resonant mode c is a ⅛ to ¼ wavelength mode caused by the excitation current (namely, the third resonant current) of the first feeding module 13 resonating from the first feeding point A to the first coupling end 112. Specifically, a length from the first feeding point A to the first coupling end 112 is designed to be about ⅛ to ¼ times the wavelength of the excitation current, in the medium, flowing from the first feeding module 13 to the first radiator 11, so as to excite the fourth resonant mode c from the first feeding point A to the first coupling end 112.

Generally, the length from the first feeding point A to the first coupling end 112 is designed to be about ¼ times the wavelength of the excitation current, in the medium, flowing from the first feeding module 13, so that the higher radiation efficiency is easily excited at a third resonant frequency point f3 (namely, a resonant frequency of the fourth resonant mode c).

Further, the capacitive matching circuit connected to the ground is disposed on a path of the third resonant current, so as to feed the third resonant current to the first radiator 11 through capacitive coupling. The capacitive loading may enable the resonant frequency of the fourth resonant mode c to be shifted towards lower frequencies, so that the higher-efficiency resonance is not just generated when the length from the first feeding point A to the first coupling end 112 is about ¼ wavelength, but also generated when the length from the first feeding point A to the first coupling end 112 is in the range of the ⅛ to ¼ wavelength. Therefore, while the resonance is generated at the third resonant frequency point f3, the length from the first feeding point A to the first coupling end 112 can also be shortened, for example, shortened to ⅛ times a wavelength of the third resonant frequency point f3, so as to further reduce the length from the first feeding point A to the first coupling end 112 and to reduce the overlapping length of the antenna assembly 100.

Certainly, in other embodiments, the second resonant mode b is the ⅛ to ¼ wavelength mode caused by the excitation current of the first feeding module 13 resonating between the first feeding point A and the first coupling end 112, and the fourth resonant mode c is the ⅛ to ¼ wavelength mode caused by the excitation current of the first feeding module 13 resonating from the first feeding point A to the first coupling end 112.

The length of the first radiator 11, the length from the first feeding point A to the first coupling end 112, and the length of the second radiator 21 are designed to make the first feeding module 13 excite resonant modes on the first radiator 11, between the first feeding point A and the first coupling end 112 on the first radiator 11, and on the second radiator 21. In this way, the number of resonant modes supported by the first antenna unit 10 is increased, the number of frequency bands supported by the antenna assembly 100 and the frequency-band width supported by the antenna assembly 100 are effectively increased, and data transmission rate of the antenna assembly 100 is increased.

Optionally, the first resonant mode a may support the GPS frequency band, the LTE-4G frequency band, the NR-5G frequency band, the Wi-Fi 2.4G frequency band, the Wi-Fi 5G frequency band, the Wi-Fi 6E frequency band, or a combination of the LTE-4G frequency band and the NR-5G frequency band. The second resonant mode b may support the GPS frequency band, the LTE-4G frequency band, the NR-5G frequency band, the Wi-Fi 2.4G frequency band, the Wi-Fi 5G frequency band, the Wi-Fi 6E frequency band, or the combination of the LTE-4G frequency band and the NR-5G frequency band. The fourth resonant mode c may support the GPS frequency band, the LTE-4G frequency band, the NR-5G frequency band, the Wi-Fi 2.4G frequency band, the Wi-Fi 5G frequency band, the Wi-Fi 6E frequency band, or the combination of the LTE-4G frequency band and the NR-5G frequency band. One resonant mode may support a separate LTE-4G frequency band, a separate NR-5G frequency band, a separate Wi-Fi frequency band, or a combination of the LTE-4G frequency band and the NR-5G frequency band.

In the present disclosure, the magnitude of the resonant frequency in the first resonant mode a, the magnitude of the resonant frequency in the second resonant mode b, and the magnitude of the resonant frequency in the fourth resonant mode c are not specifically limited. In this embodiment, the resonant frequency of the first resonant mode a, the resonant frequency of the second resonant mode b, and the resonant frequency of the fourth resonant mode c increase sequentially. When the first resonant mode a, the second resonant mode b, and the fourth resonant mode c are all the ¼ wavelength mode, since the resonant frequency of the first resonant mode a, the resonant frequency of the second resonant mode b, and the resonant frequency of the fourth resonant mode c increase sequentially, the ¼ wavelength corresponding to the resonant frequency of the first resonant mode a, the ¼ wavelength corresponding to the resonant frequency of the second resonant mode b, and the ¼ wavelength corresponding to the resonant frequency of the fourth resonant mode c decrease sequentially. Compared with disposing a radiating portion of the ¼ wavelength corresponding to the resonant frequency of the fourth resonant mode c on the first radiator 11, a total length of a co-aperture radiator is shorter, by disposing a radiating portion of the ¼ wavelength corresponding to the resonant frequency of the second resonant mode b on the first radiator 11. In this way, the overlapping length of the first radiator 11 and the second radiator 21 of the antenna assembly 100 is shorter, and the space occupied by the antenna assembly 100 is further reduced in extremely compact space.

In this embodiment, the first resonant mode a supports at least one of the GPS frequency band, the LTE-4G MHB frequency band, or the NR-5G MHB frequency band, for example, at least one of a GPS-L1 frequency band, a B3 frequency band, a BI frequency band, an N3 frequency band, or an NI frequency band. For example, the resonant frequency of the first resonant mode a is 1.7698 GHz. The second resonant mode b supports at least one of the Wi-Fi 2.4G frequency band, the LTE-4G MHB frequency band, or the NR-5G MHB frequency band, for example, Wi-Fi 2.4G frequency band, B7 frequency band, B41 frequency band, B38 frequency band, N7 frequency band, N41 frequency band, or the like. For example, the resonant frequency of the second resonant mode b is 2.6185 GHz. The fourth resonant mode c supports at least one of the LTE-4G UHB frequency band, the NR-5G UHB frequency band, or the like, for example, at least one of the N78 frequency band, a B42 frequency band, a B43 frequency band, or the like. For example, the resonant frequency of the fourth resonant mode c is 3.5983 GHz. MHB refers to middle-high frequency band (1000 MHz to 3000 MHz), and UHB refers to ultra-high frequency band (3000 MHz to 10000 MHZ).

Optionally, as illustrated in FIG. 4, the second radiator 21 at least supports a fifth resonant mode d and a third resonant mode e.

Optionally, the second radiator 21 between the second coupling end 211 and the second feeding point B at least supports the fifth resonant mode d under excitation of the second feeding module 23. The first radiator 11 at least supports the third resonant mode e under excitation of the second feeding module 23.

Figure 8:
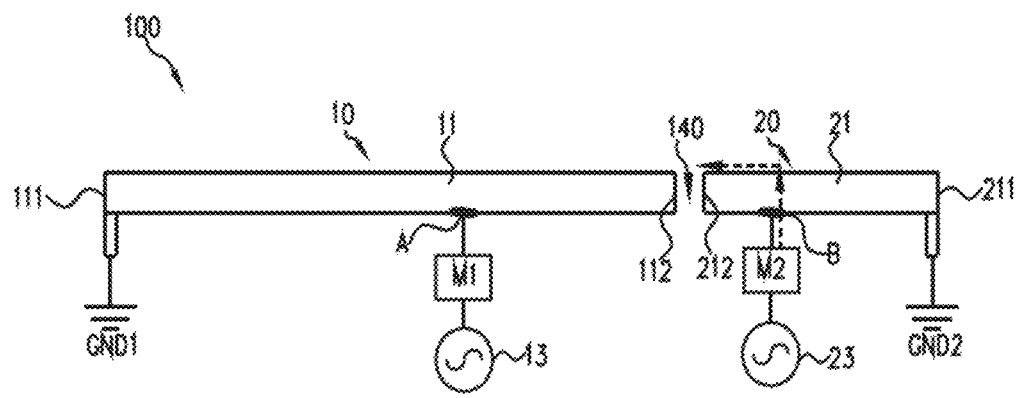
FIG. 8 is a schematic diagram illustrating the distribution of a fourth-resonant-current density of the antenna assembly illustrated in FIG. 3.

Optionally, as illustrated in FIG. 4 and FIG. 8, fourth-resonant-current density of the fifth resonant mode d is mainly distributed between the second feeding point B and the second coupling point 211, and fourth resonant current flows from the second feeding point B to the second coupling point 211, or flows from the second coupling point 211 to the second feeding point B. It can be understood that, current density of the fifth resonant mode d is mainly distributed as described above, and a small amount of current density of the fifth resonant mode d is distributed on the first radiator 11 and distributed between the second ground end 212 and the second feeding point B.

Specifically, the fifth resonant mode d is a ⅛ to ¼ wavelength mode caused by the excitation current (namely, the fourth resonant current) of the second feeding module 23 resonating from the second feeding point B to the second coupling end 211. Specifically, a length from the second feeding point B to the second coupling end 211 is designed to be about ⅛ times to ¼ times a wavelength of the excitation current, in the medium, flowing from the second feeding module 23 to the second radiator 21, so as to excite the fifth resonant mode d from the second feeding point B to the second coupling end 211.

Generally, the length from the second feeding point B to the second coupling end 211 is designed to be about ¼ times the wavelength of the excitation current, in the medium, flowing from the second feeding module 23, so that the higher radiation efficiency is easily excited at a fourth resonant frequency point f4 (namely, a resonant frequency of the fifth resonant mode d). Further, the capacitive matching circuit connected to the ground is disposed on a path of the fourth resonant current so as to feed the fourth resonant current to the second radiator 21 through capacitive coupling. The capacitive loading may enable the resonant frequency of the fifth resonant mode d to be shifted towards lower frequencies, so that the higher-efficiency resonance is not just generated when the length from the second feeding point B to the second coupling end 211 is about the ¼ wavelength, but also generated when the length from the second feeding point B to the second coupling end 211 is in the range of the ⅛ to ¼ wavelength. Therefore, while a resonance is generated at the fourth resonant frequency point f4, the length from the second feeding point B to the second coupling end 211 can also be shortened, for example, shortened to ⅛ times a wavelength corresponding to the fourth resonant frequency point f4, so as to further reduce the length from the second feeding point B to the second coupling end 211 and to reduce the overlapping length of the antenna assembly 100.

Figure 9:
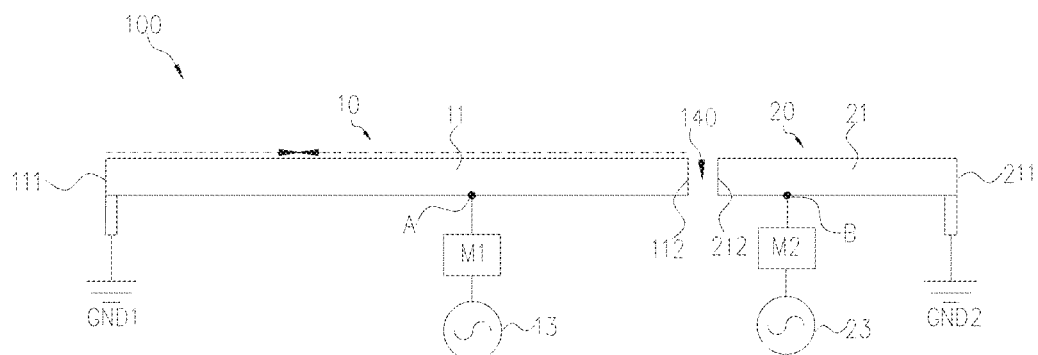
FIG. 9 is a schematic diagram illustrating the distribution of a fifth-resonant-current density of the antenna assembly illustrated in FIG. 3.

Optionally, as illustrated in FIG. 9, fifth-resonant-current density in the third resonant mode e is mainly distributed between the first ground end 111 and the first coupling end 112, and fifth resonant current flows from the first ground end 111 to the first coupling end 112, or flows from the first coupling end 112 to the first ground end 111. It can be understood that, current density of the third resonant mode e is mainly distributed as described above, and a small amount of current density of the third resonant mode e is distributed between the second coupling end 211 and the second ground end 212.

The third resonant mode e is a ¾ wavelength mode caused by the excitation current of the second feeding module 23 resonating on the first radiator 11. Specifically, the length of the first radiator 11 is designed to be about ¾ times a wavelength of the excitation current, in the medium, flowing from the second feeding module 23 to the first radiator 11, so as to excite the third resonant mode e on the first radiator 11.

It should be noted that, the first resonant mode a to the third resonant mode e are described above from the perspective of the wavelength mode, which can be better understood and explained and illustrates main characteristics of each resonant mode so that each resonant mode is easily distinguished. However, when each resonant mode operates, the first antenna unit 10 and the second antenna unit 20 are not independent, but are coupled to each other, and current also flows to each other through the coupling.

It can be understood that, in the second antenna unit 20, the first radiator 11 is similar to a parasitic radiator of the second radiator 21. The third resonant mode e is a resonant mode generated when the second feeding module 23 excites the parasitic radiator (of the second radiator 21).

The length of the first radiator 11 and the length from the second feeding point B to the second coupling end 211 are designed to make the second feeding module 23 excite resonant modes on the first radiator 11 and between the second feeding point B and the second coupling end 211 on the second radiator 21. In this way, the number of resonant modes supported by the first antenna unit 10 is increased, the number of frequency bands supported by the second antenna unit 20 and the frequency-band width supported by the second antenna unit 20 are effectively increased, and the data transmission rate of the antenna assembly 100 is increased.

Optionally, the fifth resonant mode d may support the GPS frequency band, the LTE-4G frequency band, the NR-5G frequency band, the Wi-Fi 2.4G frequency band, the Wi-Fi 5G frequency band, the Wi-Fi 6E frequency band, or a combination of the LTE-4G frequency band and the NR-5G frequency band. The third resonant mode may support the GPS frequency band, the LTE-4G frequency band, the NR-5G frequency band, the Wi-Fi 2.4G frequency band, the Wi-Fi 5G frequency band, the Wi-Fi 6E frequency band, or the combination of the LTE-4G frequency band and the NR-5G frequency band. One resonant mode may support the separate LTE-4G frequency band, the separate NR-5G frequency band, the separate Wi-Fi frequency band, or the combination of the LTE-4G frequency band and the NR-5G frequency band.

In the present disclosure, the magnitude of the resonant frequency of the fifth resonant mode d and the magnitude of the resonant frequency of the third resonant mode e are not limited. In this embodiment, the resonant frequency of the fifth resonant mode d is less than the resonant frequency of the third resonant mode e.

Further, the resonant frequency of the fifth resonant mode d is greater than the resonant frequency of the fourth resonant mode c, and ¼ wavelength of the resonant frequency of the fifth resonant mode d is less than ¼ wavelength of the resonant frequency of the fourth resonant mode c. In the second radiator 21, a position of the second feeding point B is properly designed, so that a length between the second feeding point B and the second coupling end 211 corresponds to ¼ wavelength of the resonant frequency of the fifth resonant mode d, so as to excite the resonant mode between the second feeding point B and the second coupling end 211 on the second radiator 21.

When the resonant frequency of the third resonant mode e is 3 times to 6 times the resonant frequency of the first resonant mode a (for example, the first resonant mode a supports the GPS-L1 frequency band, the B3 frequency band, the BI frequency band, the N3 frequency band, or the NI frequency band; and the third resonant mode e supports the Wi-Fi 5G frequency band or the Wi-Fi 6E frequency band), the second feeding module 23 may excite a ¾ wavelength mode on the first radiator 11. In this way, the first radiator 11 is also reused while the number of resonant modes is increasing.

All of the above describe a reasonable design of a size of the first radiator 11 and the second radiator 21 and location planning of feeding points, so as to generate, in a limited length of the first radiator 11 and the second radiator 21, as many resonant modes with relatively high efficiency and frequency bands needed to be supported as possible.

In this embodiment, the fifth resonant mode d supports at least one of the Wi-Fi 5G frequency band or the Wi-Fi 6E frequency band, and the third resonant mode supports at least one of the Wi-Fi 5G frequency band or the Wi-Fi 6E frequency band. For example, the resonant frequency of the fifth resonant mode d is 5.4751 GHz and the resonant frequency of the third resonant mode e is 6.0064 GHz.

In this embodiment, the first antenna unit 10 may support the GPS-L1 frequency band, the Wi-Fi 2.4G frequency band, the LTE-4G MHB frequency band (for example, the B3 frequency band, the BI frequency band, the B7 frequency band, the B41 frequency band, or B38 frequency band), the NR-5G MHB frequency band (for example, the N3 frequency band, the NI frequency band, the N7 frequency band, or the N41 frequency band), the LTE-4G UHB frequency band (for example, the B42 frequency band or the B43 frequency band), and the NR-5G UHB frequency band (for example, the N78 frequency band). The second antenna unit 20 may support the Wi-Fi 5G frequency band, the Wi-Fi 6E frequency band, or the like, such that the second antenna unit 20 only needs to support a communication signal of one communication protocol. In this way, devices such as a combiner, configured to combine two communication signals of different communication protocols, do not need to be disposed in an RF link of the second antenna unit 20, so that the number of devices in the RF link is reduced, and RF link losses of the antenna assembly 100 are reduced.

In this embodiment, the first matching module M1 is disposed between the first feeding point A and the first feeding module 13, and the first matching module M1 is configured to select frequency bands from signals fed by the first feeding module 13. For example, the first matching module M1 selects a frequency band of 1 GHz to 7 GHz from RF signals transmitted from the first feeding module 13 and transmits the frequency band of 1 GHz to 7 GHz to the first feeding point A, or the first matching module M1 selects a frequency band of 1 GHz to 4.5 GHz from RF signals transmitted from the first feeding module 13 and transmits the frequency band of 1 GHz to 4.5 GHz to the first feeding point A. In addition, the first matching module M1 can also tune resonant modes supported by the second antenna unit 20 to make the antenna assembly 100 resonate at frequency bands needed to be supported, and can isolate resonant signals of the second antenna unit 20 to increase isolation between the first antenna unit 10 and the second antenna unit 20.

The first matching module M1 will be specifically described below with reference to accompanying drawings.

Figure 10:
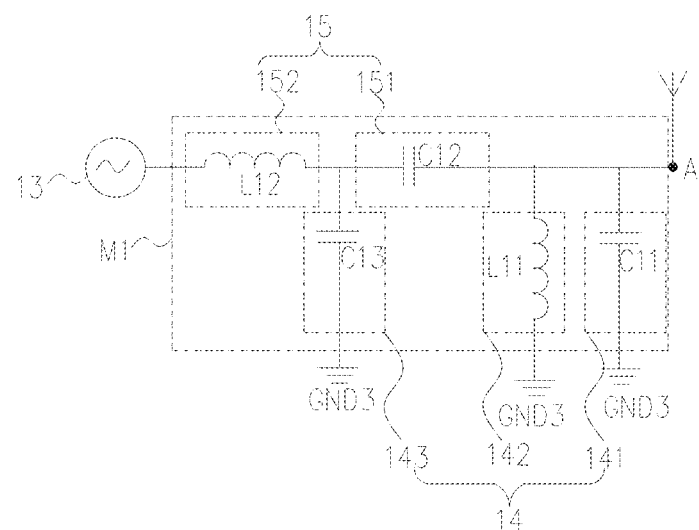
FIG. 10 is a schematic structural diagram of a first matching module illustrated in FIG. 3.

As illustrated in FIG. 10, the first matching module M1 includes at least one first branch 14 connected in parallel to the ground and/or at least one second branch 15 connected in series between the first feeding point A and the first feeding module 13, and each of the at least one first branch 14 and the at least one second branch 15 includes at least one of a capacitor or an inductor.

The first branch 14 includes, but is not limited to, at least one of a single-capacitor branch, a single-inductor branch, or frequency-selective filter circuits listed in the following embodiments.

Figure 11:
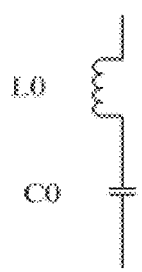
FIG. 11 is a schematic structural diagram of a first type of first sub-branch provided in embodiments of the present disclosure.

As illustrated in FIG. 11, the first branch 14 includes a band-pass circuit formed by an inductor L0 and a capacitor C0 connected in series.

Figure 12:
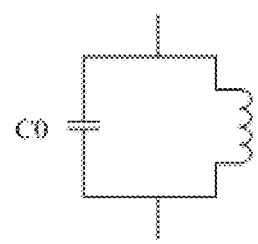
FIG. 12 is a schematic structural diagram of a second type of first sub-branch provided in embodiments of the present disclosure.

As illustrated in FIG. 12, the first branch 14 includes a band-stop circuit formed by an inductor L0 and a capacitor C0 connected in parallel.

Figure 13:
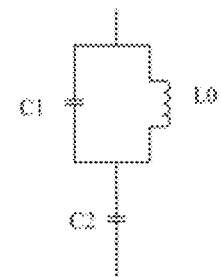
FIG. 13 is a schematic structural diagram of a third type of first sub-branch provided in embodiments of the present disclosure.

As illustrated in FIG. 13, the first branch 14 includes a band-pass or band-stop circuit formed by an inductor L0, a first capacitor C1, and a second capacitor C2. The inductor L0 is connected in parallel with the first capacitor C1, and the second capacitor C2 is electrically connected to a node at which the inductor L0 is electrically connected to the first capacitor C1.

Figure 14:
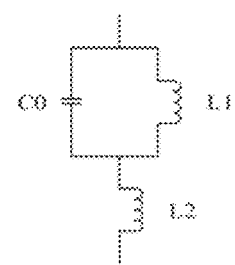
FIG. 14 is a schematic structural diagram of a fourth type of first sub-branch provided in embodiments of the present disclosure.

As illustrated in FIG. 14, the first branch 14 includes a band-pass or band-stop circuit formed by a capacitor C0, a first inductor L1, and a second inductor L2. The capacitor C0 is connected in parallel with the first inductor L1, and the second inductor L2 is electrically connected to a node where the capacitor C0 is electrically connected to the first inductor L1.

Figure 15:
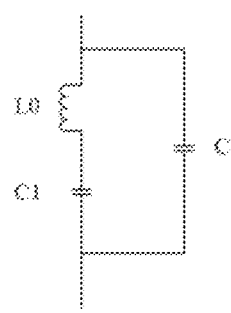
FIG. 15 is a schematic structural diagram of a fifth type of first sub-branch provided in embodiments of the present disclosure.

As illustrated in FIG. 15, the first branch 14 includes a band-pass or band-stop circuit formed by an inductor L0, a first capacitor C1, and a second capacitor C2. The inductor L0 is connected in series with the first capacitor C1, one end of the second capacitor C2 is electrically connected to one end of the inductor L0 that is not connected to the first capacitor C1, and the other end of the second capacitor C2 is electrically connected to one end of the first capacitor C1 that is not connected to the inductor L0.

Figure 16:
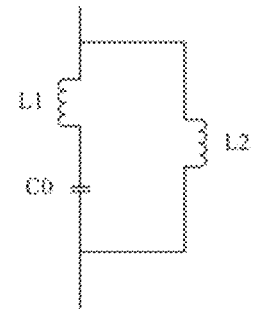
FIG. 16 is a schematic structural diagram of a sixth type of first sub-branch provided in embodiments of the present disclosure.

As illustrated in FIG. 16, the first branch 14 includes a band-pass or band-stop circuit formed by a capacitor C0, a first inductor L1, and a second inductor L2. The capacitor C0 is connected in series with the first inductor L1, one end of the second inductor L2 is electrically connected to one end of the capacitor C0 that is not connected to the first inductor L1, and the other end of the second inductor L2 is electrically connected to one end of the first inductor L1 that is not connected to the capacitor C0.

Figure 17:
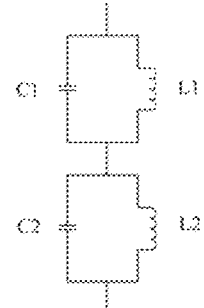
FIG. 17 is a schematic structural diagram of a seventh type of first sub-branch provided in embodiments of the present disclosure.

As illustrated in FIG. 17, the first branch 14 includes a first capacitor C1, a second capacitor C2, a first inductor L1, and a second inductor L2. The first capacitor C1 is connected in parallel with the first inductor L1, the second capacitor C2 is connected in parallel with the second inductor L2, and one end of a whole formed by the second capacitor C2 and the second inductor L2 connected in parallel is electrically connected to one end of a whole formed by the first capacitor C1 and the first inductor L1 connected in parallel.

Figure 18:
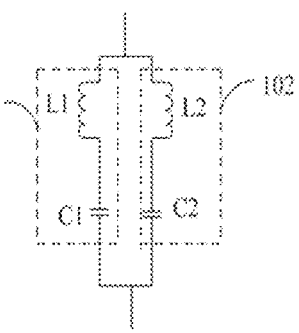
FIG. 18 is a schematic structural diagram of an eighth type of first sub-branch provided in embodiments of the present disclosure.

As illustrated in FIG. 18, the first branch 14 includes a first capacitor C1, a second capacitor C2, a first inductor L1, and a second inductor L2. The first capacitor C1 and the first inductor L1 are connected in series to form a first unit 101, the second capacitor C2 and the second inductor L2 are connected in series to form a second unit 102, and the first unit 101 and the second unit 102 are connected in parallel.

The second branch 15 includes, but is not limited to, at least one of a single-capacitor ground branch, a single-inductor ground branch, or ground branches listed in any embodiment of FIG. 11 to FIG. 18.

The first matching module M1 is configured to tune at least one of the resonant frequency of the first resonant mode a, the resonant frequency of the second resonant mode b, or the resonant frequency of the fourth resonant mode c. For example, when the antenna assembly 100 is configured to support frequency bands of LTE/NR-MHB+Wi-Fi-2.4 GHz+N78, a structure of the first matching module M1 is set, and values of each device are designed, so that the first resonant mode a and the second resonant mode b can support the LTE/NR-MHB frequency band, the second resonant mode b can support the Wi-Fi-2.4 GHz frequency band, and the fourth resonant mode c can support the N78 frequency band.

For example, as illustrated in FIG. 10, the at least one first branch 14 includes a first sub-branch 141, a second sub-branch 142, and a third sub-branch 143. One end of the first sub-branch 141 is electrically connected to the first feeding point A, and the other end of the first sub-branch 141 is electrically connected to the third reference ground GND3. The first sub-branch 141 includes a single-capacitor sub-branch or a sub-branch with a capacitor and an inductor connected in series. In this embodiment, the first sub-branch 141 is a single-capacitor sub-branch, and the capacitor is marked as C11.

In this embodiment, as illustrated in FIG. 10, one end of the second sub-branch 142 is electrically connected to the first feeding point A, and the other end of the second sub-branch 142 is electrically connected to the third reference ground GND3. The second sub-branch 142 includes an inductor, or an inductor and a capacitor. In this embodiment, the second sub-branch 142 is a single-inductor sub-branch, and the inductor is marked as L11. In other embodiments, the second sub-branch 142 may also be a sub-branch with an inductor and a capacitor connected in series.

As illustrated in FIG. 10, the other end of the third sub-branch 143 is electrically connected to the third reference ground GND3. The third sub-branch 143 includes a capacitor, or a capacitor and an inductor. In this embodiment, the third sub-branch 143 is a single-capacitor sub-branch, and the capacitor is marked as C13. In other embodiments, the third sub-branch 143 may also be a sub-branch with an inductor and a capacitor connected in series.

As illustrated in FIG. 10, the at least one second branch 15 includes a fourth sub-branch 151 and a fifth sub-branch 152.

As illustrated in FIG. 10, one end of the fourth sub-branch 151 is electrically connected to the first feeding point A, and the other end of the fourth sub-branch 151 is electrically connected to one end of the third sub-branch 143 away from the third reference ground GND3. The fourth sub-branch 151 includes a capacitor, or a capacitor and an inductor. In this embodiment, the fourth sub-branch 151 is a capacitor, which is marked as C12. In other embodiments, the fourth sub-branch 151 may also be a sub-branch with an inductor and a capacitor connected in series.

As illustrated in FIG. 10, one end of the fifth sub-branch 152 is electrically connected to said the other end of the fourth sub-branch 151, and the other end of the fifth sub-branch 152 is electrically connected to the first feeding module 13. The fifth sub-branch 152 includes an inductor. In this embodiment, the fifth sub-branch 152 is an inductor, which is marked as L12.

The above is merely an example of an embodiment of the first matching module M1, and in other embodiments, a sub-branch may be additionally disposed between the first sub-branch 141 and the first feeding point A, or a sub-branch may be additionally disposed between the fourth sub-branch 151 and the first feeding point A.

As illustrated in FIG. 3, FIG. 4, and FIG. 10, the first sub-branch 141, the third sub-branch 143, and the fifth sub-branch 152 are configured to tune the second resonant mode b and the fourth resonant mode c. The second sub-branch 142 and the fourth sub-branch 151 are configured to tune the first resonant mode a. Specifically, the first sub-branch 141 (C11) is configured to tune a resonant point of the second resonant mode b and a resonant point of the fourth resonant mode c, so as to enable the fourth resonant mode c to cover the N78 frequency band and enable the second resonant mode b to cover the N41 frequency band. In addition, the first sub-branch 141 (C11) can also isolate the Wi-Fi-5G frequency band and Wi-Fi-6E frequency band in the second antenna unit 20, so as to prevent the first antenna unit 10 from being interrupted by the Wi-Fi-5G frequency band and Wi-Fi-6E frequency band, and to improve the isolation between the first antenna unit 10 and the second antenna unit 20. The third sub-branch 143 (C13) can tune the second resonant mode b and the fourth resonant mode c, and the fifth sub-branch 152 (L12) can tune the second resonant mode b and the fourth resonant mode c. For example, C11=1 picofarad (pF), L11=4.3 nanohenry (nH), C12=1 pF, C13=0.5 pF, L12=3.3 nH, so that the first resonant mode can efficiently support the LTE/NR-MHB frequency band, the second resonant mode b can efficiently support the Wi-Fi 2.4G frequency band and the N41 frequency band, and the fourth resonant mode c can efficiently support the N78 frequency band.

Figure 19:
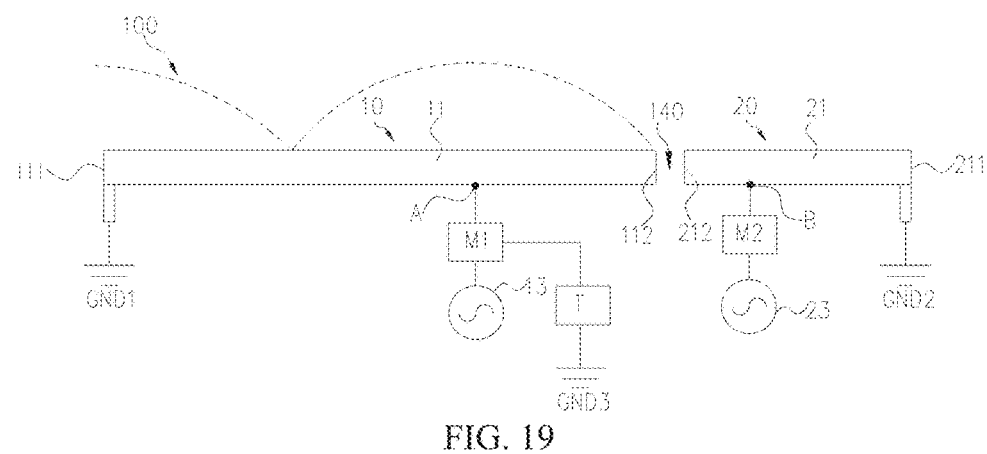
FIG. 19 is a schematic structural diagram of the first type of antenna assembly illustrated in FIG. 3 with an adjustable branch.

As illustrated in FIG. 19, the first matching module M1 further includes at least one adjustable branch T electrically connected to the third reference ground GND3. A position of the at least one adjustable branch T is not specifically limited in the present disclosure, and the at least one adjustable branch T may be the first sub-branch 141, or the second sub-branch 142, or the third sub-branch 143, or newly additionally disposed between the first feeding point A and the first sub-branch 141, or newly additionally disposed between the first sub-branch 141 and the second sub-branch 142, or newly additionally disposed between the third sub-branch 143 and the fourth sub-branch 144, or the like. The at least one adjustable branch T is configured to tune the resonance frequency of the first resonant mode a and the resonance frequency of the fourth resonant mode c. Specifically, the at least one adjustable branch T is configured to adjust a position of a resonant frequency point of the first resonant mode a and a position of a resonant frequency point of the fourth resonant mode c, so that the first resonant mode a and the fourth resonant mode c can support a larger range of required frequency bands. For example, the first matching module M1 provided with the adjustable branch T shifts the resonant frequency of the first resonant mode a from 1.77 GHz to 1.92 GHZ, and shifts the resonant frequency of the fourth resonant mode c from 3.6 GHz to 3.7 GHZ, so that a range of frequency bands that the antenna assembly 100 can support can be covered.

The present disclosure does not limit a specific structure of the adjustable branch T. Optionally, the adjustable branch T includes at least one of a switching circuit or an adjustable capacitor. The switching circuit includes, but is not limited to, multiple sub-branches each having a switch and a capacitor, multiple sub-branches each having a switch and a resistor, multiple sub-branches each having a switch and an inductor, and multiple sub-branches each having a switch, an inductor, and a capacitor.

Figure 20:
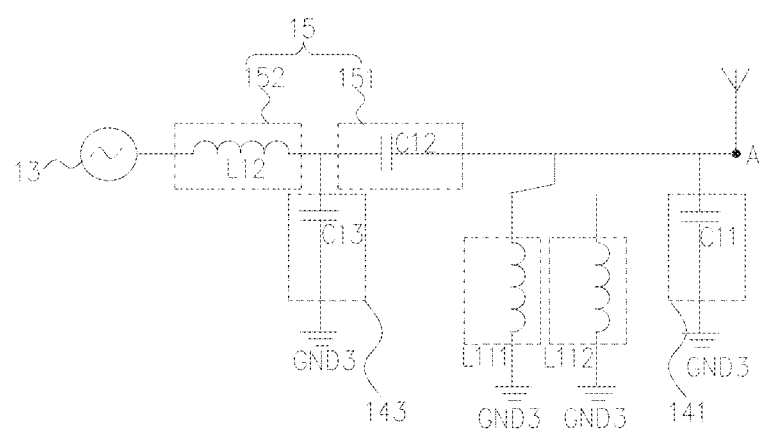
FIG. 20 is a detailed structural schematic diagram of a first matching module in FIG. 3.

For example, as illustrated in FIG. 20, the adjustable branch T is a part of the second branch 15. Specifically, the adjustable branch T includes a switch and multiple inductors, where the multiple inductors are connected in parallel and have different inductance.

Figure 21:
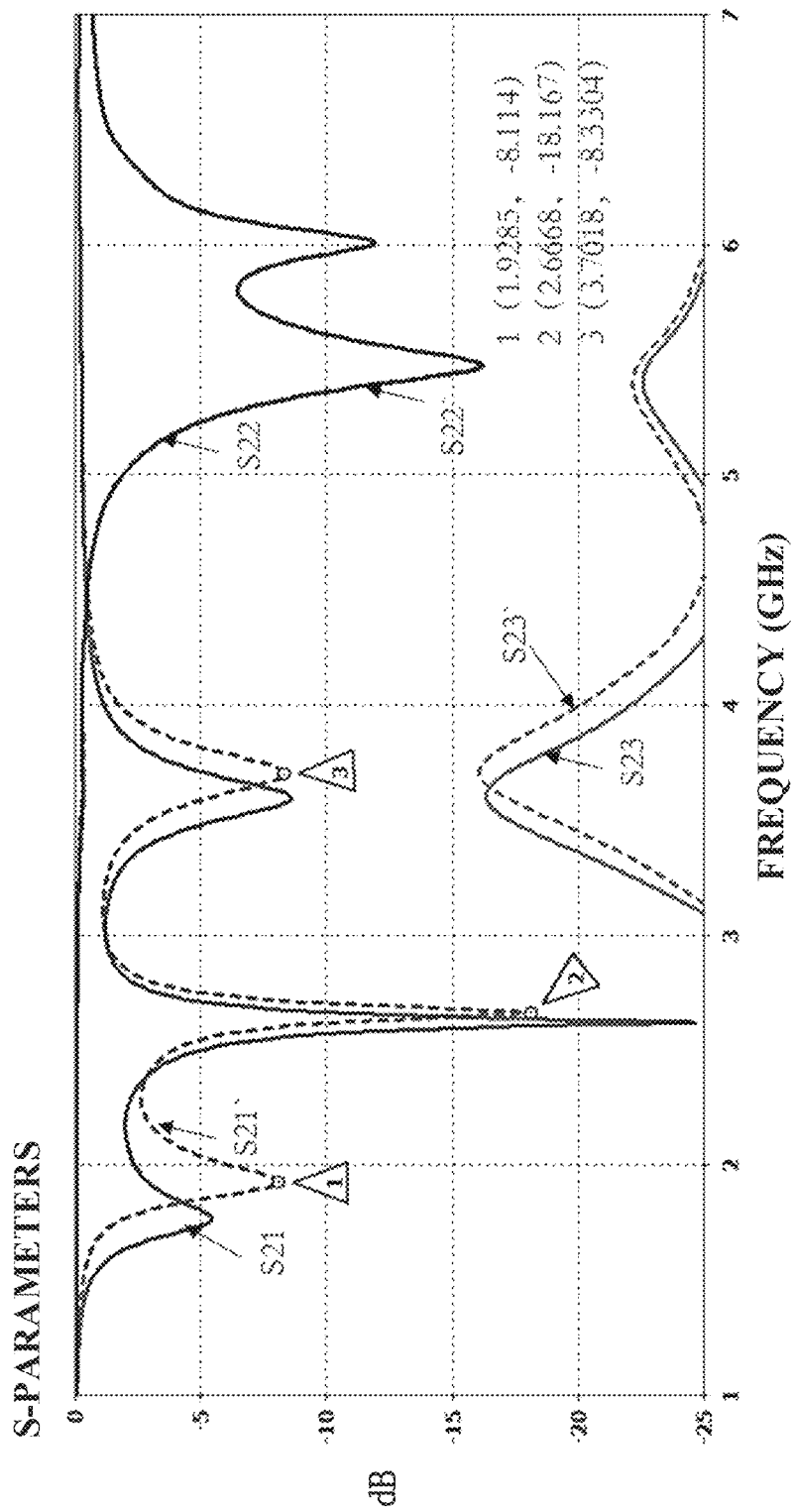
FIG. 21 is a schematic graph illustrating comparison between S-parameters of the antenna assembly illustrated in FIG. 3 and S-parameters of the antenna assembly illustrated in FIG. 19.

As illustrated in FIG. 21, the inductance of L111 is 4.3 nH, and the inductance of L112 is 3 nH. The switch may be, but is not limited to, a single-pole multi-throw (SPMT) switch or a multi-pole multi-throw (MPMT) switch. As illustrated in FIG. 21, S21 is a curve of S-parameters of the first antenna unit 10 when the switch conducts the Llll to the first matching module M1; S21' is a S-parameters of the first antenna unit 10 when the switch conducts the L112 to the first matching module M1; S22 is a curve of S-parameters of the second antenna unit 20 when the switch conducts the L111 to the first matching module M1; S22' is a curve of S-parameters of the second antenna unit 20 when the switch conducts the L112 to the first matching module M1; S23 is a curve of isolation between the first antenna unit 10 and the second antenna unit 20 when the switch conducts the L111 to the first matching module M1; and S23' is a curve of isolation between the first antenna unit 10 and the second antenna unit 20 when the switch conducts the L112 to the first matching module M1.

When the switch conducts the L111 to the first matching module M1, the resonant frequency of the first resonant mode a is 1.77 GHZ, and the resonant frequency of the second resonant mode b is 3.6 GHz. When the switch conducts the L112 to the first matching module M1, the resonant frequency of the first resonant mode a is 1.92 GHZ, and the resonant frequency of the second resonant mode b is 3.7 GHZ.

When the first matching module M1 is provided with the adjustable branch T, in this embodiment, a position of the first feeding point A is further designed to make the adjustable branch T not affect or have less influence on the second resonant mode b, the fifth resonant mode d, and the third resonant mode e while tuning the first resonant mode a and the fourth resonant mode c. In this way, the first matching module M1 tunes the first resonant mode a and the fourth resonant mode c so as to enlarge a range of LTE-4G/NR5G frequency bands supported by the antenna assembly 100 and to improve the performance of each frequency band, and the antenna assembly 100 can be ensured to support a Wi-Fi 2.4G signal, a Wi-Fi 5G signal, and a Wi-Fi 6E signal.

According to the above analysis on wavelength modes of resonances of the second resonant mode b, the fifth resonant mode d, and the third resonant mode e on the first radiator 11 and the second radiator 21, it can be learned that, tuning at the first feeding point A has a relatively small influence on resonances of the second resonant mode b and the fifth resonant mode d, and has a relatively large influence on the resonance of the third resonant mode e.

For the third resonant mode e, the current density distribution of the first radiator 11 increases first, then decreases, and then increases from the first coupling end 112 to the first ground end 111 (for example, as illustrated in a dotted curve in FIG. 19), where a point with strong current of the first radiator 11 is about ⅓ of a length from the first coupling end 112 to the first ground end 111. A length between the first feeding point A and the first ground end 111 is ⅓ times to 1 time the length of the first radiator 11. Optionally, the first feeding point A is disposed at or near the point with strong current of the first radiator 11.

The first feeding point A is disposed at or near the point with strong current of the first radiator 11. The length between the first feeding point A and the first ground end 111 is ⅓ times to 1 time the length of the first radiator 11. Further, the length between the first feeding point A and the first coupling end 112 is about ⅓ times the length of the first radiator 11, so that the first feeding point A can be disposed at the point with strong current. When the first feeding point A is disposed at the point with strong current, the first matching module M1 is provided with the adjustable branch T, and the adjustable branch T has a relatively small influence on the third resonant mode e. When the first feeding point A is disposed at or near the position with strong current of the first radiator 11, and the L11 in the adjustable branch T is switched to the L12 in the adjustable branch T, a position of a resonant point of the fifth resonant mode d and a position of a resonant point of the third resonant mode e remain unchanged as illustrated in Figure. In this way, the range of LTE-4G/NR5G frequency bands supported by the antenna assembly 100 is increased, and the antenna assembly 100 can be ensured to support the Wi-Fi signal to make the antenna assembly 100 always support the LTE-4G/NR5G signal and the Wi-Fi signal.

In this embodiment, the second matching module M2 is disposed between the second feeding point B and the second feeding module 23, and the second matching module M2 is configured to select frequency bands from signals fed by the second feeding module 23. For example, the second matching module M2 selects a frequency band of 1 GHz to 7 GHz from RF signals transmitted from the second feeding module 23 and transmits the frequency band of 1 GHz to 7 GHz to the second feeding point B, or the second matching module M2 selects a frequency band of 4.5 GHz to 7 GHz from RF signals transmitted from the second feeding module 23 and transmits the frequency band of 4.5 GHz to 7 GHz to the second feeding point B. In addition, the second matching module M2 can also tune resonant modes supported by the second antenna unit 20 to make the antenna assembly 100 resonate at frequency bands needed to be supported, and can isolate resonant signals of the first antenna unit 10 to increase the isolation between the first antenna unit 10 and the second antenna unit 20.

The second matching module M2 will be specifically described below with reference to accompanying drawings.

Figure 22:
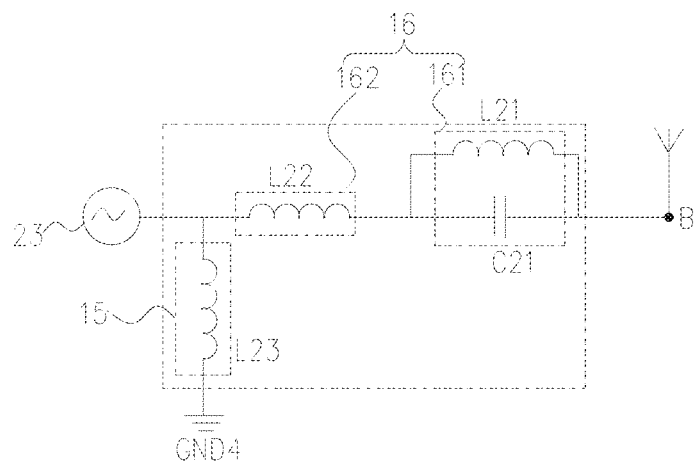
FIG. 22 is a schematic structural diagram of a second matching module illustrated in FIG. 3.

As illustrated in FIG. 22, the second matching module M2 includes at least one third branch 16 connected in parallel to the ground and/or at least one fourth branch 17 connected in series between the second feeding point B and the second feeding module 23. Each of the at least one third branch 16 and the at least one fourth branch 17 includes at least one of a capacitor or an inductor. The second matching module M2 is configured to allow frequency bands supported by the fifth resonant mode d and frequency bands supported by the third resonant mode e (for example, the Wi-Fi 5G frequency band) to pass, to block a frequency band less than both the frequency band supported by the fifth resonant mode d and the frequency band supported by the third resonant mode e (for example, a frequency band supported by the first antenna unit 10) to increase the isolation between the first antenna unit 10 and the second antenna unit 20, and to tune the resonant frequency of the fifth resonant mode d and/or the resonant frequency of the third resonant mode e to make both the fifth resonant mode d and the third resonant mode e support the Wi-Fi 5G frequency band and the Wi-Fi 6E frequency band.

The third branch 16 includes, but is not limited to, at least one of a single-capacitor branch, a single-inductor branch, or frequency-selective filter circuits listed in FIG. 11 to FIG. 18.

The fourth branch 17 includes, but is not limited to, at least one of a single-capacitor branch, a single-inductor branch, or frequency-selective filter circuits listed in FIG. 11 to FIG. 18.

For example, as illustrated in FIG. 22, the at least one third branch 16 includes a sixth sub-branch 161 and a seventh sub-branch 162. One end of the sixth sub-branch 161 is electrically connected to the second feeding point B, and the other end of the sixth sub-branch 161 is electrically connected to one end of the seventh sub-branch 162. The sixth sub-branch 161 includes an inductor and a capacitor connected in parallel, where the inductor is marked as L21 and the capacitor is marked as C21.

The other end of the seventh sub-branch 162 is electrically connected to the second feeding module 23. The seventh sub-branch 162 includes a capacitor, or an inductor, or an inductor and a capacitor connected in parallel. In this embodiment, the seventh sub-branch 162 is an inductor, and the inductor is marked as L22.

As illustrated in FIG. 22, the at least one fourth branch 17 includes an eighth sub-branch. One end of the eighth sub-branch is electrically connected to the second feeding module 23, and the other end of the eighth sub-branch is electrically connected to the fourth reference ground GND4. The eighth sub-branch includes at least one of a capacitor or an inductor. In this embodiment, the eighth sub-branch is an inductor, and the inductor is marked as L23.

The above is merely an example of an embodiment of the second matching module M2, and in other embodiments, a branch may be additionally disposed between the sixth sub-branch 161 and the second feeding point B.

The sixth sub-branch 161 (namely, L21 and C21) and the seventh sub-branch 162 (namely, L22) are configured to block the Wi-Fi 2.4G frequency band, a frequency band of the second resonant mode b, and a frequency band of the fourth resonant mode c, and to allow the Wi-Fi 5G frequency band and the Wi-Fi 6E frequency band to pass. For example, L21=13 nH, C21=0.3 pF, and L22=2.7 Nh. The sixth sub-branch 161 and the seventh sub-branch 162 have low-impedance or band-pass on the Wi-Fi 5G frequency band so as to allow the Wi-Fi 5G frequency band to pass, and can also effectively filter out a frequency band less than the Wi-Fi 5G frequency band so as to reduce the influence of a frequency band signal supported by the first antenna unit 10 on the second antenna unit 20. The eighth sub-branch L23 can tune the Wi-Fi 5G and isolate the frequency band supported by the first resonant mode a, so as to reduce the influence of a signal supported by the first antenna unit 10 on the second antenna unit 20. For example, L23=1.5 nH.

From a curve S2, 1 of isolation between the first antenna unit 10 and the second antenna unit 20 illustrated in FIG. 4, it can be seen that isolation values corresponding to 1 GHz to 3 GHz and 6 GHz to 7 GHz are below −25, and isolation values illustrated in the figure is also below −15, which indicates that the first antenna unit 10 has better isolation with the second antenna unit 20. The first matching module M1 and the second matching module M2 described above are designed to make the first antenna unit 10 have better isolation with the second antenna unit 20, so that efficiency of receiving/transmitting antenna signals of the first antenna unit 10 can be improved, and efficiency of receiving/transmitting antenna signals of the second antenna unit 20 can be improved. It can be seen from FIG. 4 that, after the first matching module M1 is provided with the adjustable branch T, the first antenna unit 10 still has better isolation with the second antenna unit 20.

The above is the antenna assembly 100 provided in a first type of embodiment. The antenna assembly 100 includes the first antenna unit 10 and the second antenna unit 20 coupled to the first antenna unit 10, so as to realize a co-aperture of LTE-4G/NR5G/Wi-Fi signals. The antenna assembly 100 supports multiple resonant modes at the same time, and realizes a relatively wide bandwidth design by a carrier-aggregation technology. Meanwhile, the antenna assembly 100 can support an LTE-4G/NR5G dual-connection technology. In the present disclosure, the length of the first radiator 11, the position of the first feeding point A, and the length of the second radiator 21 are reasonably designed, so as to make the first antenna unit 10 support MHB and UHB in the LTE-4G/NR5G frequency band, and the Wi-Fi 2.4G frequency band, and to make the second antenna unit 20 support the Wi-Fi 5G frequency band and the Wi-Fi 6E frequency band. The second antenna unit 20 can separately support the Wi-Fi frequency band without devices such as a combiner, so as to reduce losses of the second antenna unit 20 and to improve radiation efficiency of the antenna assembly 100.

The above antenna assembly 100 is disposed in the electronic device 1000, and the electronic device 1000 as a mobile phone is taken as an example. The present disclosure does not limit specific positions where radiators of the antenna assembly 100 are mounted on the electronic device 1000. Radiators of the antenna assembly 100 are integrated into the housing 200, or are disposed on a surface of the housing 200, or are disposed in the space enclosed by the housing 200.

Figure 23:
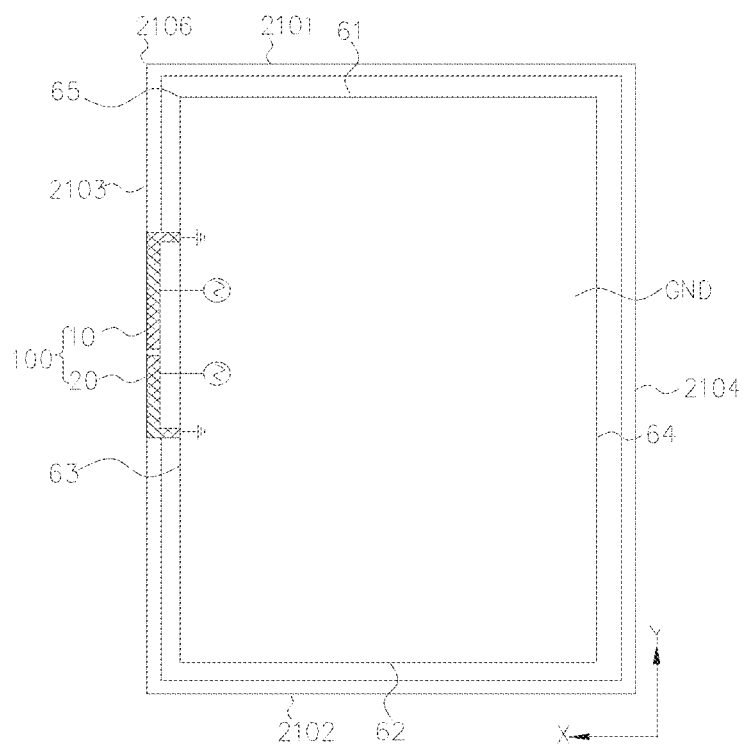
FIG. 23 is a first schematic structural diagram of an electronic device with the first type of antenna assembly illustrated in FIG. 3 mounted thereon.

As illustrated in FIG. 23, the electronic device 1000 includes a reference ground GND and a circuit board 500 (as illustrated in FIG. 2) that are disposed in the housing 200. The reference ground GND includes, but is not limited to, an alloy on the middle plate 410. The reference ground GND includes the first reference ground GND1, the second reference ground GND2, the third reference ground GND3, the fourth reference ground GND4, the fifth reference ground GND5, the sixth reference ground GND6, and the seventh reference ground GND7.

The first feeding module 13, the second feeding module 23, the first matching module M1, and the second matching module M2 are all disposed on the circuit board 500.

The first radiator 11 and the second radiator 21 may be integrated into the housing 200, or may be disposed on the surface of the housing 200, or may be disposed in the space enclosed by the housing 200.

Optionally, at least a part of the first radiator 11 and a part of the second radiator 21 are integrated into the frame 210 of the housing 200. For example, the frame 210 is made of metal. The first radiator 11 and the second radiator 21 are integrated with the frame 210. The first coupling gap 140 between the first radiator 11 and the second radiator 21 is filled with an insulating material. Certainly, in other embodiments, the first radiator 11 and the second radiator 21 may also be integrated with the back cover 220. In other words, the first radiator 11 and the second radiator 21 are integrated as a part of the housing 200.

Optionally, the first radiator 11 and the second radiator 21 are formed on a surface of the frame 210 (for example, an inner surface or an outer surface of the frame 210). Specifically, the first radiator 11 and the second radiator 21 are basically formed on the inner surface of the frame 210 by, including but not limited to, patch radiators, laser direct structuring (LDS), print direct structuring (PDS), or the like. In this embodiment, a material of the frame 210 may be a non-conductive material (for the electromagnetic wave signal, an unshielded material is used or a transparent structure is set). Certainly, the first radiator 11 and the second radiator 21 may also be disposed on the surface of the back cover 220.

Optionally, the first radiator 11 and the second radiator 21 are disposed on a flexible printed circuit board (FPCB), a rigid circuit board, or other carrier boards. The first radiator 11 and the second radiator 21 may be integrated into the FPCB, and the FPCB is attached to the inner surface of the middle frame 420 by an adhesive. In this embodiment, the material of the frame 210 may be the non-conductive material. Certainly, the first radiator 11 and the second radiator 21 may also be disposed on the inner surface of the back cover 220.

The above is a specific structure of the antenna assembly 100 for detecting the approach of the subject to-be-detected and transmitting antenna signals, and installation positions of each device in the antenna assembly 100 on the electronic device 1000. Certainly, the antenna assembly 100 may be implemented as one or more antenna assemblies 100 in the present disclosure.

The present disclosure does not limit specific sides of the electronic device 1000 where the antenna assembly 100 may be positioned. The reference ground GND is in the shape of a rectangular plate. The reference ground GND includes multiple sides connected in sequence, and a junction between two adjacent sides is a corner.

The first radiator 11 and the second radiator 21 of the at least one antenna assembly 100 are disposed facing two intersecting sides and the corner; and/or both the first radiator 11 and the second radiator 21 of the at least one antenna assembly 100 are disposed facing one side. Specific examples are illustrated by the following embodiments.

As illustrated in FIG. 23, the reference ground GND includes a first side 61, a second side 62 disposed opposite to the first side 61, a third side 63 connected between the first side 61 and the second side 62, and a fourth side 64 connected between the first side 61 and the second side 62. A corner 65 is formed at a junction between two adjacent sides. Taking a state where a user holds and uses the electronic device 1000 in portrait mode as a reference, the first side 61 is a top side of the reference ground GND, and the second side 62 is a bottom side of the reference ground GND.

As illustrated in FIG. 23, the frame 210 includes multiple side frames connected end to end. Among multiple side frames of the frame 210, two adjacent side frames intersect, for example, two adjacent side frames are transitionally connected through a circular arc chamfer. Multiple side frames each includes a top frame 2101, a bottom frame 2102 disposed opposite to the top frame 2101, a first side frame 2103 connected between the top frame 2101 and the bottom frame 2102, and a second side frame 2104 connected between the top frame 2101 and the bottom frame 2102. When the user holds and uses the electronic device 1000 towards the front of the electronic device 1000, the top frame 2101 is a side away from the ground, and the bottom frame 2102 is a side close to the ground. A corner portion 2106 is formed at the junction between two adjacent side frames. The top frame 2101 is parallel to and equal to the bottom frame 2102, the first side frame 2103 is parallel to and equal to the second side frame 2104, and a length of the first side frame 2103 is greater than a length of the top frame 2101. The top frame 2101 is disposed facing the first side 61, the bottom frame 2102 is disposed facing the second side 62, the first side frame 2103 is disposed facing the third side 63, and the second side frame 2104 is disposed facing the fourth side 64.

The antenna assembly 100 is disposed on at least one of the top frame 2101, the first side frame 2103, the second side frame 2104, or the bottom frame 2102.

As illustrated in FIG. 23, one antenna assembly 100 is provided in one embodiment. The first radiator 11 and the second radiator 21 of the antenna assembly 100 are integrated with the first side frame 2103. The first coupling gap 140 is close to or defined at the middle of the first side frame 2103.

Figure 24:
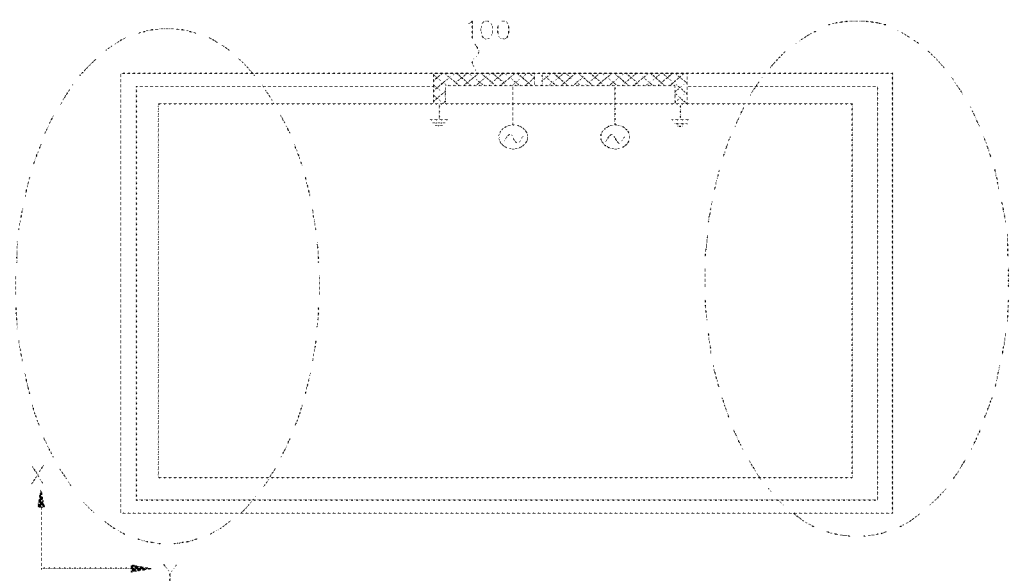
FIG. 24 is a structural schematic diagram of the electronic device illustrated in FIG. 3 in landscape mode.

As illustrated in FIG. 24, dotted boxes on both sides in FIG. 24 represent holding areas of fingers. When the user holds the electronic device 1000 in landscape mode (for example, playing a game or watching a video in landscape mode), holding areas of user's hands are relatively far away from the middle of the first side frame 2103, and the first coupling gap 140 is far away from holding areas of user's hands. When the user's fingers get closer to a strong electric-field point (namely, the first coupling gap 140) of the antenna assembly 100, an interference impact on the antenna assembly 100 will be greater. Therefore, the antenna assembly 100 is disposed on the first side frame 2103, and the first coupling gap 140 is disposed far away from holding areas when the user holds the electronic device 1000 in landscape mode, so that the first coupling gap 140 can be far away from user's fingers when the user holds the electronic device 1000 in landscape mode to play a game or the like, to avoid being blocked. Optionally, a distance between the first coupling gap 140 and the top frame 2101 or and the bottom frame 2102 is greater than or equal to 40 mm, so that the first antenna unit 10 and the second antenna unit 20 still have higher radiation efficiency, and user's experience with the electronic device 1000 can be improved.

Figure 25:
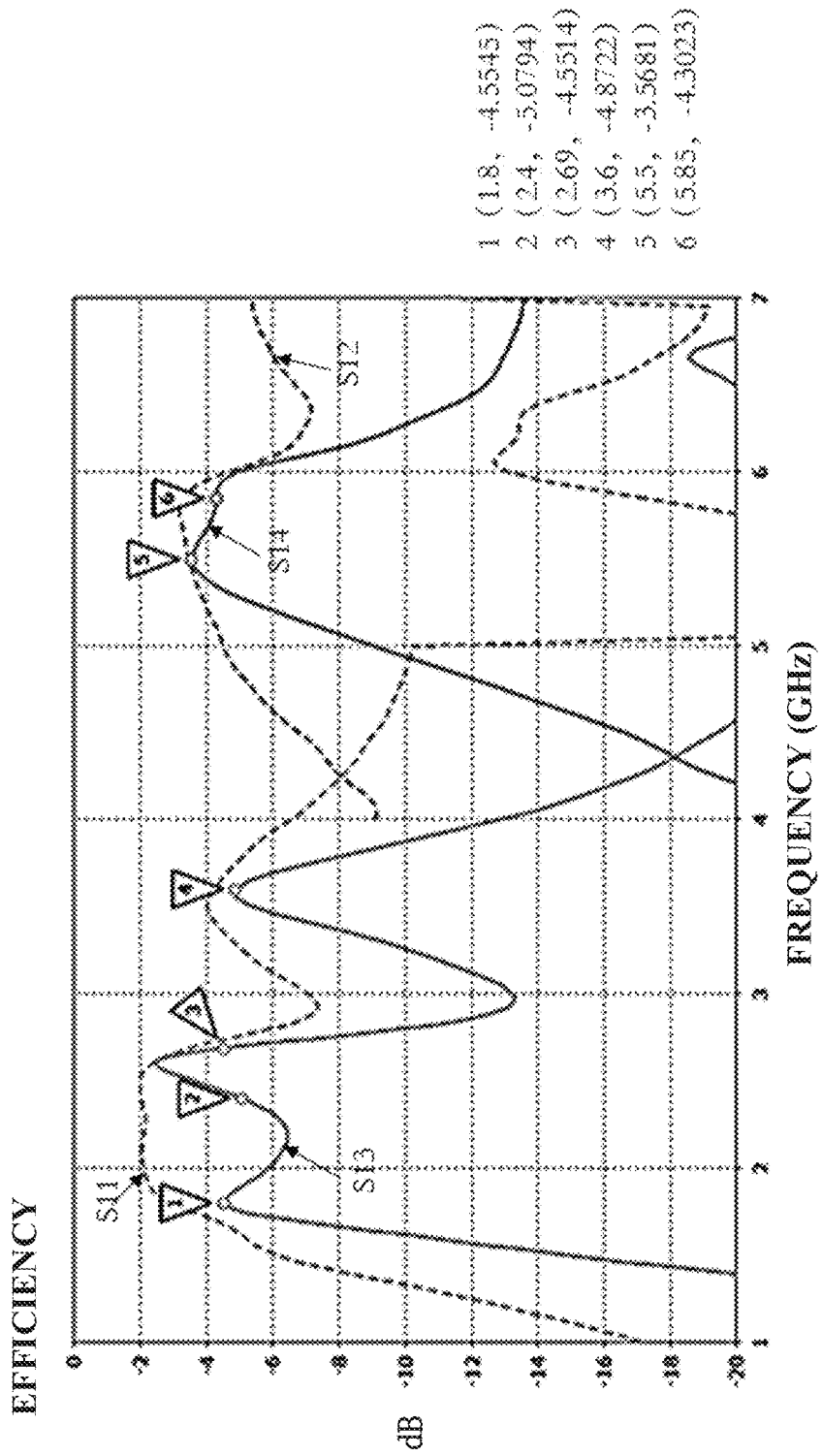
FIG. 25 is a schematic graph illustrating efficiency of the first type of antenna assembly illustrated in FIG. 3.

FIG. 25 is a schematic graph illustrating the efficiency of the antenna assembly disposed on the side of the electronic device 1000. As illustrated in FIG. 25, S11 illustrates system radiation efficiency of the first antenna unit 10, S12 illustrates system radiation efficiency of the second antenna unit 20, S13 illustrates overall system efficiency of the first antenna unit 10, and S14 illustrates overall system efficiency of the second antenna unit 20. The antenna unit 100 has a relatively bad radiation environment due to small clearance areas at sides, but it can be seen from reference signs 1 to 6 in FIG. 25 that, the antenna unit 100 still has relatively high efficiency in frequency bands supported by the first resonant mode a to the third resonant mode e (for example, lines over −6 dB in FIG. 25 are taken as reference lines with higher efficiency), so as to satisfy application of the antenna assembly 100 in the electronic device 1000.

Figure 26:
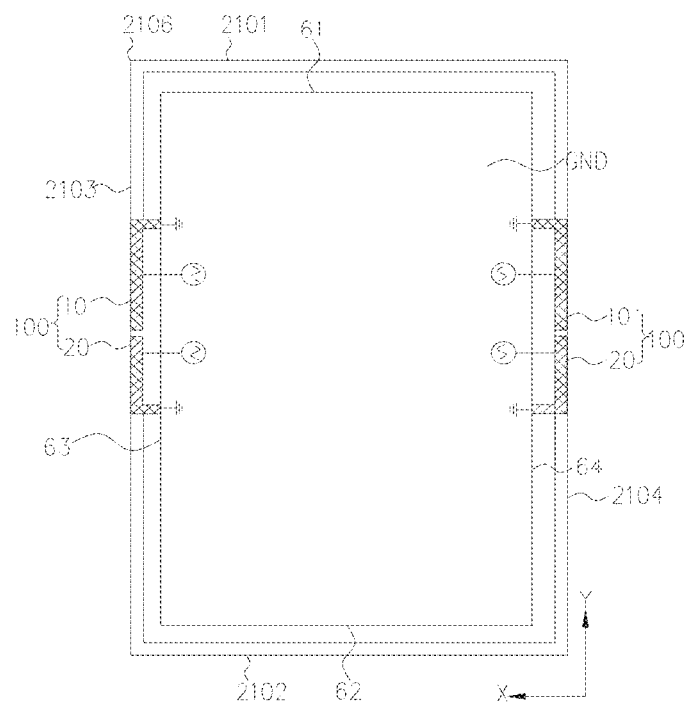
FIG. 26 is a second schematic structural diagram of the electronic device with the first type of antenna assembly illustrated in FIG. 3 mounted thereon.

Certainly, as illustrated in FIG. 26, multiple antenna assemblies 100 are provided in other embodiments, for example, one antenna assembly 100 is disposed at the first side frame 2103 and the other antenna assembly 100 is disposed at the second side frame 2104. Structures of two antenna assemblies 100 and frequency bands supported by two antenna assemblies 100 can be the same or different. When each of two antenna assemblies 100 has a coupling gap, a coupling gap of one antenna assembly 100 is disposed at or near the middle of the first side frame 2103, and a coupling gap of the other antenna assembly 100 is disposed at or near the middle of the second side frame 2104, so as to avoid from blocking the antenna assemblies 100 when the user holds the electronic device 1000 in landscape mode, and to reduce the influence on the efficiency of two antenna assemblies 100. Meanwhile, two antenna assemblies 100 can be switched to each other, so that the electronic device 1000 can perform communication in more frequency bands or with wider bandwidth, thereby improving communication quality of the electronic device 1000.

Figure 27:
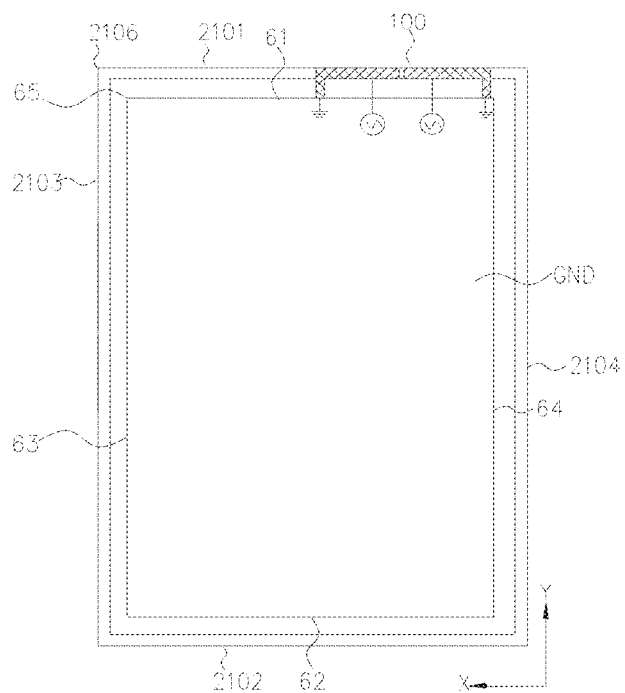
FIG. 27 is a third schematic structural diagram of the electronic device with the first type of antenna assembly illustrated in FIG. 3 mounted thereon.

Certainly, as illustrated in FIG. 27, in other embodiments, the first radiator 11 and the second radiator 21 of the antenna assembly 100 may also be integrated at the top frame 2101 and closer to the corner, or may also be integrated at any position of the electronic device 1000.

It can be seen from the described embodiments that, in the present disclosure, the electronic device 1000 has higher radiation performance in landscape mode, and LTE-4G/NR5G/Wi-Fi frequency bands exist simultaneously.

Figure 28:
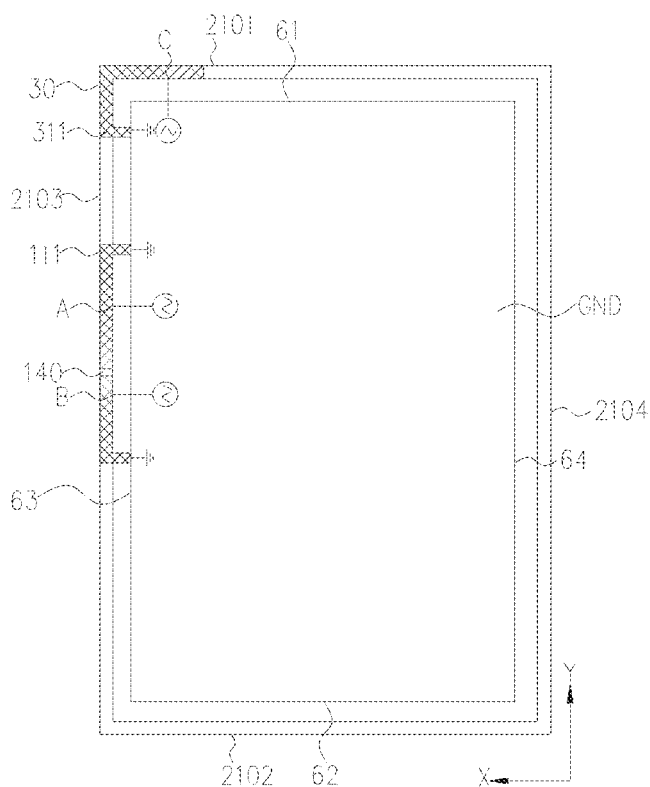
FIG. 28 is a first schematic structural diagram of an electronic device with a second type of antenna assembly mounted thereon provided in embodiments of the present disclosure.
Figure 29:
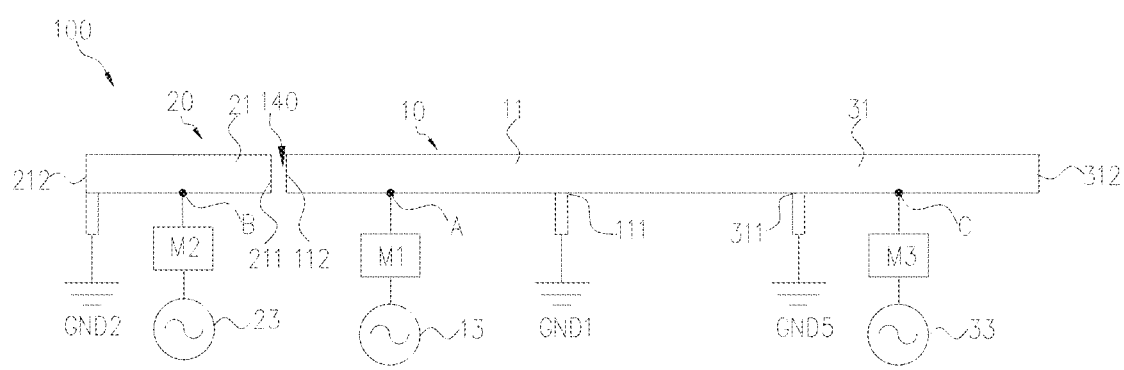
FIG. 29 is a schematic structural diagram of the second type of antenna assembly provided in embodiments of the present disclosure.

The antenna assembly 100 provided in a second type of embodiment of the present disclosure is described below with reference to accompanying drawings. The antenna assembly 100 provided in this embodiment includes the antenna assembly 100 provided in the first type of embodiment. The difference lies in that, as illustrated in FIG. 28 and FIG. 29, the antenna assembly 100 provided in this embodiment further includes a third radiator 31, a third feeding module 33, and a third matching module M3. To facilitate functional division of different parts of the antenna assembly 100 for subsequent descriptions, the third radiator 31, the third feeding module 33, and the third matching module M3 are defined as a third antenna unit 30. The third radiator 31 includes a third ground end 311, a first free end 312, and a third feeding point C between the third ground end 311 and the first free end 312. The third ground end 311 is spaced apart from the first ground end 111 or is connected to the first ground end 111 via a conductor. The third ground end 311 is electrically connected to the fifth reference ground GND5. The third feeding module 33 is electrically connected to the third feeding point C. The third matching module M3 is electrically connected between the third feeding point C and the third feeding module 33. Certainly, in other embodiments, positions of the first antenna unit 10 and the second antenna unit 20 may be interchanged.

Figure 30:
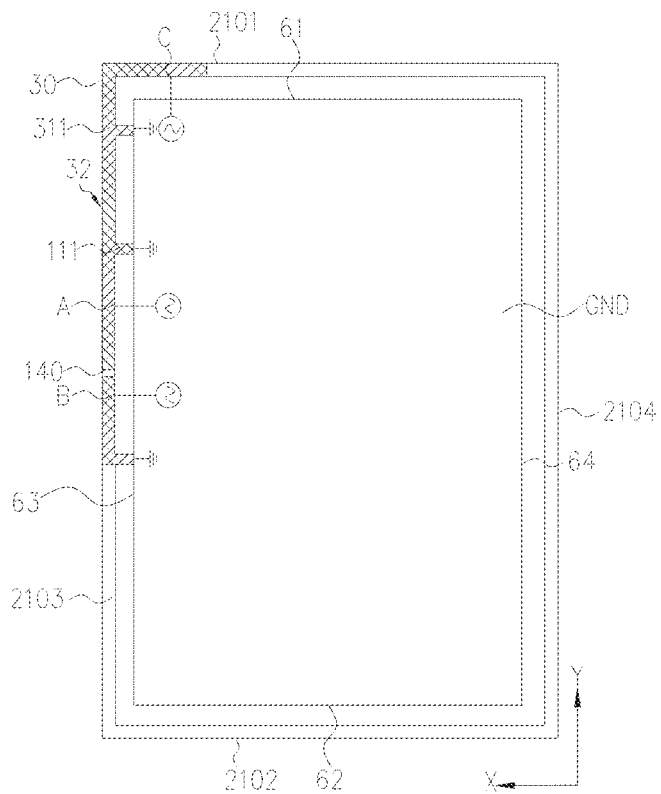
FIG. 30 is a second schematic structural diagram of the electronic device with the second type of antenna assembly illustrated in FIG. 29 mounted thereon.

Optionally, references are made to FIG. 28 and FIG. 30, the first radiator 11 and the second radiator 12 are disposed on the first side frame 2103, so that the first coupling gap 140 is far away from the user's hands to increase the radiation efficiency of the electronic device 1000 when the electronic device 1000 is used in landscape mode. The third radiator 31 is disposed at the corner portion 2106 between the first side frame 2103 and the top frame 2101. The corner portion 2106 has a relatively good clearance area, and the corner portion 2106 can more easily excite higher reference ground current, so that radiation efficiency of the third antenna unit 30 can be improved. The present disclosure does not limit frequency bands supported by the third antenna unit 30. Optionally, the third antenna unit 30 may support (GPS-L1)+(WI-FI 2.4G)+(LTE/NR-MHB+UHB). The structure and size of the third antenna unit 30 may refer to the structure and size of the first antenna unit 10.

Optionally, as illustrated in FIG. 30, a conductor is additionally disposed between the first ground end 111 and the third ground end 311 to connect the first radiator 11 and the third radiator 31. Further, when the first radiator 11, the second radiator 21, and the third radiator 31 are all integrated on the frame 210, the first radiator 11 may be integrated with the third radiator 31, that is, a part of the frame 210 is used as the first radiator 11, and a part of the frame 210 is used as the third radiator 31. In other words, the first radiator 11 and the third radiator 31 form a sharing radiator 32.

Figure 31:
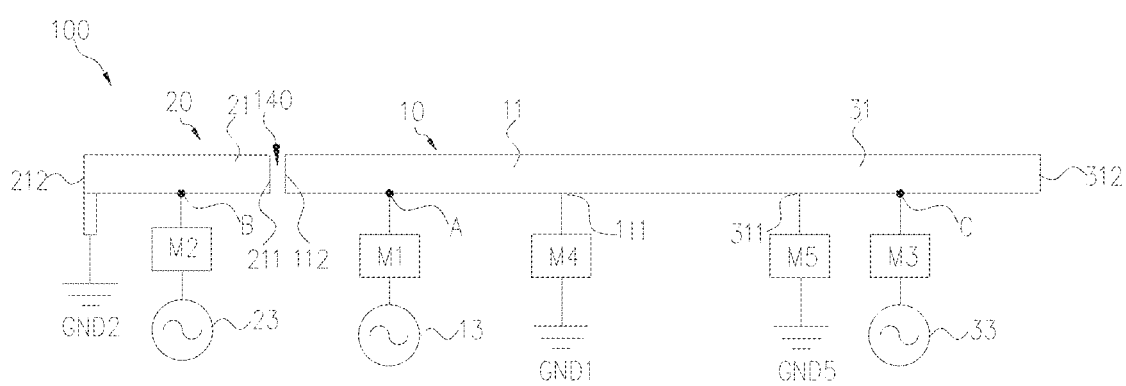
FIG. 31 is a schematic structural diagram illustrating improvement of the second type of the antenna assembly illustrated in FIG. 29.

Optionally, as illustrated in FIG. 31, the antenna assembly 100 further includes a fourth matching module M4. One end of the fourth matching module M4 is electrically connected to the first ground end 111, and the other end of the fourth matching module M4 is electrically connected to the first reference ground GND1. The fourth matching module M4 has low impedance on frequency bands supported by resonant modes (for example, the first resonant mode a) whose resonant current needs to return to the ground at the first ground end 111 in the first antenna unit 10 and the second antenna unit 20. For example, the fourth matching module M4 is an inductor, so that resonant current of resonant modes that needs to return to the ground at the first ground end 111 can return to the ground.

Optionally, as illustrated in FIG. 31, the antenna assembly 100 further includes a fifth matching module M5. One end of the fifth matching module M5 is electrically connected to the third ground end 311, and the other end of the fifth matching module M5 is electrically connected to the fifth reference ground GND5. The fifth matching module M5 has low impedance on frequency bands supported by resonant modes (for example, the third resonant mode e) whose resonant current needs to return to the ground at the first ground end 111 in the third antenna unit 30. For example, the fifth matching module M5 is an inductor, so that resonant current of resonant modes that needs to return to the ground at the first ground end 111 in the third antenna unit 30 can return to the ground.

In this embodiment, the antenna assembly 100 includes the fourth matching module M4 and the fifth matching module M5. In other embodiments, the antenna assembly 100 may only include the fourth matching module M4, or only include the fifth matching module M5.

Figure 32:
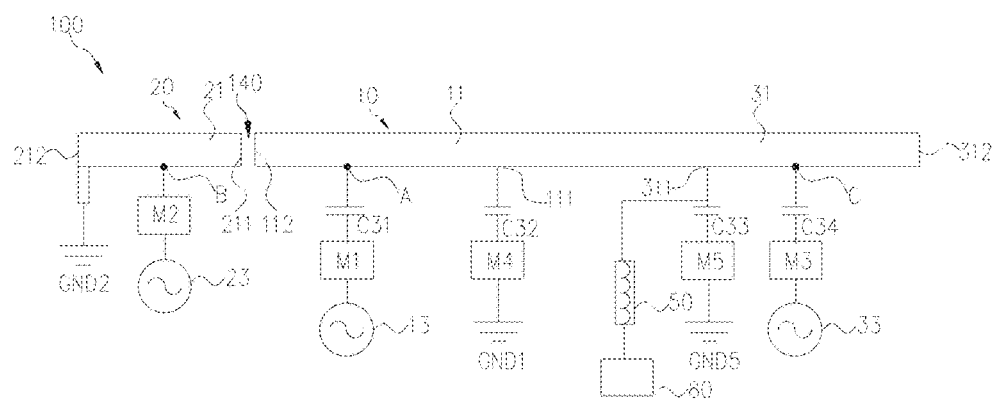
FIG. 32 is a schematic structural diagram of the second type of antenna assembly illustrated in FIG. 29 integrated with proximity detection.

As illustrated in FIG. 32, the first radiator 11 is electrically connected to the third radiator 31, and combination of the first radiator 11 and the third radiator 31 is defined as the sharing radiator 32. When the sharing radiator 32 is used as a sensing electrode for detecting the approach of the subject to-be-detected (for example, human's head, hands, or the like), the fourth matching module M4 includes a capacitive device directly electrically connected to the first ground end 111, or a capacitive device disposed between the fourth matching module M4 and the first ground end 111. The fifth matching module M5 includes a capacitive device directly electrically connected to the third ground end 311, or a capacitive device disposed between the fifth matching module M5 and the third ground end 311. The first matching module M1 includes a capacitive device directly electrically connected to the first feeding point A, or a capacitive device disposed between the first feeding point A and the first matching module M1. The third matching module M3 includes a capacitive device directly electrically connected to the third feeding point C, or a capacitive device disposed between the third feeding point C and the third matching module M3. The capacitive device, such as a capacitor or a circuit including a capacitor, makes the sharing radiator 32 in a "floating state" relative to direct current, so as to avoid an antenna signal from being interrupted by a sensing signal generated in response to the approach of the subject to-be-detected.

Optionally, each of the fourth matching module M4 and the fifth matching module M5 includes a switch selection circuit, for example, an inductor branch and a capacitor branch that are connected in parallel. When the sharing radiator 32 needs to detect approach of a human body, a switch can be controlled to conduct the capacitor to the first ground end 111. When the sharing radiator 32 does not need to detect the approach of the human body, the switch can be controlled to conduct the inductor to the first ground end 111.

Optionally, each of the fourth matching module M4 and the fifth matching module M5 further includes a capacitor branch and an inductor branch. The capacitor is electrically connected between the first ground end 111 and the inductor, and the capacitor enables the sharing radiator 32 to be in the "floating state" relative to the DC. Both the capacitor branch and the inductor branch have low impedance on frequency bands corresponding to resonant modes whose resonant current needs to return to the ground at the first ground end 111 and the third ground end 311.

As illustrated in FIG. 32, each of the fourth matching module M4 and the fifth matching module M5 is configured to block direct current and match, so that the sharing radiator 32 may be used for detecting a specific absorption rate (SAR). Optionally, a DC blocking capacitor C31 is additionally disposed before the first matching module M1, a DC blocking capacitor C32 is additionally disposed before the fourth matching module M4, a DC blocking capacitor C33 is additionally disposed before the fifth matching module M5, and a DC blocking capacitor C34 is additionally disposed before the third matching module M3, where all of DC blocking capacitors has a capacitance, for example, 22 pF, and has no impact on the antenna signal). If the first matching module M1 already includes a DC blocking capacitor, the DC blocking capacitor C31 does not need to be additionally disposed before the first matching module M1. If the fourth matching module M4 already includes a DC blocking capacitor, the DC blocking capacitor C32 does not need to be additionally disposed before the fourth matching module M4. If the fifth matching module M5 already includes a DC blocking capacitor, the DC blocking capacitor C33 does not need to be additionally disposed before the fifth matching module M5. If the third matching module M3 already includes a DC blocking capacitor, the DC blocking capacitor C34 does not need to be additionally disposed before the third matching module M3. In this case, the sharing radiator 32 is floating for the sensing signal, and a proximity sensor needs a floating metal body to sense capacitor changes caused by the approach of the human body, so as to achieve the purpose of detection. A detecting circuit is additionally disposed before the C33, and an inductor L is additionally disposed in the detecting circuit to block relatively high frequencies (for example, an inductance is 82 nH), so that the antenna is basically not affected. The detecting circuit may also be placed before C31/C32/C34 or at any position of an antenna radiator. Detecting the human body with the antenna radiator can be used to determine the approach of the human body, so as to intelligently reduce the SAR.

The above are embodiments in which the sharing radiator 32 is used as the sensing electrode, and in other embodiments, the second radiator 21 can also be used as the sensing electrode, which will be described in detail below by taking the antenna assembly 100 provided in a third type of embodiment as an example.

A specific structure of the antenna assembly 100 provided in the third type of embodiment provided in the present disclosure is illustrated below with reference to accompanying drawings.

Figure 33:
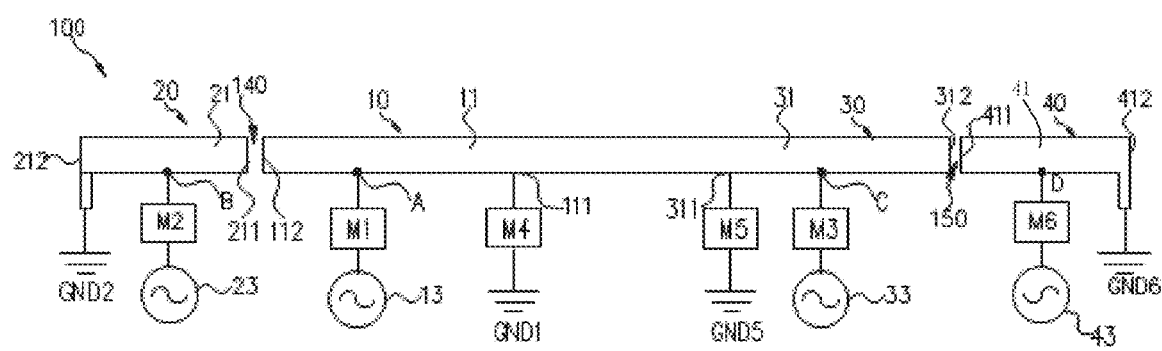
FIG. 33 is a schematic structural diagram of a third type of antenna assembly provided in embodiments of the present disclosure.

Optionally, as illustrated in FIG. 33, the antenna assembly 100 further includes a fourth radiator 41, a fourth feeding module 43, and a sixth matching module M6. To facilitate the functional division of different parts of the antenna assembly 100 for subsequent descriptions, the fourth radiator 41, the fourth feeding module 43, and the sixth matching module M6 are defined as a fourth antenna unit 40. The fourth radiator 41 includes a fourth ground end 412, a second free end 411, and a fourth feeding point D between the fourth ground end 412 and the second free end 411. A second coupling gap 150 is defined between the second free end 411 and the first free end 312. The third radiator 31 is coupled with the fourth radiator 41 through the second coupling gap 150. The fourth ground end 412 is electrically connected to the sixth reference ground GND6, the fourth feeding module 43 is electrically connected to the fourth feeding point D, and the sixth matching module M6 is electrically connected between the fourth feeding point D and the fourth feeding module 43.

In this embodiment, the third radiator 31 and the fourth radiator 41 are coupled to each other, so that excitation current flowing from the fourth feeding module 43 can not only resonate on the fourth radiator 41, but also resonate on the third radiator 31; and excitation current flowing from the third feeding module 33 can not only resonate on the third radiator 31, but also resonate on the fourth radiator 41. In this way, resonant modes generated by the third antenna unit 30 and the fourth antenna unit 40 are increased, and bandwidth supported by the third antenna unit 30 and the fourth antenna unit 40 and the number of frequency bands supported by the third antenna unit 30 and the fourth antenna unit 40 are increased.

Optionally, the third radiator 31 and the fourth radiator 41 may jointly serve as radiators of the third antenna unit 30, and the third radiator 31 and the fourth radiator 41 may also jointly serve as radiators of the fourth antenna unit 40. In this way, the third antenna unit 30 and the fourth antenna unit 40 can form a co-aperture antenna to realize the reuse of radiators, and the overlapping length of radiators of the third antenna unit 30 and the fourth antenna unit 40 is reduced while the number of resonant modes is increasing.

Optionally, the first radiator 11 is electrically connected to the third radiator 31. The first antenna unit 10, the second antenna unit 20, the third antenna unit 30, and the fourth antenna unit 40 form the co-aperture antenna.

In the antenna assembly 100 provided in this embodiment, resonant modes and resonant current of the first antenna unit 10 and the second antenna unit 20 may be referred to the antenna assembly 100 provided in the first type of embodiment, and details are not repeatedly described herein.

Figure 34:
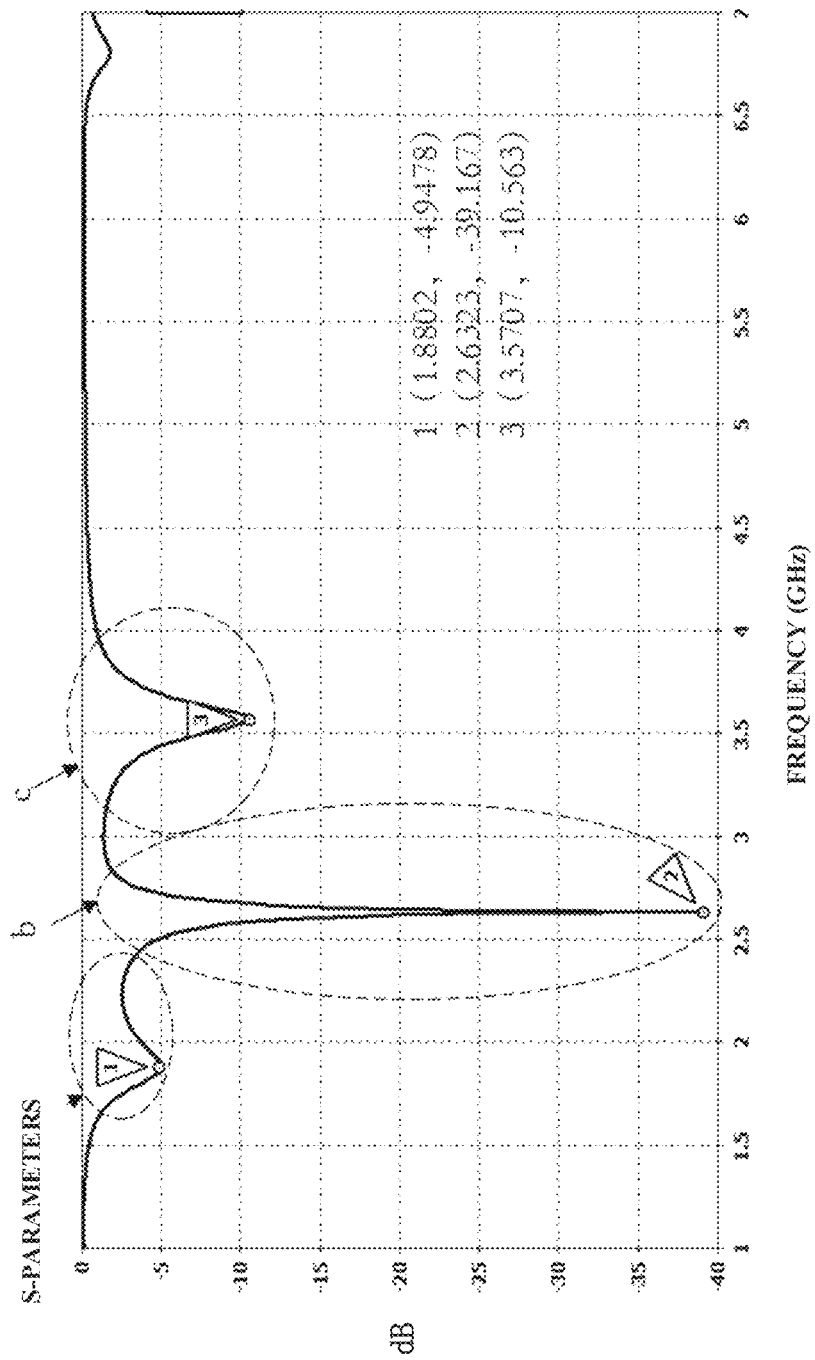
FIG. 34 is a schematic graph illustrating S-parameters of a first antenna unit of the antenna assembly illustrated in FIG. 33.

As illustrated in FIG. 34, which is a schematic graph illustrating S-parameters of the first antenna unit 10. As illustrated in FIG. 34, the resonant frequency of the first resonant mode a is 1.88 GHZ, the resonant frequency of the second resonant mode b is 2.6323 GHz, and the resonant frequency of the fourth resonant mode c is 3.5707 GHz.

Figure 35:
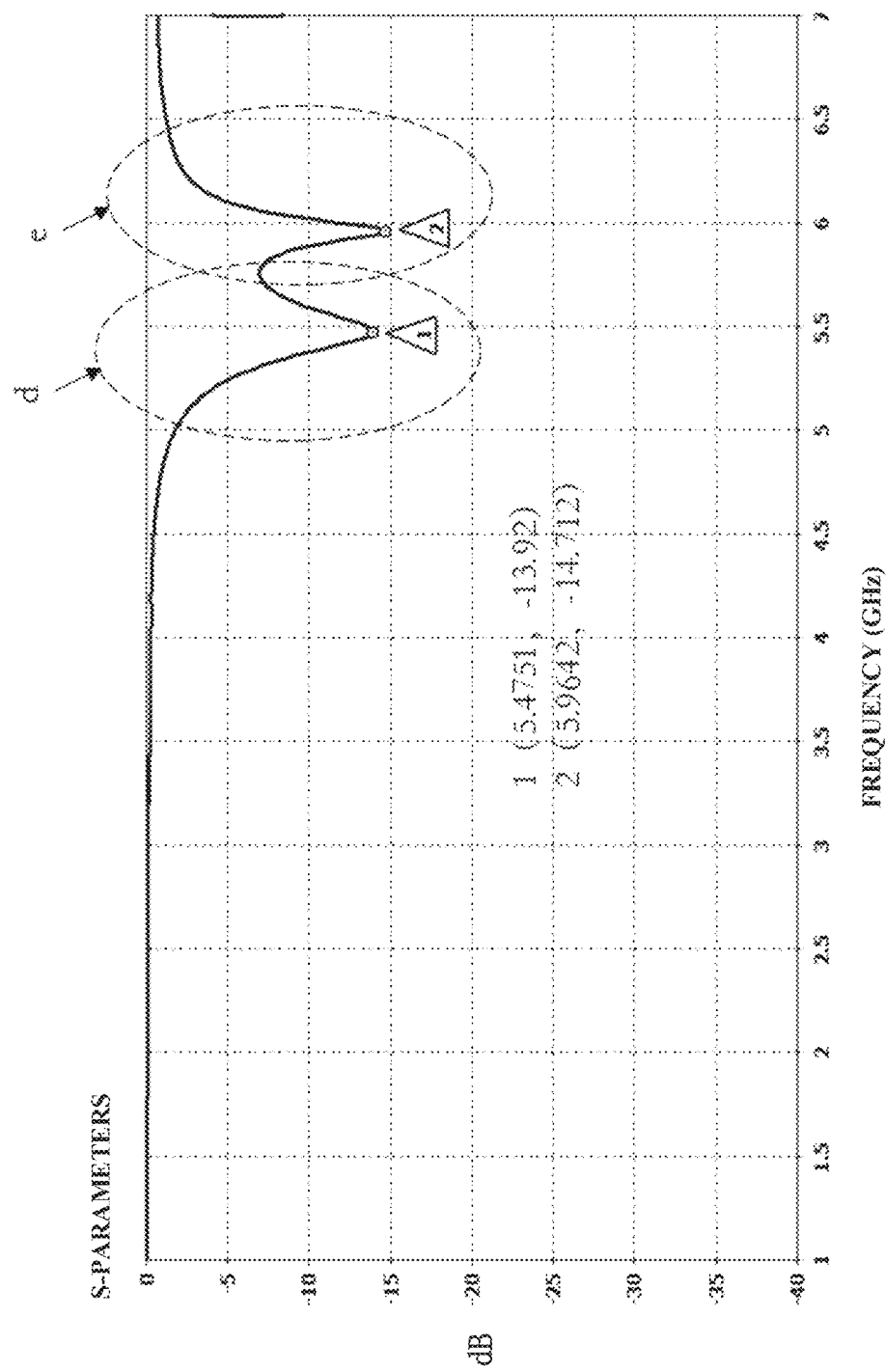
FIG. 35 is a schematic graph illustrating S-parameters of a second antenna unit of the antenna assembly illustrated in FIG. 33.

As illustrated in FIG. 35, which is a schematic graph illustrating S-parameters of the second antenna unit 20. As illustrated in FIG. 34, the resonant frequency of the fifth resonant mode d is 5.4751 GHZ, and the resonant frequency of the third resonant mode e is 5.9643 GHz.

Resonant modes and resonant current of the third antenna unit 30 and the fourth antenna unit 40 will be described below with reference to accompanying drawings.

Figure 36:
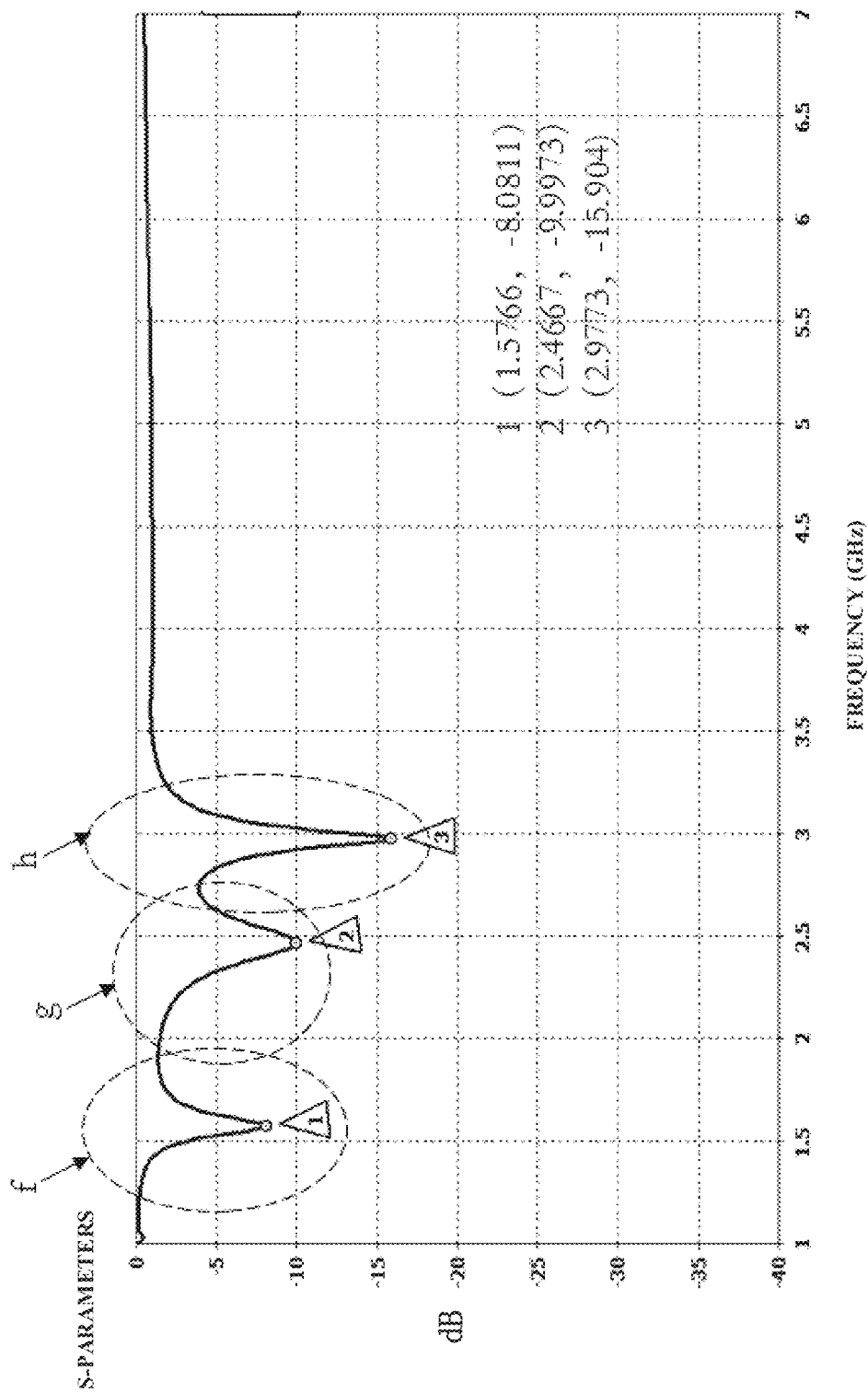
FIG. 36 is a schematic graph illustrating S-parameters of a third antenna unit of the antenna assembly illustrated in FIG. 33.

As illustrated in FIG. 36, the third antenna unit 30 is configured to support a sixth resonant mode f, a seventh resonant mode g, and an eighth resonant mode h.

Figure 37:
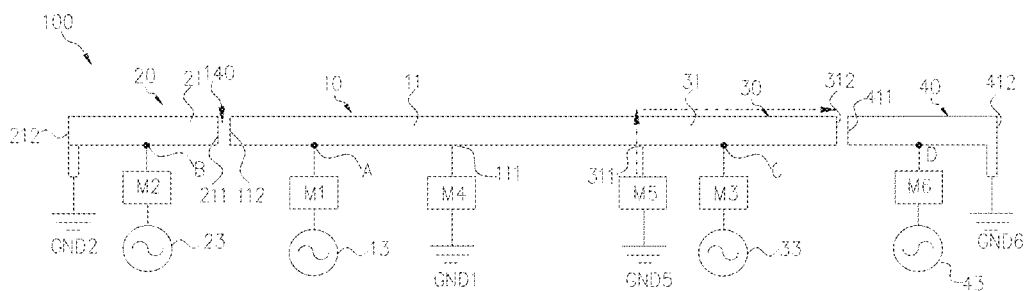
FIG. 37 is a schematic diagram illustrating the distribution of a sixth-resonant-current density of the antenna assembly illustrated in FIG. 33.

As illustrated in FIG. 37, sixth-resonant-current density of the sixth resonant mode f is mainly distributed between the third ground end 311 and the first free end 312, and sixth resonant current flows from the third ground end 311 to the first free end 312, or flows from the first free end 312 to the third ground end 311. It can be understood that, current density of the sixth resonant mode f is mainly distributed as described above, and a small amount of current density of the sixth resonant mode f is distributed on the fourth radiator 41.

The sixth resonant mode f is a ⅛ to ¼ wavelength mode caused by the excitation current of the third feeding module 33 resonating on the third radiator 31. Specifically, a length of the third radiator 31 is designed to be about ⅛ times to ¼ times a wavelength of the excitation current, in the medium, flowing from the third feeding module 33 to the third radiator 31, so that the sixth resonant mode f is excited on the third radiator 31, and higher radiation efficiency can be achieved in a frequency band supported by the sixth resonant mode f.

Generally, the length of the third radiator 31 is designed to be about ¼ times the wavelength of the excitation current, in the medium, flowing from the third feeding module 33 to the third radiator 31, so that the higher radiation efficiency is easily excited at a sixth resonant frequency point (a resonant frequency of the sixth resonant mode f). Further, the capacitive matching circuit connected to the ground is disposed on a path of the sixth resonant current, so as to feed the sixth resonant current to the third radiator 31 through capacitive coupling. The capacitive loading may enable the resonant frequency of the sixth resonant mode f to be shifted towards lower frequencies, so that the higher-efficiency resonance is not just generated when the length of the third radiator 31 is about ¼ wavelength, but also generated when the length of the third radiator 31 is in the range of the ⅛ to ¼ wavelength. Therefore, while the resonance is generated at the sixth resonant frequency point, the length of the third radiator 31 can also be shortened, for example, shortened to ⅛ times a wavelength corresponding to the sixth resonant frequency point, so as to further reduce the length of the third radiator 31 and to reduce the overlapping length of the antenna assembly 100.

Figure 38:
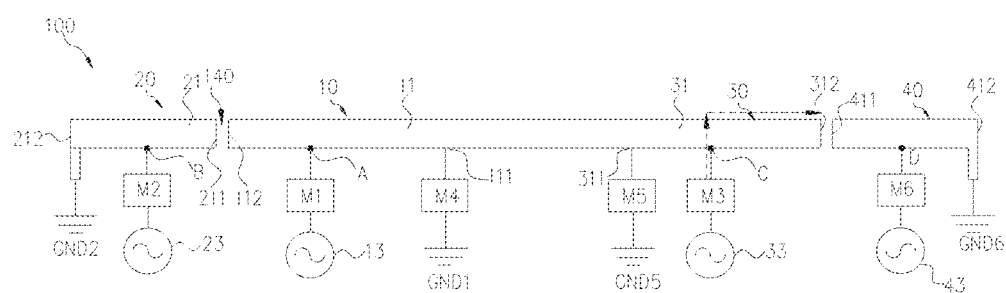
FIG. 38 is a schematic diagram illustrating the distribution of a seventh-resonant-current density of the antenna assembly illustrated in FIG. 33.

As illustrated in FIG. 38, seventh-resonant-current density of the seventh resonant mode g is mainly distributed between the third feeding point C and the first free end 312, and seventh resonant current flows from the third feeding point C to the first free end 312, or flows from the first free end 312 to the third feeding point C. It can be understood that, current density of the seventh resonant mode g is mainly distributed as described above, and a small amount of current density of the seventh resonant mode g is distributed between the third ground end 311 to the third feeding point C and distributed on the fourth radiator 41.

The seventh resonant mode g is a ⅛ to ¼ wavelength mode caused by the excitation current of the third feeding module 33 resonating between the third feeding point C and the first free end 312. Specifically, a length from the third feeding point C to the first free end 312 is designed to be about ⅛ times to ¼ times a wavelength of the excitation current, in the medium, flowing from the third feeding module 33 to the third feeding point C and the first free end 312, so that the seventh resonant mode g is excited between the third feeding point C and the first free end 312, and higher radiation efficiency can be achieved in a frequency band supported by the seventh resonant mode g.

Generally, the length from the third feeding point C to the first free end 312 is designed to be about ¼ times the wavelength of the excitation current, in the medium, between the third feeding point C and the first free end 312 flowing from the third feeding module 33, so that the higher radiation efficiency is easily excited at a seventh resonant frequency point (a resonant frequency of the seventh resonant mode g). Further, the capacitive matching circuit connected to the ground is disposed on a path of the seventh resonant current, so as to feed the seventh resonant current between the third feeding point C and the first free end 312 through capacitive coupling. The capacitive loading may enable the resonant frequency of the seventh resonant mode g to be shifted towards lower frequencies, so that the higher-efficiency resonance is not just generated when the length from the third feeding point C to the first free end 312 is about ¼ wavelength, but also generated when the length from the third feeding point C to the first free end 312 is in the range of the ⅛ to ¼ wavelength. Therefore, while the resonance is generated at the seventh resonant frequency point, the length from the third feeding point C to the first free end 312 can also be shortened, for example, shortened to ⅛ times a wavelength corresponding to the seventh resonant frequency point, so as to further reduce the length of the third radiator 31 and to reduce the overlapping length of the antenna assembly 100.

Figure 39:
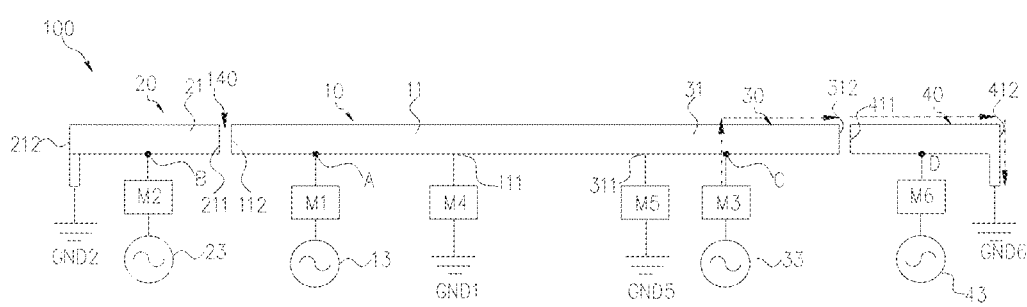
FIG. 39 is a schematic diagram illustrating the distribution of an eighth-resonant-current density of the antenna assembly illustrated in FIG. 33.

As illustrated in FIG. 39, eighth-resonant-current density of the eighth resonant mode h is mainly distributed between the third feeding point C and the fourth ground end 412. A direction of current flowing between the third feeding point C to the first free end 312 is the same as a direction of current between the second free end 411 to the fourth ground end 412. Eighth resonant current flows from the third feeding point C to the first free end 312, through the second coupling gap 150 to the second free end 411, and from the second free end 411 to the fourth ground end 412; or the eighth resonant current flows from the fourth ground end 412 to the second free end 411, through the second coupling gap 150 to the first free end 312, and from the first free end 312 to the third feeding point C. It can be understood that, current density of the eighth resonant mode h is mainly distributed as described above, and a small amount of current density of the eighth resonant mode h is distributed between the third ground end 311 and the third feeding point C.

The eighth resonant mode h is a ⅛ to ¼ wavelength mode caused by the excitation current of the third feeding module 33 resonating between the third feeding point C and the first free end 312, and is a ⅛ to ¼ wavelength mode caused by the excitation current of the third feeding module 33 resonating between the second free end 411 and the fourth ground end 412.

Generally, the length from the third feeding point C to the first free end 312 is designed to be about ¼ times a wavelength of the excitation current, in the medium, between the third feeding point C and the first free end 312 flowing from the third feeding module 33, and a length from the second free end 411 to the fourth ground end 412 is designed to be about ¼ times a wavelength of the excitation current, in the medium, between the second free end 411 and the fourth ground end 412 flowing from the third feeding module 33, so that the higher radiation efficiency is easily excited at an eighth resonant frequency point (a resonant frequency of the eighth resonant mode h). Further, the capacitive matching circuit connected to the ground is disposed between the third feeding point C and the first free end 312, and the capacitive matching circuit connected to the ground is disposed between the second free end 411 and the fourth ground end 412. The capacitive loading may enable the resonant frequency of the eighth resonant mode h to be shifted towards lower frequencies, so that the higher-efficiency resonance is not just generated when the length from the third feeding point C to the first free end 312 is about ¼ wavelength, but also generated when the length from the third feeding point C to the first free end 312 is in the range of the ⅛ to ¼ wavelength; and the higher-efficiency resonance is not just generated when the length from the second free end 411 to the fourth ground end 412 is about ¼ wavelength, but also generated when the length from the second free end 411 to the fourth ground end 412 is in the range of the ⅛ to ¼ wavelength. Therefore, while the resonance is generated at the eighth resonant frequency point, the length from the third feeding point C to the first free end 312 and the length of the fourth radiator 41 can also be shortened, for example, shortened to ⅛ times a wavelength corresponding to the eighth resonant frequency point, so as to further reduce the length of the third radiator 31 and the fourth radiator 41, and to reduce the overlapping length of the antenna assembly 100.

Figure 40:
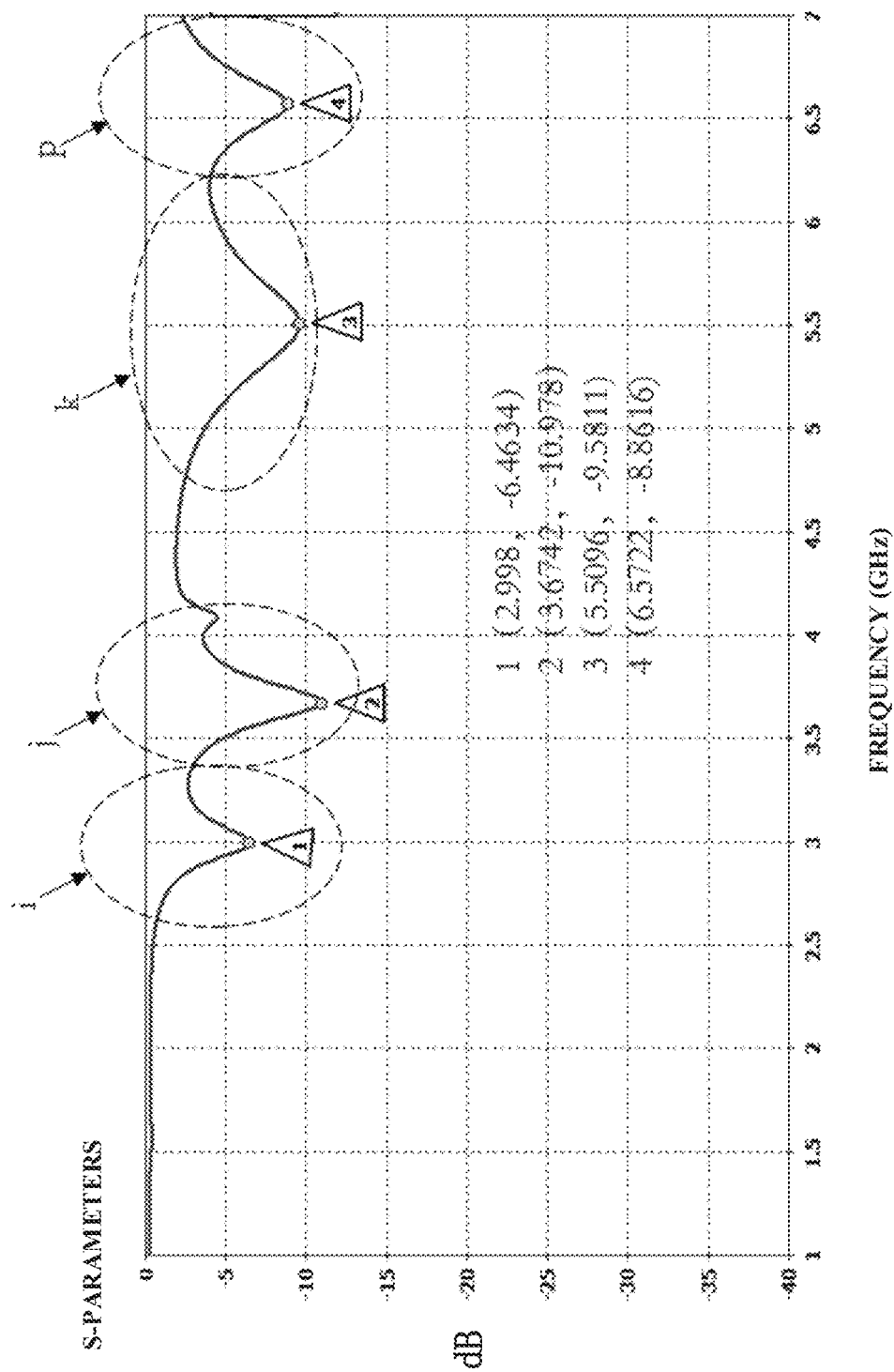
FIG. 40 is a schematic graph illustrating S-parameters of a fourth antenna unit of the antenna assembly illustrated in FIG. 33.

As illustrated in FIG. 40, the fourth antenna unit 40 is configured to support a ninth resonant mode i, a tenth resonant mode j, an eleventh resonant mode k, and a twelfth resonant mode p.

As illustrated in FIG. 39, the ninth resonant mode i is a ⅛ to ¼ wavelength mode caused by the excitation current of the third feeding module 33 resonating between the third feeding point C and the first free end 312, and is a ⅛ to ¼ wavelength mode caused by the excitation current of the third feeding module 33 resonating between the second free end 411 and the fourth ground end 412. For ninth-resonant-current density distribution of the ninth resonant mode i, reference may be made to the eighth resonant mode h distribution and the eighth-resonant-current-density distribution, and details are not repeatedly described herein.

Figure 41:
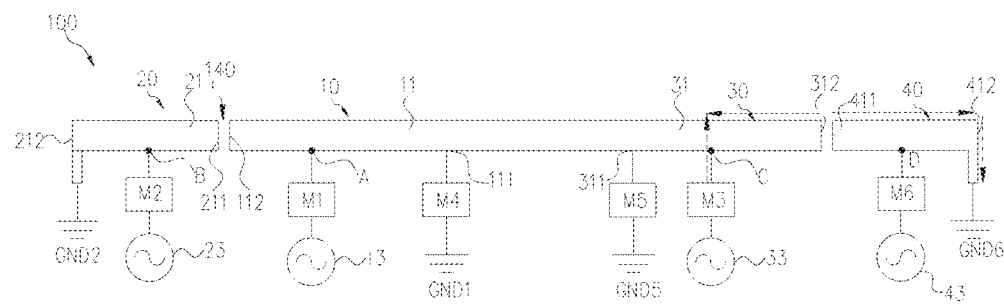
FIG. 41 is a schematic diagram illustrating the distribution of a tenth-resonant-current density of the antenna assembly illustrated in FIG. 33.

As illustrated in FIG. 41, tenth-resonant-current density of the tenth resonant mode j is mainly distributed between the third feeding point C and the fourth ground end 412. A direction of current between the third feeding point C and the first free end 312 and a direction of current between the second free end 411 and the fourth ground end 412 are opposite. A part of tenth resonant current flows from the third feeding point C to the first free end 312, and the other part of the tenth resonant current flows from the fourth ground end 412 to the second free end 411; or a part of the tenth resonant current flows from the first free end 312 to the third feeding point C, and the other part of the tenth resonant current flows from the second free end 411 to the fourth ground end 412. It can be understood that, current density of the tenth resonant mode j is mainly distributed as described above, and a small amount of current density of the tenth resonant mode j is distributed between the third grounding terminal 311 and the third feeding point C.

The tenth resonant mode j is a ⅛ to ¼ wavelength mode caused by the excitation current of the third feeding module 33 resonating between the third feeding point C and the first free end 312, and a ⅛ to ¼ wavelength mode caused by the excitation current of the third feeding module 33 resonating between the second free end 411 and the fourth ground end 412.

Generally, the length of the third feeding point C to the first free end 312 is designed to be about ¼ times a wavelength of the excitation current, in the medium, between the third feeding point C and the first free end 312 flowing from the third feeding module 33, and the length from the second free end 411 to the fourth ground end 412 is designed to be about ¼ times a wavelength of the excitation current, in the medium, between the second free end 411 and the fourth ground end 412 flowing from the third feeding module 33, so that the higher radiation efficiency is easily excited at a tenth resonant frequency point (a resonant frequency of the tenth resonant mode j). Further, the capacitive matching circuit connected to the ground is disposed between the third feeding point C and the first free end 312, and the capacitive matching circuit connected to the ground is disposed between the second free end 411 and the fourth ground end 412. The capacitive loading may enable the resonant frequency of the eighth resonant mode h to be shifted towards lower frequencies, so that the higher-efficiency resonance is not just generated when the length from the third feeding point C to the first free end 312 is about ¼ wavelength, but also generated when the length from the third feeding point C to the first free end 312 is in the range of the ⅛ to ¼ wavelength; and the higher-efficiency resonance is not just generated when the length from the second free end 411 to the fourth ground end 412 is about ¼ wavelength, but also generated when the length from the second free end 411 to the fourth ground end 412 is in the range of the ⅛ to ¼ wavelength. Therefore, while the resonance is generated at the tenth resonant frequency point, the length from the third feeding point C to the first free end 312 and the length of the fourth radiator 41 can also be shortened, for example, shortened to ⅛ times a wavelength corresponding to the tenth resonant frequency point, so as to further reduce the length of the third radiator 31 and the fourth radiator 41, and to reduce the overlapping length of the antenna assembly 100.

Figure 42:
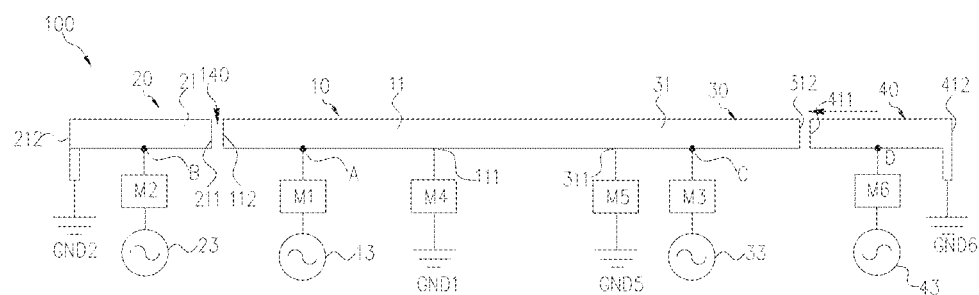
FIG. 42 is a schematic diagram illustrating the distribution of an eleventh-resonant-current density of the antenna assembly illustrated in FIG. 33.

As illustrated in FIG. 42, eleventh-resonant-current density of the eleventh resonant mode k is mainly distributed between the fourth feeding point D and the second free end 411, and eleventh resonant current flows from the fourth feeding point D to the second free end 411, or flows from the second free end 411 to the fourth feeding point D. It can be understood that, current density of the eleventh resonant mode k is mainly distributed as described above, and a small amount of current density of the eleventh resonant mode k is distributed between the fourth feeding point D and the second free end 411 and distributed on the first radiator 11.

Specifically, the eleventh resonant mode k is a ⅛ to ¼ wavelength mode caused by the excitation current (namely, the eleventh resonant current) of the fourth feeding module 43 resonating between the fourth feeding point D and the second free end 411. Specifically, a length from the fourth feeding point D to the second free end 411 is designed to be about ⅛ times to ¼ times a wavelength of the excitation current, in the medium, transmitted from the fourth feeding module 43 to the fourth radiator 41, so as to excite the eleventh resonant mode k between the fourth feeding point D and the second free end 411.

Generally, the length from the fourth feeding point D to the second free end 411 is designed to be about ¼ times the wavelength of the excitation current, in the medium, flowing from the fourth feeding module 43, so that the higher radiation efficiency is easily excited at an eleventh resonant frequency point (namely, a resonant frequency of the eleventh resonant mode k). Further, the capacitive matching circuit connected to the ground is disposed on a path of the eleventh resonant current, so as to feed the eleventh resonant current to the fourth radiator 41 through capacitive coupling. The capacitive loading may enable the resonant frequency of the eleventh resonant mode k to be shifted towards lower frequencies, so that the higher-efficiency resonance is not just generated when the length from the fourth feeding point D to the second free end 411 is about ¼ wavelength, but also generated when the length from the fourth feeding point D to the second free end 411 is in the range of the ⅛ to ¼ wavelength. Therefore, while the resonance is generated at the eleventh resonant frequency point, the length from the fourth feeding point D to the second free end 411 can also be shortened, for example, shortened to ⅛ times a wavelength corresponding to the eleventh resonant frequency point, so as to further reduce the length from the fourth feeding point D to the second free end 411 and to reduce the overlapping length of the antenna assembly 100.

Figure 43:
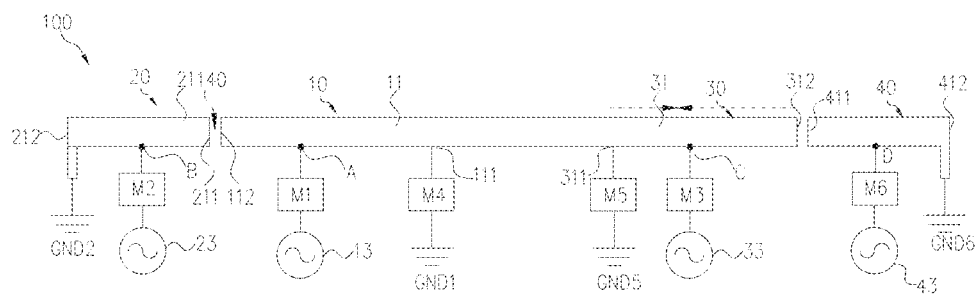
FIG. 43 is a schematic diagram illustrating the distribution of a twelfth-resonant-current density of the antenna assembly illustrated in FIG. 33.

As illustrated in FIG. 43, twelfth-resonant-current density of the twelfth resonant mode p is mainly distributed between the third ground end 311 and the first free end 312, and twelfth resonant current flows from the third ground end 311 to the first free end 312, or flows from the first free end 312 to the third ground end 311. It can be understood that, current density of the twelfth resonant mode p is mainly distributed as described above, and a small amount of current density of the twelfth resonant mode p is distributed between the second free end 411 and the fourth ground end 412.

The twelfth resonant mode p is a ⅛ to ¼ wavelength mode caused by the excitation current of the fourth feeding module 43 resonating on the third radiator 31. Specifically, the length of the third radiator 31 is designed to be about ⅛ times to ¼ times a wavelength of the excitation current, in the medium, flowing from the fourth feeding module 43 to the third radiator 31, so as to excite the twelfth resonant mode p on the third radiator 31.

It should be noted that, the sixth resonant mode f to the twelfth resonant mode p are described above from the perspective of the wavelength mode, which can be better understood and explained and illustrates main characteristics of each resonant mode so that each resonant mode is easily distinguished. However, when each resonant mode operates, the third antenna unit 30 and the fourth antenna unit 40 are not separate but are coupled to each other, and current also flows to each other through the coupling.

The third radiator 31 supports, under excitation of the third feeding module 33 (namely, the third antenna unit 30), the GPS frequency band, the Wi-Fi 2.4G frequency band, the LTE-4G MHB frequency band, the NR-5G MHB frequency band, the LTE-4G UHB frequency band, and the NR-5G UHB frequency band. For example, the resonant frequency of the sixth resonant mode f is 1.5766 GHZ, the resonant frequency of the seventh resonant mode g is 2.4667 GHz, and the resonant frequency of the eighth resonant mode h is 2.9773 GHz. The third antenna unit 30 covers (GPS-L1/)+(Wi-Fi 2.4G)+(LTE/NR-MHB+UHF). In other embodiments, the third antenna unit 30 covers (GPS-L1)+(Wi-Fi 2.4G)+(LTE/NR-MHB+UHF)+N77/N78.

The fourth radiator 41 supports, under excitation of the fourth feeding module 43 (namely, the fourth antenna unit 40), the N77 frequency band, the N78 frequency band, the Wi-Fi 5G frequency band, and the Wi-Fi 6E frequency band. For example, the resonant frequency of the ninth resonant mode I is 2.998 GHZ, the resonant frequency of the tenth resonant mode j is 3.6742 GHz, the resonant frequency of the eleventh resonant mode k is 5.5096 GHZ, and the resonant frequency of the twelfth resonant mode p is 6.5722

GHz. The fourth antenna unit 40 covers the N77/N78+Wi-Fi 5G frequency band and the Wi-Fi 6E frequency band. Certainly, in other embodiments, the fourth antenna unit 40 covers the Wi-Fi 5G frequency band and the Wi-Fi 6E frequency band.

The arrangement of the antenna assembly 100 in the electronic device 1000 provided in this embodiment includes, but is not limited to, the following embodiments. The first radiator 11 and the second radiator 12 are both disposed on the first side frame 2103, and the first coupling gap 140 is defined at the middle of the first side frame 2103. A part of the third radiator 31 is disposed on the first side frame 2103, and the other part of the third radiator 31 is disposed on the top frame 2101. The fourth radiator 41 is disposed on the top frame 2101, and the second coupling gap 150 is defined on the top frame 2101.

When the user uses the electronic device 1000 in landscape mode, the first coupling gap 140 is away from holding areas of the user's hands, so that the first antenna unit 10 and the second antenna unit 20 can have higher radiation efficiency to receive/transmit signals in frequency bands of (GPS-L1)+(WI-FI 2.4G)+(LTE/NR-MHB+UHF)+N77/N78+Wi-Fi 5G/Wi-Fi 6E, so as to improve user's experience in landscape mode. When the user uses the electronic device 1000 in portrait mode, the second coupling gap 150 is away from holding areas of the user's hands, so that the third antenna unit 30 and the fourth antenna unit 40 can have higher radiation efficiency to receive/transmit signals in frequency bands of (GPS-L1)+(WI-FI 2.4G)+(LTE/NR-MHB+UHF)+N77/N78+Wi-Fi 5G/Wi-Fi 6E frequency bands, so as to improve user's experience in portrait mode. It can be seen from the above that the antenna assembly 100 provided by the present embodiment can effectively cover frequency bands of (GPS-L1)+(WI-FI 2.4G)+(LTE/NR-MHB+UHB)+N77/N78+Wi-Fi 5G/Wi-Fi 6E both in landscape mode and in portrait mode.

Optionally, the electronic device 1000 further includes at least one key portion 440, where the at least one key portion 440 is disposed between the second ground end 212 and the second feeding point B, and/or the at least one key portion 440 is disposed between the first ground end 111 and the third ground end 311.

Figure 44:
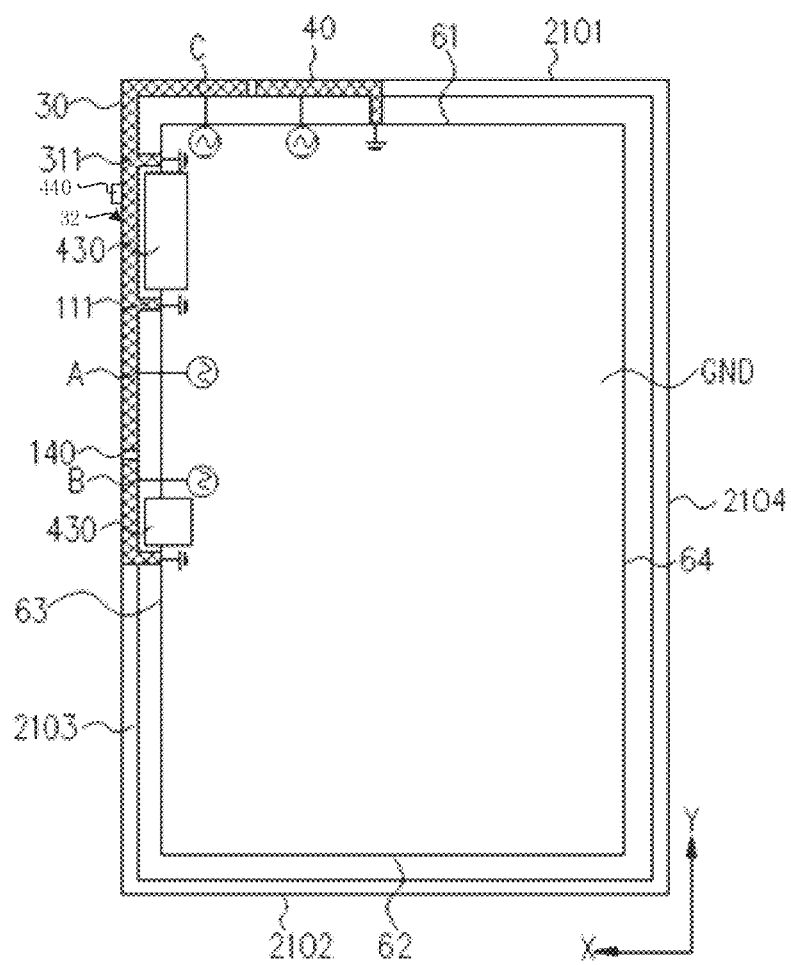
FIG. 44 is a schematic structural diagram of an electronic device with the antenna assembly illustrated in FIG. 33 mounted thereon.

As illustrated in FIG. 44, the reference ground GND is an alloy device of the middle plate 410. When the antenna assembly 100 is disposed in the electronic device 1000, each device on the antenna assembly 100 is spaced apart from each other, and other devices in the electronic device 1000 may be disposed in space between devices on the antenna assembly 100. For example, a key circuit board 430 may be disposed in space between the second reference ground GND2 and the second feeding module 23, and the key portion 440 may be disposed on the second radiator 21. The key portion 440 includes, but is not limited to, a power key, a volume key, a mute key, or the like. In addition, the key circuit board 430 may also be disposed in space between the fourth matching module M4 and the fifth matching module M5, and the key portion 440 may be disposed on the middle frame between the first ground end 111 and the third ground end 311. Other devices in the electronic device 1000 are disposed in the space between devices on the antenna assembly 100, so as to promote compactness of the structure of the electronic device 1000 with the antenna assembly 100 to facilitate the overlapping length of the electronic device 1000.

It can be understood that, the first matching module M1 to the fifth matching module M5 may be provided with devices in any one of the embodiments in FIG. 11 to FIG. 18, and may also include an adjustable device such as a switching circuit, a variable capacitor, or the like.

Figure 45:
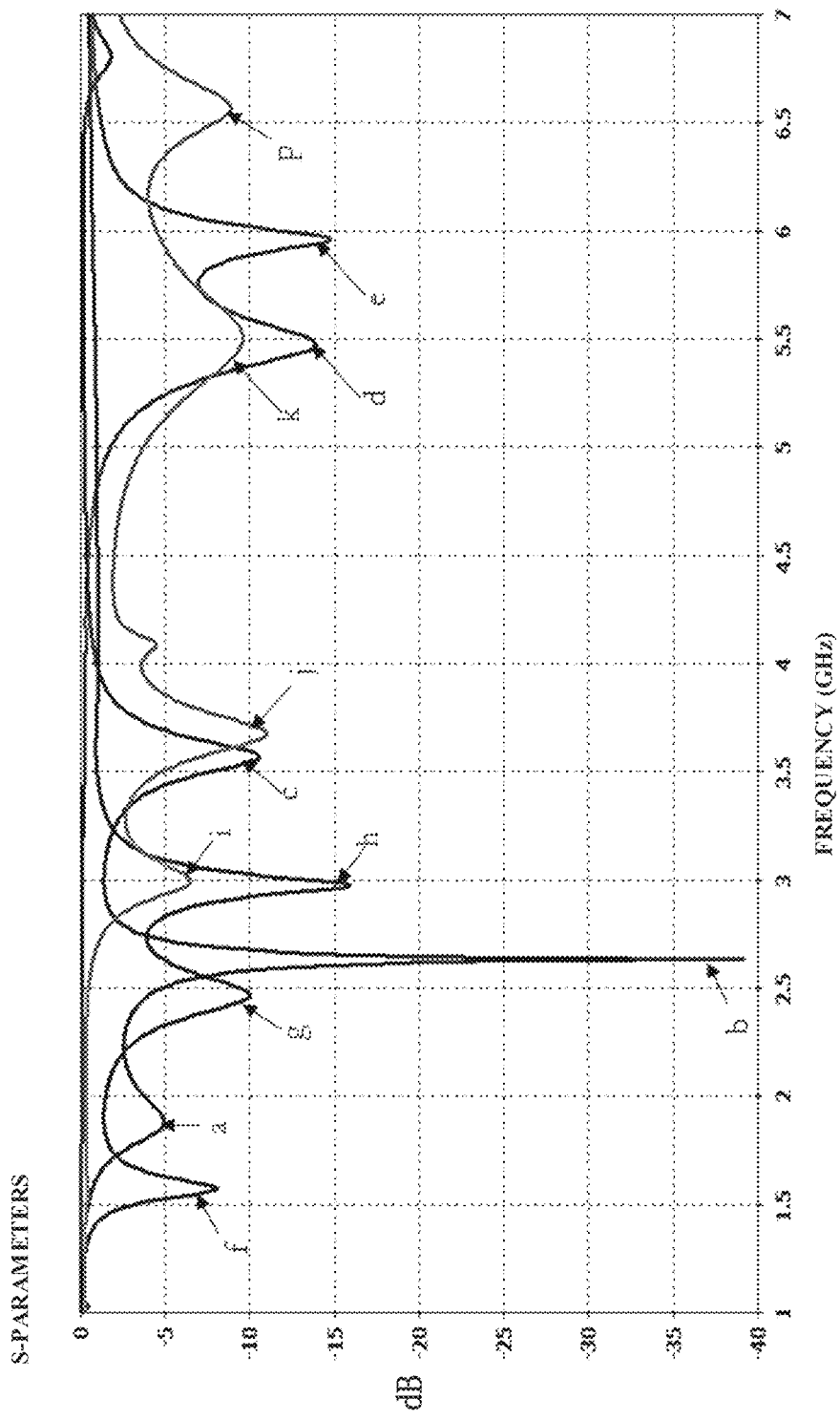
FIG. 45 is a schematic graph illustrating S-parameters of the antenna assembly illustrated in FIG. 33.

As illustrated in FIG. 45, which are curves of S-parameters of the first antenna unit 10 to the fourth antenna unit 40. It can be seen from the curves of S-parameters of total power of the antenna assembly 100 in FIG. 45 that, the antenna assembly 100 can better cover frequency bands of (GPS-L1)+(WI-FI 2.4G)+(LTE/NR-MHB+UHB)+N77/N78+Wi-Fi 5G/Wi-Fi 6E, and has a good impedance bandwidth.

Figure 46:
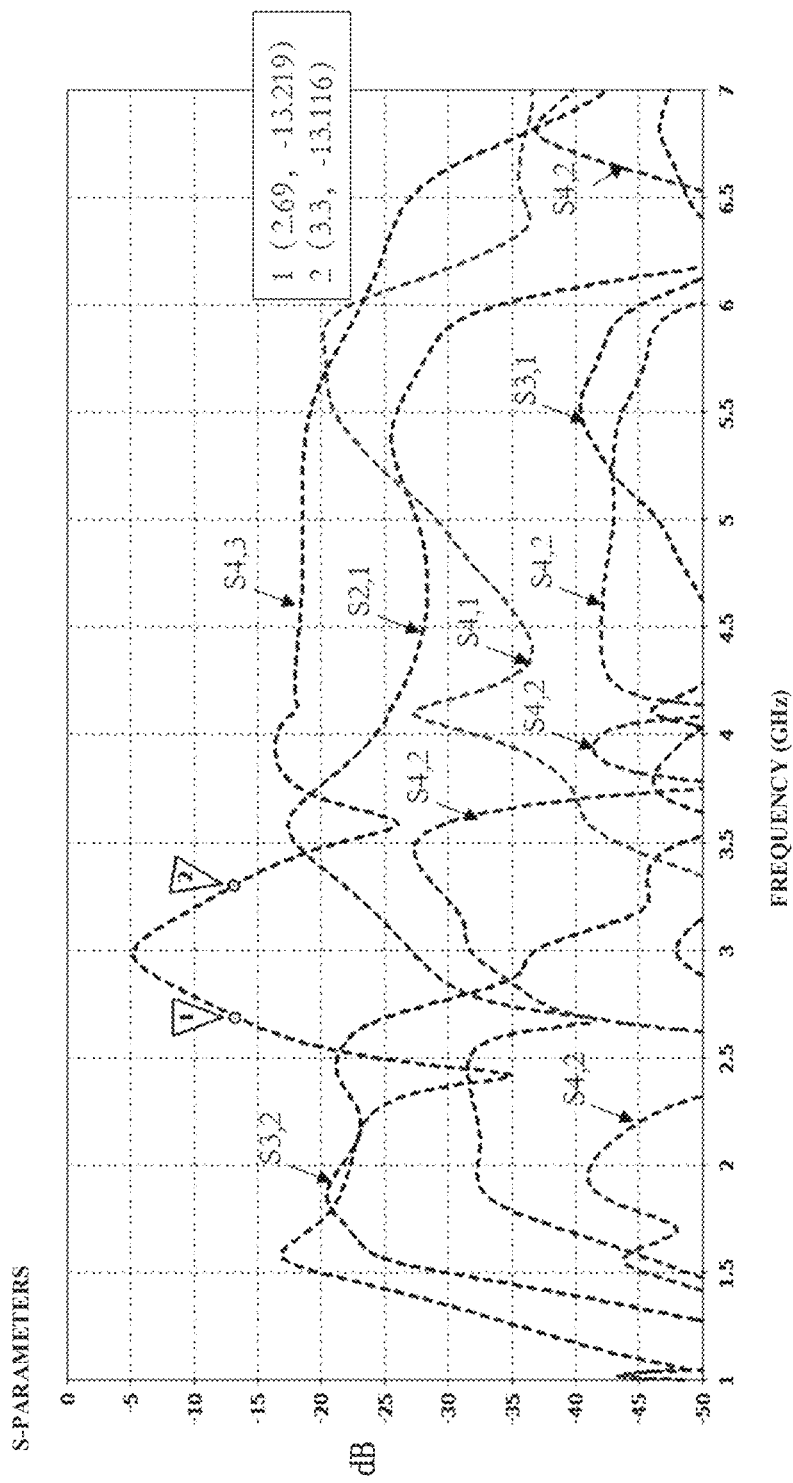
FIG. 46 is a schematic graph illustrating isolation between antenna units of the antenna assembly illustrated in FIG. 33.

As illustrated in FIG. 46, which are curves of isolation between antenna units of the antenna assembly 100. As illustrated in FIG. 46, S2,1 curve illustrates isolation between the first antenna unit 10 and the second antenna unit 20, S3,1 curve r illustrates isolation between the third antenna unit 30 and the first antenna unit 10, S3,2 curve illustrates isolation between the third antenna unit 30 and the second antenna unit 20, S4,1 curve illustrates isolation between the fourth antenna unit 40 and the first antenna unit 10, S4,2 curve illustrates isolation between the fourth antenna unit 40 and the second antenna unit 20, and S4,3 curve illustrates isolation between the fourth antenna unit 40 and the third antenna unit 30. Taking the S parameter as −13 dB as a reference, it can be seen from FIG. 46 that, the curve of isolation between each antenna unit is mostly set below −13 dB, which indicates that each antenna unit has better isolation with one other in the antenna assembly 100.

The function of the antenna assembly 100 provided in any one of the above embodiments will be further described below with reference to accompanying drawings. For example, the antenna assembly 100 can also detect the approach of the subject to-be-detected while receiving/transmitting antenna signals. The subject to-be-detected includes, but is not limited to, human's head, hands, or the like. It can be understood that, radiators are made of a conductive material, and can also be used as a sensing electrode for proximity signals while serving as an antenna-signal-receiving/transmitting port. The antenna assembly 100 provided in the present disclosure has dual functions of receiving/transmitting the electromagnetic wave signal and sensing proximity, and has a small volume. When the antenna assembly 100 is applicable to the electronic device 1000, the electronic device 1000 can be ensured to have a communication function and a proximity detecting function and to have a small size.

Figure 47:
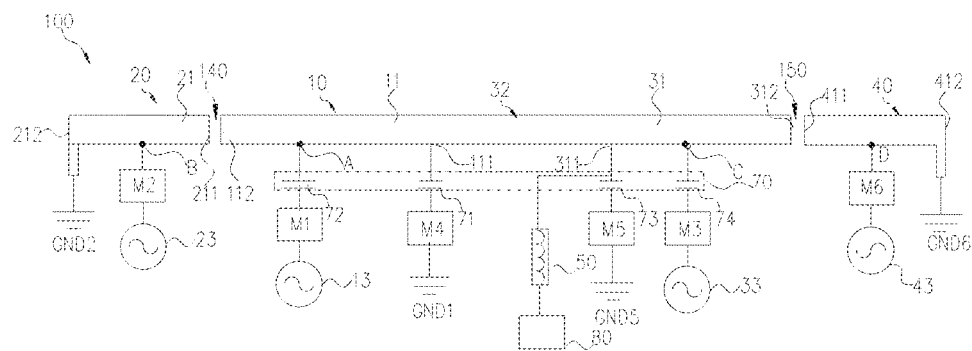
FIG. 47 is a schematic structural diagram of the third type of antenna assembly with a sharing radiator being used as a proximity sensing electrode provided in embodiments of the present disclosure.

Specifically, as illustrated in FIG. 47, the antenna assembly 100 further includes a DC blocking component 70, a filtering component 50, a detecting component 80, and a controller (not illustrated in FIG. 47).

The following describes examples of connection manners of the DC blocking component 70 and the filtering component 50 with reference to the antenna assembly 100 provided in the third type of embodiment.

As illustrated in FIG. 47, in a first type of embodiment of proximity detecting, the sharing radiator 32 is used as the sensing electrode for detecting the approach of the subject to-be-detected. The DC blocking component 70 is electrically connected between the first feeding point A and the first matching module M1, between the first ground end 111 and the first reference ground GND1 (when the fourth matching module M4 is disposed between the first ground end 111 and the first reference ground GND1, the DC blocking component 70 is disposed between the first ground end 111 and the fourth matching module M4), between the third ground end 311 and the fifth reference ground GND5 (when the fifth matching module M5 is disposed between the third ground end 311 and the fifth reference ground GND5, the DC blocking component 70 is disposed between the third ground end 311 and the fifth matching module M5), and between the third feeding point C and the third matching module M3. The DC blocking component 70 is configured to block direct current generated by the first matching module M1, the first reference ground GND1, the fifth reference ground GND5, and the third matching module M3, so as to support a human-body-detecting function and to improve accuracy for detecting the approach of the human body to the antenna assembly 100.

One end of the filtering component 50 is electrically connected to one end of the DC blocking component 70 close to the sharing radiator 32, or electrically connected to any position of the sharing radiator 32. The filtering component 50 is configured to block an RF signal received/transmitted by the sharing radiator 32 and a sensing signal generated by the sharing radiator 32 in response to the approach of the subject to-be-detected, so that the RF signal received/transmitted by the first radiator 11 does not affect accuracy for detecting the sensing signal by the detecting component 80.

Specifically, as illustrated in FIG. 47, the DC blocking component 70 includes a first sub-isolator 71, a second sub-isolator 72, a third sub-isolator 73, and a fourth sub-isolator 74. The first sub-isolator 71 is electrically connected between the first ground end 111 and the first reference ground GND1 (specifically, between the first ground end 111 and the fourth matching module M4). The second sub-isolator 72 is electrically connected between the first feeding point A and the first matching module M1. The third sub-isolator 73 is electrically connected between the third ground end 311 and the fifth reference ground GND5 (specifically, between the third ground end 311 and the fifth matching module M5). The fourth sub-isolator 74 is electrically connected between the third feeding point C and the third matching module M3.

The DC blocking component 70 is disposed so that the sensing signal generated by the sharing radiator 32 in response to approach of the subject to-be-tested does not affect the antenna signal received/transmitted by the antenna assembly 100. Specifically, each of the first sub-isolator 71, the second sub-isolator 72, the third sub-isolator 73, and the fourth sub-isolator 74 is a capacitive device. For example, each of the first sub-isolator 71, the second sub-isolator 72, the third sub-isolator 73, and the fourth sub-isolator 74 is a capacitor, and each of the first sub-isolator 71, the second sub-isolator 72, the third sub-isolator 73, and the fourth sub-isolator 74 has low impedance to ground on the RF signal supported by the antenna assembly 100. For example, value of the first sub-isolator 71, value of the second sub-isolator 72, value of the third sub-isolator 73, and value of the fourth sub-isolator 74 include, but are not limited to, 47 pF, 22 pF, or the like. The first sub-isolator 71 blocks direct current of the fourth matching module M4, the second sub-isolator 72 blocks direct current of the first matching module M1, the third sub-isolator 73 blocks direct current of the fifth matching module M5, and the fourth sub-isolator 74 blocks direct current of the third matching module M3. In this way, the human-body-detecting function can be supported, and accuracy for detecting the approach of the human body to the antenna assembly 100 can be improved. In other words, the DC blocking component 70 makes the sharing radiator 32 in the "floating" state relative to the direct current.

Specifically, the filtering component 50 is electrically connected between the first sub-isolator 71 and the first ground end 111, or is electrically connected between the second sub-isolator 72 and the first feeding point A, or is electrically connected between the third sub-isolator 73 and the third ground end 311, or is electrically connected between the fourth sub-isolator 74 and the third feeding point c, or is electrically connected to any position of the sharing radiator 32. The filtering component 50 includes an inductive device, or the filtering component 50 is an inductive device. For example, the filtering component 50 is an inductor. The filtering component 50 has a high impedance on the RF signal supported by the antenna assembly 100, and inductance of the inductor is, for example, 82 nH.

The above-mentioned DC blocking component 70 and filtering component 50 realize that the sensing signal and the RF signal can work at the same time but do not interfere with each other.

The detecting component 80 is electrically connected to the other end of the filtering component 50. The detecting component 80 is configured to detect the magnitude of a sensing signal generated by a radiator. Optionally, the detecting component 80 may be a device for detecting a current signal, a voltage signal, or an inductor signal, for example, a micro galvanometer, a micro current transformer, a current comparator, a voltage comparator, or the like.

When human skin surface is close to the sharing radiator 32, the human skin surface and the sharing radiator 32 may be equivalent to two electrode plates of a capacitor. When human's head approaches, the sharing radiator 32 may sense a change in electrical charges brought by the human's head. The filtering component 50 is electrically connected to the sharing radiator 32. The change in electrical charges forms a sensing signal, and the sensing signal is transmitted to the detecting component 80 through the filtering component 50. According to a capacitor calculation formula, $C=\varepsilon S/4\ kd$, where d is a distance between the human body (head or hands) and the radiator. Therefore, an increase of the capacitance, that is, the sensing signal detected by the detecting component 80 becomes stronger, indicates that the human body is approaching, and a decrease of the capacitance, that is, the sense signal detected by the detecting component 80 becomes weaker, indicates that the human body is moving away. The detecting component 80 determines whether the human's head is close to the sharing radiator 32 of the antenna assembly 100 by detecting changes in the sensing signal mentioned above, so as to intelligently reduce the SAR of the electromagnetic wave by the human's head.

Optionally, at least a part of the DC blocking component 70 can also be a part of the matching module. For example, the second sub-isolator 72 is a capacitor, the second sub-isolator 72 is configured to block the sensing signal and allow the RF signal to pass, and the second sub-isolator 72 can also be used as a part of the first matching module M1 to tune impedance match between a signal source and the first feeding point A, so as to reduce losses of the RF signal fed to the sharing radiator 32 and to improve conversion efficiency of signals received/transmitted by the sharing radiator 32. The second sub-isolator 72 can also be used to adjust a frequency offset of resonant modes generated by the sharing radiator 32, so as to realize multi-use of devices, to reduce the number of devices and space occupied by devices, and to improve the integration of devices.

When a part of the first matching module M1 being electrically connected to the first feeding point A is a capacitor, the second sub-isolator 72 does not need to be disposed. Similarly, when a part of the fourth matching module M4 being electrically connected to the second ground end 212 is a capacitor, the first sub-isolator 71 does not need to be disposed. When a part of the fifth matching module M5 being electrically connected to the third ground end 311 is a capacitor, the third sub-isolator 73 does not need to be disposed. When a part of the third matching module M3 being electrically connected to the second feeding point B is a capacitor, the fourth sub-isolator 74 does not need to be disposed.

In the antenna assembly 100 and the electronic device 1000 provided in the present disclosure, the sharing radiator 32 on the antenna assembly 100 is reused as a sensing electrode for detecting the approach of the subject to-be-detected such as the human body, and the sensing signal and the RF signal are separated by the DC blocking component 70 and the filtering component 50. In this way, the dual functions of the antenna assembly 100, namely, communication and sensing the subject to-be-detected, can be achieved, the function of the antenna assembly 100 is increased, the utilization rate of devices is further improved, and the overall volume of the electronic device 1000 is reduced.

The present embodiment, on one hand, can increase the proximity sensing area, and on the other hand, can increase SAR detection range by taking the sharing radiator 32 as the sensing electrode to detect the approach of the subject to-be-detected at the front and back of the electronic device 1000, a facing side of the first side frame 2103, and a facing side of the top frame 2101, because the sharing radiator 32 is disposed on the first side frame 2103, the top frame 2101, and the corner portion 2106 of the first side frame 2103 and the top frame 2101

Figure 48:
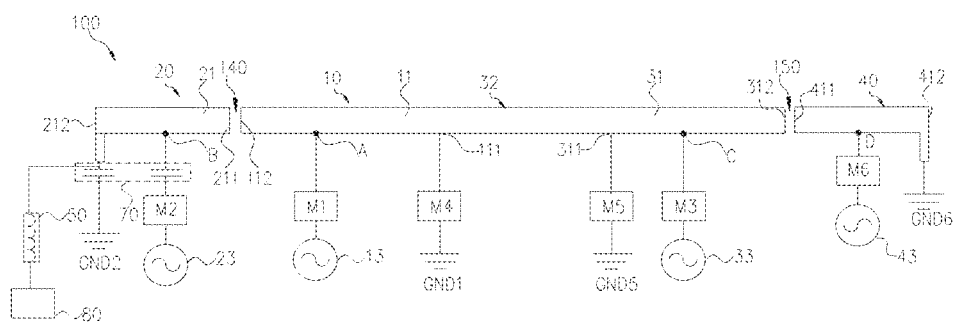
FIG. 48 is a schematic structural diagram of the third type of antenna assembly with a second radiator being used as a proximity sensing electrode provided in embodiments of the present disclosure.

In a second type of embodiment of proximity detecting, as illustrated in FIG. 48, the second radiator 21 is used as the sensing electrode for detecting the approach of the subject to-be-detected.

The DC blocking component 70 is electrically connected between the second ground end 212 and the second reference ground GND2 of the second radiator 21, and between the second matching module M2 and the second feeding point B. For a specific structure of the DC blocking component 70 and principles of isolating sensing signals and allowing RF signals to pass, reference may be made to the connection manner of the first type of DC blocking component 70 and the filtering component 50, and details are not repeatedly described herein. One end of the filtering component 50 is electrically connected to one end of the DC blocking component 70 close to the second radiator 21 (for example, between the DC blocking component 70 and the second ground end 212) or electrically connected to any position of the second radiator 21. The DC blocking component 70 is configured to block direct current generated by the second reference ground GND2 and the second matching module M2. The filtering component 50 is configured to block the RF signal received/transmitted by the second radiator 21 and a sensing signal generated by the second radiator 21 in response to the approach of the subject to-be-detected. In this embodiment, the second radiator 21 is the sensing electrode, and the second radiator 21 is in a "floating state" relative to direct current.

Figure 49:
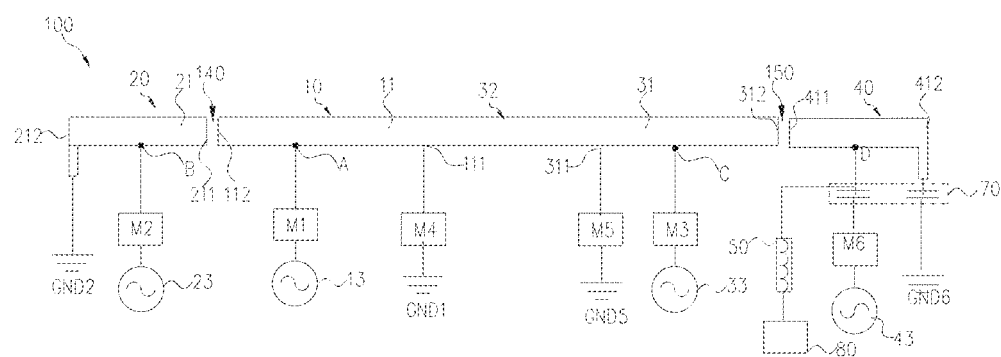
FIG. 49 is a schematic structural diagram of the third type of antenna assembly with a fourth radiator being used as a proximity sensing electrode provided in embodiments of the present disclosure.

In a third type of embodiment of proximity detecting, as illustrated in FIG. 49, the fourth radiator 41 is used as the sensing electrode for detecting the approach of the subject to-be-detected. The DC blocking component 70 is electrically connected between the fourth ground end 412 and the sixth reference ground GND6, and between the sixth matching module M6 and the fourth feeding point D. One end of the filtering component 50 is electrically connected to one end of the DC blocking component 70 close to the third radiator 31 or is electrically connected to the third radiator 31. The DC blocking component 70 is configured to block direct current generated by the sixth reference ground GND6 and the sixth matching module M6. The filtering component 50 is configured to block the RF signal received/transmitted by the third radiator 31 and a sensing signal generated by the fourth radiator 41 in response to the approach of the subject to-be-detected.

It can be understood that, the first type of embodiment of proximity detecting, the second type of embodiment of proximity detecting, and the third type of embodiment of proximity detecting may be implemented by selecting one of them, two of them, or three of them.

The following specifically describes an embodiment in which the first type of embodiment of proximity detecting and the third type of embodiment of proximity detecting are implemented simultaneously.

Figure 50:
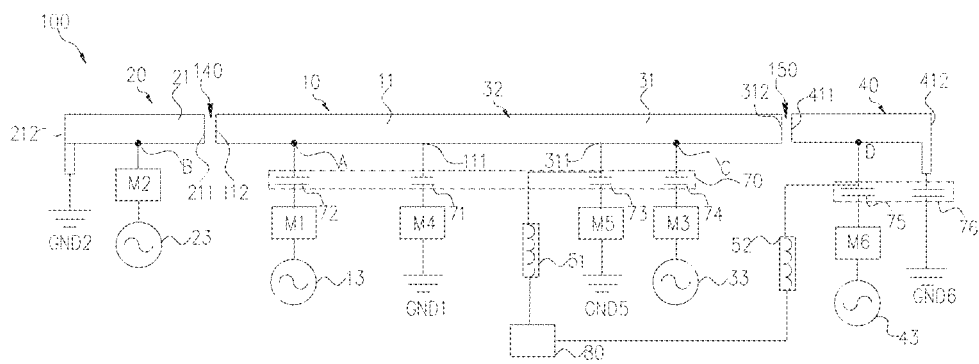
FIG. 50 is a schematic structural diagram illustrating the third type of antenna assembly with both a sharing radiator and a fourth radiator being used as a proximity sensing electrode provided in embodiments of the present disclosure.

As illustrated in FIG. 50, based on the first type of embodiment of proximity detecting, the DC blocking component 70 further includes a fifth sub-isolator 75 and a sixth sub-isolator 76. The fifth sub-isolator 75 is electrically connected between the fourth feeding point D and the sixth matching module M6, and the sixth sub-isolator 76 is electrically connected between the fourth ground end 412 and the sixth reference ground GND6, so that both the sharing radiator 32 and the fourth radiator 41 can be used as the sensing electrodes for detecting the approach of the subject to-be-detected.

As illustrated in FIG. 50, the filtering component 50 includes a first sub-filter 51 and a second sub-filter 52. The first sub-filter 51 is electrically connected between the first sub-isolator 71 and the first ground end 111, between the second sub-isolator 72 and the first feeding point A, between the third sub-isolator 73 and the third ground end 311, between the fourth sub-isolator 74 and the third feeding point C, or at any position of the sharing radiator 32. The second sub-filter 52 is electrically connected to any position between the fifth sub-isolator 75 and the fourth feeding point D, between the sixth sub-isolator 76 and the fourth ground end 412, or at any position of the fourth radiator 41.

Specifically, each of the first sub-isolator 71, the second sub-isolator 72, and the third sub-isolator 73 is a blocking capacitor, and each of the first sub-filter 51 and the second sub-filter 52 is a blocking inductor.

As illustrated in FIG. 50, the detecting component 80 is electrically connected to the first sub-filter 51 and the second sub-filter 52. Specifically, one channel of the detecting component 80 is electrically connected to the first sub-filter 51, and the other channel of the detecting component 80 is electrically connected to the second sub-filter 52. In this embodiment, both the sharing radiator 32 and the fourth radiator 41 can be used as detecting electrodes for detecting the approach of the subject to-be-detected.

In other embodiments, the detecting component 80 includes a first sub-detector and a second sub-detector. The first sub-detector is electrically connected to the other end of the first sub-filter 51, and the second sub-detector is electrically connected to the other end of the second sub-filter 52. In other words, sensing signals detected by the sharing radiator 32 are detected by the first sub-detector, and sensing signals detected by the fourth radiator 41 are detected by the second sub-detector. This embodiment may be used when the sharing radiator 32 and the fourth radiator 41 are separately disposed on different sides of the electronic device 1000, and one radiator of the antenna assembly 100 may be used to detect the approach of the human body from different sides of the electronic device 1000, so that the electronic device 1000 can have a larger detecting range while occupying small space.

When the human body approaches the sharing radiator 32, the electrical charge on the sharing radiator 32 changes, and the detecting component 80 may directly detect the sensing signal by the first sub-filter 51. When the human body approaches the fourth radiator 41, the electric charge in the fourth radiator 41 changes, and the detecting component 80 may directly detect the sensing signal by the second sub-filter 52. The detecting component 80 detects whether the human body is approaching by detecting the sensing signal. In this case, all radiators can be used as sensing electrodes, so that a sensing area becomes larger, and the utilization rate of radiators can be improved. Only one detecting component 80 is required, so that the number of devices of the antenna assembly 100 can be reduced and the space can be saved.

The controller is electrically connected to the detecting component 80. The detecting component 80 is configured to receive the sensing signal, to convert the sensing signal into an electrical signal, and to transmit the electrical signal to the controller. The controller is configured to detect the distance between the subject to-be-detected and the radiator according to the magnitude of the sensing signal, so as to determine whether the human body is close to the radiator, and to adjust power of the first feeding module 13 (or the third feeding module 33, or the fourth feeding module 43) when the distance between the subject to-be-detected and the radiator is less than or equal to a pre-set distance. Specifically, the controller can adjust power of the antenna assembly 100 according to different scenarios, so as to intelligently reduce the SAR of the electromagnetic wave signal by the human body.

For example, when the human's head is close to the radiator of the antenna assembly 100, the controller may lower the power of the antenna assembly 100 to lower the SAR of the electromagnetic wave radiated by the antenna assembly 100. When the human's hand blocks the radiator of the antenna assembly 100 in a radiation direction, if the electronic device 1000 is provided with other standby antenna assemblies 100 (namely, an antenna assembly 100 capable of covering the same frequency band), the controller may turn off the blocked antenna assembly 100 and turn on other unblocked antenna assemblies 100. In this way, when the human's hand blocks the antenna assembly 100, the communication quality of the electronic device 1000 can be ensured by intelligently switching the antenna assembly 100. If the electronic device 1000 is not provided with other standby antenna assemblies 100, the controller may increase the power of the antenna assembly 100 to compensate for a reduction in efficiency caused by the human's hand blocking the radiator.

Certainly, the controller is also configured to control other application programs on the electronic device 1000 according to a detecting result of the detecting component 80. For example, if the controller detects that the human body is approaching or the electronic device 1000 is in a call state according to the detection result of the detecting component 80, the controller can turn off the display screen 300 to save electric energy of the electronic device 1000 during a call; if the controller detects that the human body is moving away or the electronic device 1000 is in a call state, the controller can also turn on the display screen 300.

Certainly, in other embodiments, the first type of embodiment of proximity detecting embodiment, the second type of embodiment of proximity detecting embodiment, and the third type of embodiment of proximity detecting embodiment may be implemented together.

Optionally, when the radiator is used for detecting the approach of the human body, and the radiator is integrated with the frame 210, an insulating film may be disposed on a surface of the radiator. Because the human skin surface has an electrical charge, a capacitor structure is formed between the human skin surface and the radiator, and a signal change caused by approach of the human skin surface is detected by the radiator.

Optionally, the electronic device 1000 may be provided with multiple antenna assemblies 100, and each of the multiple antenna assemblies 100 may be the antenna assembly 100 listed in any one of foregoing embodiments. The multiple antenna assemblies 100 can realize intelligent switching in different blocking scenarios, so as to achieve high antenna receiving/transmitting efficiency in any case of hand blocking, or the like. In addition, after radiators of the multiple antenna assemblies 100 are integrated with a detecting function, different user scenarios (for example, holding with one hand, holding with two hands, a carrying state, a call state, or the like) may be detected, and six faces in the SAR standard can also be detected.

Figure 51:
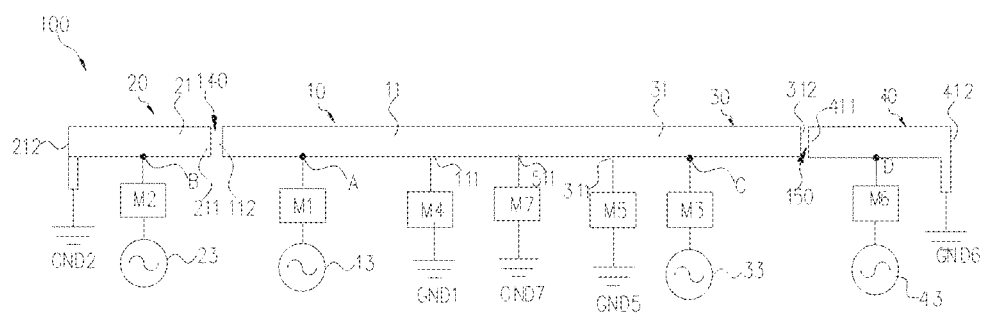
FIG. 51 is a schematic structural diagram of the third type of antenna assembly with a seventh matching module provided in embodiments of the present disclosure.

Optionally, as illustrated in FIG. 51, a segment between the first ground end 111 and the third ground end 311 is a connecting segment. The connecting segment has at least one connecting point (for example, the first connecting point 511 in FIG. 51 and the second connecting point 512 in FIG. 52). The antenna assembly 100 further includes at least one seventh matching module M7. One end of the at least one seventh matching module M7 is electrically connected to the connecting point (namely, the first connecting point 511), and the other end of the at least one seventh matching module M7 is electrically connected to the seventh reference ground GND7. The at least one seventh matching module M7 can effectively filter out the RF signal of the first antenna unit 10 and the second antenna unit 20, so as to prevent the RF signal from interfering the third antenna unit 30 and the fourth antenna unit 40. Optionally, the at least one seventh matching module M7 includes a ground circuit that is in a band-pass or low-impedance state on frequency bands supported by the first antenna unit 10 and the second antenna unit 20, so that the first antenna unit 10 and the second antenna unit 20 have a better isolation with the third antenna unit 30 and the fourth antenna unit 40. In addition, the at least one seventh matching module M7 can also effectively filter out the RF signal of the third antenna unit 30 and the fourth antenna unit 40, so as to prevent the RF signal from interfering the first antenna unit 10 and the second antenna unit 20. Optionally, the at least one seventh matching module M7 includes the ground circuit which is in a band-pass or low impedance state on frequency bands supported by the third antenna unit 30 and the fourth antenna unit 40, so that the first antenna unit 10 and the second antenna unit 20 have better isolation with the third antenna unit 30 and the fourth antenna unit 40.

Furthermore, the at least one seventh matching module M7 can also filter out some working modes with low efficiency in the antenna assembly 100, for example, a working mode where current flows from the first reference ground GND1 to the first grounding terminal 111, to the third grounding terminal 311, and back to the fifth reference ground GND5, so as to reduce influence of low-efficiency working modes on resonant modes of the antenna assembly 100.

Optionally, the connecting point (namely, the first connecting point 511) may be close to the first ground end 111 or the third ground end 311, so that a key can be further disposed between the first ground end 111 and the third ground end 311. The at least one seventh matching module M7 is opposite to the connecting point. Certainly, when a key is not needed between the first ground end 111 and the third ground end 311, the connecting point may also be disposed at any position between the first ground end 111 and the third ground end 311, including but not limited to the middle between the first ground end 111 and the third ground end 311.

Figure 52:
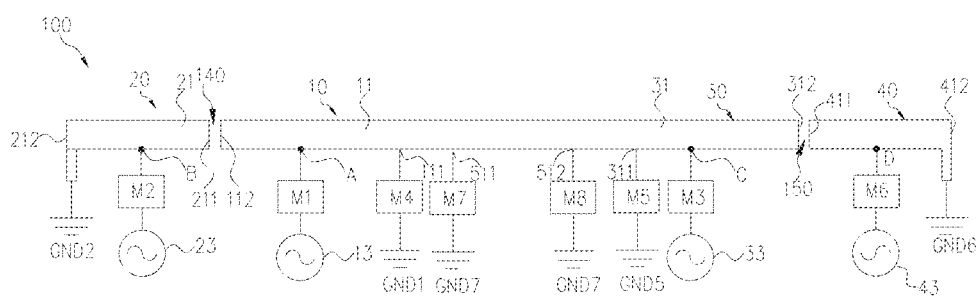
FIG. 52 is a structural diagram of a third antenna assembly with a seventh matching module and an eighth matching module provided in embodiments of the present disclosure.

Optionally, as illustrated in FIG. 52, the connecting segment may have multiple connecting points, for example, two connecting points, namely, the first connecting point 511 and the second connecting point 512, where the first connecting point 511 is close to the first ground end 111, and the second connecting point 512 is close to the third ground end 311. Two connecting points (namely, the first connecting point 511 and the second connection 512) are electrically connected to two matching modules, where one matching module being electrically connected to the first connecting point 511 is marked as the seventh matching module M7, and the other matching module being electrically connected to the second connection 512 is marked as an eighth matching module M8. Each of the seventh matching module M7 and the eighth matching module M8 can make the first antenna unit 10 and the second antenna unit 20 have increasing isolation with the third antenna unit 30 and the fourth antenna unit 40, and filter some low-efficiency working modes in the antenna assembly 100, so as to improve the receiving/transmitting efficiency of each resonant mode of the antenna assembly 100.

The antenna assembly 100 provided in the present disclosure can realize a four-antenna co-aperture design, so that bandwidth of frequency bands received/transmitted and the number of frequency bands received/transmitted can be increased, and overlapping space of the antenna assembly 100 can also be reduced. In addition, the human-body-detecting function is integrated into radiators of the antenna assembly 100, so as to intelligently detect whether the human body is approaching, and to reduce the SAR, or to detect the state in which the electronic device 1000 is held and to detect the state of a using application. Furthermore, the antenna assembly 100 is properly disposed on the electronic device 1000, so that the electronic device 1000 has higher signal receiving/transmitting efficiency in landscape mode.

The above are merely some embodiments of the present disclosure. It should be noted that, those skilled in the art may make further improvements and modifications within the principle of the present disclosure, and these improvements and modifications shall also be included in the scope of protection of the present disclosure.

What is claimed is:

1. An antenna assembly, comprising:
a first radiator, a second radiator, a first matching module, a first feeding module, a second matching module, and a second feeding module, wherein the first radiator has a first ground end, a first coupling end, and a first feeding point between the first ground end and the first coupling end; the second radiator has a second coupling end, a second ground end, and a second feeding point between the second coupling end and the second ground end; a first coupling gap is defined between the second coupling end and the first coupling end; the first matching module is electrically connected between the first feeding point and the first feeding module, and the first ground end is electrically connected to a first reference ground; the second matching module is electrically connected between the second feeding point and the second feeding module, and the second ground end is electrically connected to a second reference ground; and the first radiator and the second radiator support, under excitation of the first feeding module and the second feeding module, a plurality of resonant modes, wherein the plurality of resonant modes comprise a first resonant mode, a second resonant mode, and a third resonant mode, the first resonant mode is a ⅛ to ¼ wavelength mode caused by the excitation current of the first feeding module resonating on the first radiator, the second resonant mode is a ⅛ to ¼ wavelength mode caused by excitation current of the first feeding module resonating on the second radiator, and the third resonant mode is a ¾ wavelength mode caused by the excitation current of the second feeding module resonating on the first radiator.

2. The antenna assembly of claim 1, wherein the plurality of resonant modes further comprise a fourth resonant mode, and the fourth resonant mode is a ⅛ to ¼ wavelength caused by the excitation current of the first feeding module resonating from the first feeding point to the first coupling end.

3. The antenna assembly of claim 2, wherein a resonant frequency of the first resonant mode, a resonant frequency of the second resonant mode, and a resonant frequency of the fourth resonant mode increase sequentially; the first resonant mode supports at least one of a global positioning system (GPS) frequency band, a long-term evolution 4th generation (LTE-4G) middle-high band (MHB) frequency band, or a new radio 5th generation (NR-5G) MHB frequency band; the second resonant mode supports at least one of a wireless fidelity 2.4 GHz (Wi-Fi 2.4G) frequency band, the LTE-4G MHB frequency band, or the NR-5G MHB frequency band; and the fourth resonant mode supports at least one of an LTE-4G ultra-high band (UHB) frequency band or an NR-5G UHB frequency band.

4. The antenna assembly of claim 2, wherein the first matching module comprises at least one first branch connected in parallel to the ground and/or at least one second branch connected in series between the first feeding point and the first feeding module, and each of the at least one first branch and the at least one second branch comprises at least one of a capacitor or an inductor; and the first matching module is configured to tune at least one of a resonant frequency of the first resonant mode, a resonant frequency of the second resonant mode, or a resonant frequency of the fourth resonant mode.

5. The antenna assembly of claim 4, wherein the at least one first branch comprises a first sub-branch, a second sub-branch, and a third sub-branch, and the at least one second branch comprises a fourth sub-branch and a fifth sub-branch, wherein:
one end of the first sub-branch is electrically connected to the first feeding point, another end of the first sub-branch is electrically connected to a third reference ground, and the first sub-branch comprises a capacitor, or a capacitor and an inductor;
one end of the second sub-branch is electrically connected to the first feeding point, another end of the second sub-branch is electrically connected to the third reference ground, and the second sub-branch comprises an inductor, or an inductor and a capacitor;
another end of the third sub-branch is electrically connected to the third reference ground, and the third sub-branch comprises a capacitor, or a capacitor and an inductor;
one end of the fourth sub-branch is electrically connected to the first feeding point, another end of the fourth sub-branch is electrically connected to one end of the third sub-branch, and the fourth sub-branch comprises a capacitor, or a capacitor and an inductor; and one end of the fifth sub-branch is electrically connected to said another end of the fourth sub-branch, another end of the fifth sub-branch is electrically connected to the first feeding module, and the fifth sub-branch comprises an inductor.

6. The antenna assembly of claim 5, wherein the first matching module further comprises at least one adjustable branch electrically connected to the third reference ground, the at least one adjustable branch each comprises at least one of a switching circuit or an adjustable capacitor, and the at least one adjustable branch is configured to tune the resonant frequency of the first resonant mode and the resonant frequency of the second resonant mode.

7. The antenna assembly of claim 2, wherein the plurality of resonant modes further comprise a fifth resonant mode, and the fifth resonant mode is a ⅛ to ¼ wavelength mode caused by excitation current of the second feeding module resonating from the second feeding point to the second coupling end.

8. The antenna assembly of claim 7, wherein a resonant frequency of the fifth resonant mode is less than a resonant frequency of the third resonant mode, and the fifth resonant mode supports at least one of a Wi-Fi 5 GHz (Wi-Fi 5G) frequency band or a Wi-Fi 6 GHz extended (Wi-Fi 6E) frequency band, and the third resonant mode supports at least one of a Wi-Fi 5G frequency band or a Wi-Fi 6E frequency band.

9. The antenna assembly of claim 7, wherein the second matching module comprises at least one third branch connected in parallel to the ground and/or at least one fourth branch connected in series between the first feeding point and the first feeding module, and each of the at least one third branch and the at least one fourth branch comprises at least one of a capacitor or an inductor; and the second matching module is configured to allow a frequency band supported by the fifth resonant mode and a frequency band supported by the third resonant mode to pass, to block a frequency band less than both the frequency band supported by the fifth resonant mode and the frequency band supported by the third resonant mode, and to tune a resonant frequency of the fifth resonant mode and/or a resonant frequency of the third resonant mode.

10. The antenna assembly of claim 9, wherein the at least one third branch comprises a sixth sub-branch and a seventh sub-branch, and the at least one fourth branch comprises an eighth sub-branch;

wherein one end of the sixth sub-branch is electrically connected to the second feeding point, another end of the sixth sub-branch is electrically connected to one end of the seventh sub-branch, and the sixth sub-branch comprises an inductor and a capacitor connected in parallel;

wherein another end of the seventh sub-branch is electrically connected to the second feeding module, and the seventh sub-branch comprises a capacitor, or an inductor, or an inductor and a capacitor connected in parallel; and wherein one end of the eighth sub-branch is electrically connected to the second feeding module, another end of the eighth sub-branch is electrically connected to a fourth reference ground, and the eighth sub-branch comprises at least one of a capacitor or an inductor.

11. The antenna assembly of claim 1, further comprising a third radiator, a third feeding module, and a third matching module, wherein the third radiator has a third ground end, a first free end, and a third feeding point between the third ground end and the first free end, the third ground end and the first ground end are spaced apart from each other or are connected via a conductor, and the third ground end is electrically connected to a fifth reference ground; and the third feeding module is electrically connected to the third feeding point, and the third matching module is electrically connected between the third feeding point and the third feeding module.

12. The antenna assembly of claim 11, further comprising:

a fourth matching module, wherein one end of the fourth matching module is electrically connected to the first ground end, and another end of the fourth matching module is electrically connected to the first reference ground; and/or a fifth matching module, wherein one end of the fifth matching module is electrically connected to the third ground end, and another end of the fifth matching module is electrically connected to the fifth reference ground.

13. The antenna assembly of claim 11, further comprising a fourth radiator, a fourth feeding module, and a sixth matching module, wherein the fourth radiator has a fourth ground end, a second free end, and a fourth feeding point between the fourth ground end and the second free end, a second coupling gap is defined between the fourth ground end and the first free end, and the fourth ground end is electrically connected to a sixth reference ground; and the fourth feeding module is electrically connected to the fourth feeding point, and the sixth matching module is electrically connected between the fourth feeding point and the fourth feeding module.

14. The antenna assembly of claim 13, wherein:

the antenna assembly is further configured to support a sixth resonant mode, a seventh resonant mode, and an eighth resonant mode, wherein the sixth resonant mode is a ⅛ to ¼ wavelength mode caused by excitation current of the third feeding module resonating on the third radiator; the seventh resonant mode is a ⅛ to ¼ wavelength mode caused by the excitation current of the third feeding module resonating from the third feeding point to the first free end; and the eighth resonant mode is a ⅛ to ¼ wavelength mode caused by the excitation current of the third feeding module resonating from the third feeding point to the first free end and is a ⅛ to ¼ wavelength mode caused by the excitation current of the third feeding module resonates from the second free end to the fourth ground end; and the antenna assembly is further configured to support a ninth resonant mode, a tenth resonant mode, an eleventh resonant mode, and a twelfth resonant mode, wherein the ninth resonant mode is a ⅛ to ¼ wavelength mode caused by excitation current of the fourth feeding module resonating from the third feeding point to the first free end and is a ⅛ to ¼ wavelength mode caused by the excitation current of the fourth feeding module resonating from the first free end to the fourth ground end; the tenth resonant mode is a ⅛ to ¼ wavelength mode caused by the excitation current of the fourth feeding module resonating from the first free end to the fourth ground end; the eleventh resonant mode is a ⅛ to ¼ wavelength mode caused by the excitation current of the fourth feeding module resonating from the fourth feeding point to the second free end; and the twelfth resonant mode is a ¾ wavelength mode caused by the excitation current of the fourth feeding module resonating from the third ground end to the first free end.

15. The antenna assembly of claim 13, wherein the third radiator supports, under excitation of the third feeding module, a GPS frequency band, a Wi-Fi 2.4G frequency band, an LTE-4G MHB frequency band, an NR-5G MHB frequency band, an LTE-4G UHB frequency band, and an NR-5G UHB frequency band; and the fourth radiator supports, under excitation of the fourth feeding module, an N77 frequency band, an N78 frequency band, a Wi-Fi 5G frequency band, and a Wi-Fi 6E frequency band.

16. The antenna assembly of claim 13, wherein the first radiator is connected to the third radiator to form a sharing radiator, and the antenna assembly further comprises a direct-current (DC) blocking component, a filtering component, and a detecting component,
wherein the DC blocking component is electrically connected between the first feeding point and the first matching module, between the first ground end and the first reference ground, between the third ground end and the fifth reference ground, and between the third feeding point and the third matching module; one end of the filtering component is electrically connected to one end of the DC blocking component close to the sharing radiator or is electrically connected to the sharing radiator; and the DC blocking component is configured to block direct current generated by the first matching module, the first reference ground, the fifth reference ground, and the third matching module, and the filtering component is configured to block a radio frequency (RF) signal received/transmitted by the sharing radiator and to block a sensing signal generated by the sharing radiator in response to approach of a subject to-be-detected; and/or
wherein the DC blocking component is electrically connected between the second ground end and the second reference ground, and between the second matching module and the second feeding point; one end of the filtering component is electrically connected to one end of the DC blocking component close to the second radiator or is electrically connected to the second radiator; and the DC blocking component is configured to block direct current generated by the second reference ground and the second matching module, and the filtering component is configured to block an RF signal received/transmitted by the second radiator and to block a sensing signal generated by the second radiator in response to approach of the subject to-be-detected; and/or
wherein the DC blocking component is electrically connected between the fourth ground end and the sixth reference ground, and between the sixth matching module and the fourth feeding point; one end of the filtering component is electrically connected to one end of the DC blocking component close to the third radiator or is electrically connected to the third radiator; and the DC blocking component is configured to block direct current generated by the sixth reference ground and the sixth matching module, and the filtering component is configured to block an RF signal received/transmitted by the third radiator and to block a sensing signal generated by the third radiator in response to approach of the subject to-be-detected; and wherein the detecting component is electrically connected to another end of the filtering component, and the detecting component is configured to detect magnitude of the sensing signal.

17. The antenna assembly of claim 13, wherein a segment between the first ground end and the third ground end is a connecting segment, the antenna assembly further comprises at least one seventh matching module, one end of the at least one seventh matching module is electrically connected to the connecting segment, and another end of the seventh matching module is connected to the ground.

18. An electronic device, comprising:
a housing and an antenna assembly, wherein radiators of the antenna assembly are integrated into the housing, or are disposed on a surface of the housing, or are disposed in space enclosed by the housing;
wherein the antenna assembly comprises a first radiator, a second radiator, a first matching module, a first feeding module, a second matching module, and a second feeding module, wherein the first radiator has a first ground end, a first coupling end, and a first feeding point between the first ground end and the first coupling end; the second radiator has a second coupling end, a second ground end, and a second feeding point between the second coupling end and the second ground end; a first coupling gap is defined between the second coupling end and the first coupling end; the first matching module is electrically connected between the first feeding point and the first feeding module, and the first ground end is electrically connected to a first reference ground; the second matching module is electrically connected between the second feeding point and the second feeding module, and the second ground end is electrically connected to a second reference ground; and
wherein the first radiator and the second radiator support, under excitation of the first feeding module and the second feeding module, a plurality of resonant modes, wherein the plurality of resonant modes comprise a first resonant mode, a second resonant mode, and a third resonant mode, the first resonant mode is a ⅛ to ¼ wavelength mode caused by the excitation current of the first feeding module resonating on the first radiator, the second resonant mode is a ⅛ to ¼ wavelength mode caused by excitation current of the first feeding module resonating on the second radiator, and the third resonant mode is a ¾ wavelength mode caused by the excitation current of the second feeding module resonating on the first radiator.

19. The electronic device of claim 18, wherein the housing has a top frame and a bottom frame disposed opposite to the top frame and a first side frame and a second side frame connected between the top frame and the bottom frame, and the antenna assembly is disposed on at least one of the top frame, the first side frame, the second side frame, or the bottom frame.

20. The electronic device of claim 19, wherein a first radiator of the antenna assembly and a second radiator of the antenna assembly are disposed on the first side frame, one part of a third radiator of the antenna assembly is disposed on the first side frame, and another part of the third radiator of the antenna assembly is disposed on the top frame, a fourth radiator of the antenna assembly is disposed on the top frame, a first coupling gap between the first radiator and the second radiator is defined on the first side frame, and a second coupling gap is defined on the top frame; and wherein the electronic device further comprises at least one key portion, the at least one key portion is disposed between a second ground end and a second feeding point, and/or the at least one key portion is disposed between a first ground end and a third ground end of the third radiator.

\* \* \* \* \*